(12) United States Patent
Kim et al.

(10) Patent No.: US 12,046,599 B2
(45) Date of Patent: Jul. 23, 2024

(54) SEMICONDUCTOR DEVICE

(71) Applicant: SAMSUNG ELECTRONICS CO., LTD., Suwon-si (KR)

(72) Inventors: Cheol Kim, Hwaseong-si (KR); Jongchul Park, Seoul (KR); Hyunho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 17/522,051

(22) Filed: Nov. 9, 2021

(65) Prior Publication Data
US 2022/0293600 A1 Sep. 15, 2022

(30) Foreign Application Priority Data

Mar. 15, 2021 (KR) .................. 10-2021-0033628

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823814* (2013.01); *H01L 21/823821* (2013.01); *H01L 21/823871* (2013.01); *H01L 23/5286* (2013.01); *H01L 29/0665* (2013.01); *H01L 29/0847* (2013.01); *H01L 29/41733* (2013.01);
(Continued)

(58) Field of Classification Search
CPC ....... H01L 21/02603; H01L 21/823814; H01L 21/823431; H01L 21/823821; H01L 21/823871; H01L 21/845; H01L 23/5286; H01L 27/0886; H01L 27/0924; H01L 27/1211; H01L 29/0665; H01L 29/0669; H01L 29/0673; H01L 29/0847; H01L 29/41733; H01L 29/41791; H01L 29/42392; H01L 29/66439; H01L 29/66545; H01L 29/66795; H01L 29/775; H01L 29/785; H01L 29/7851;
(Continued)

(56) References Cited

U.S. PATENT DOCUMENTS 8,952,452 B2 2/2015 Kang et al.
10,734,283 B2 8/2020 Chen et al.
(Continued)

*Primary Examiner* — David C Spalla
(74) *Attorney, Agent, or Firm* — F. Chau & Associates, LLC

(57) ABSTRACT

A semiconductor device includes a substrate having first and second active regions. A first active pattern is on the first active region and includes first source/drain patterns and a first channel pattern therebetween. A second active pattern is on the second active region and includes second source/drain patterns and a second channel pattern therebetween. A gate electrode includes a first gate electrode on the first channel pattern and a second gate electrode on the second channel pattern. A gate cutting pattern is between the first and second gate electrodes and separates the first and second gate electrodes from each other. A pair of gate spacers is on opposite sidewalls of the first gate electrode extending along opposite sidewalls of the gate cutting pattern towards the second gate electrode. The gate cutting pattern includes first to third parts having maximum widths that increase from the first to the third part.

20 Claims, 56 Drawing Sheets

(51) Int. Cl.
  *H01L 23/528*  (2006.01)
  *H01L 29/06*  (2006.01)
  *H01L 29/08*  (2006.01)
  *H01L 29/417*  (2006.01)
  *H01L 29/423*  (2006.01)
  *H01L 29/66*  (2006.01)
  *H01L 29/78*  (2006.01)
  *H01L 29/786*  (2006.01)

(52) U.S. Cl.
  CPC .. *H01L 29/41791* (2013.01); *H01L 29/42392* (2013.01); *H01L 29/66545* (2013.01); *H01L 29/7851* (2013.01); *H01L 29/78618* (2013.01); *H01L 29/78696* (2013.01)

(58) Field of Classification Search
  CPC ............. H01L 29/7853; H01L 29/7855; H01L 29/78696; H01L 2029/7858
  See application file for complete search history.

(56) References Cited

U.S. PATENT DOCUMENTS

| | | | |
|---|---|---|---|
| 10,741,401 B1* | 8/2020 | Xu | H01L 27/0886 |
| 10,868,184 B2 | 12/2020 | Chiang et al. | |
| 2016/0056262 A1 | 2/2016 | Ho et al. | |
| 2019/0165121 A1 | 5/2019 | Park | |
| 2020/0091345 A1 | 3/2020 | Chiu et al. | |
| 2020/0105931 A1 | 4/2020 | Wu et al. | |
| 2020/0211903 A1* | 7/2020 | Shu | H01L 27/0886 |
| 2021/0050269 A1* | 2/2021 | Yu | H01L 21/28114 |
| 2021/0273049 A1* | 9/2021 | Wu | H01L 21/3105 |
| 2023/0005797 A1* | 1/2023 | Lin | H01L 21/823828 |
| 2023/0261112 A1* | 8/2023 | Yang | H01L 21/823481 257/401 |

* cited by examiner

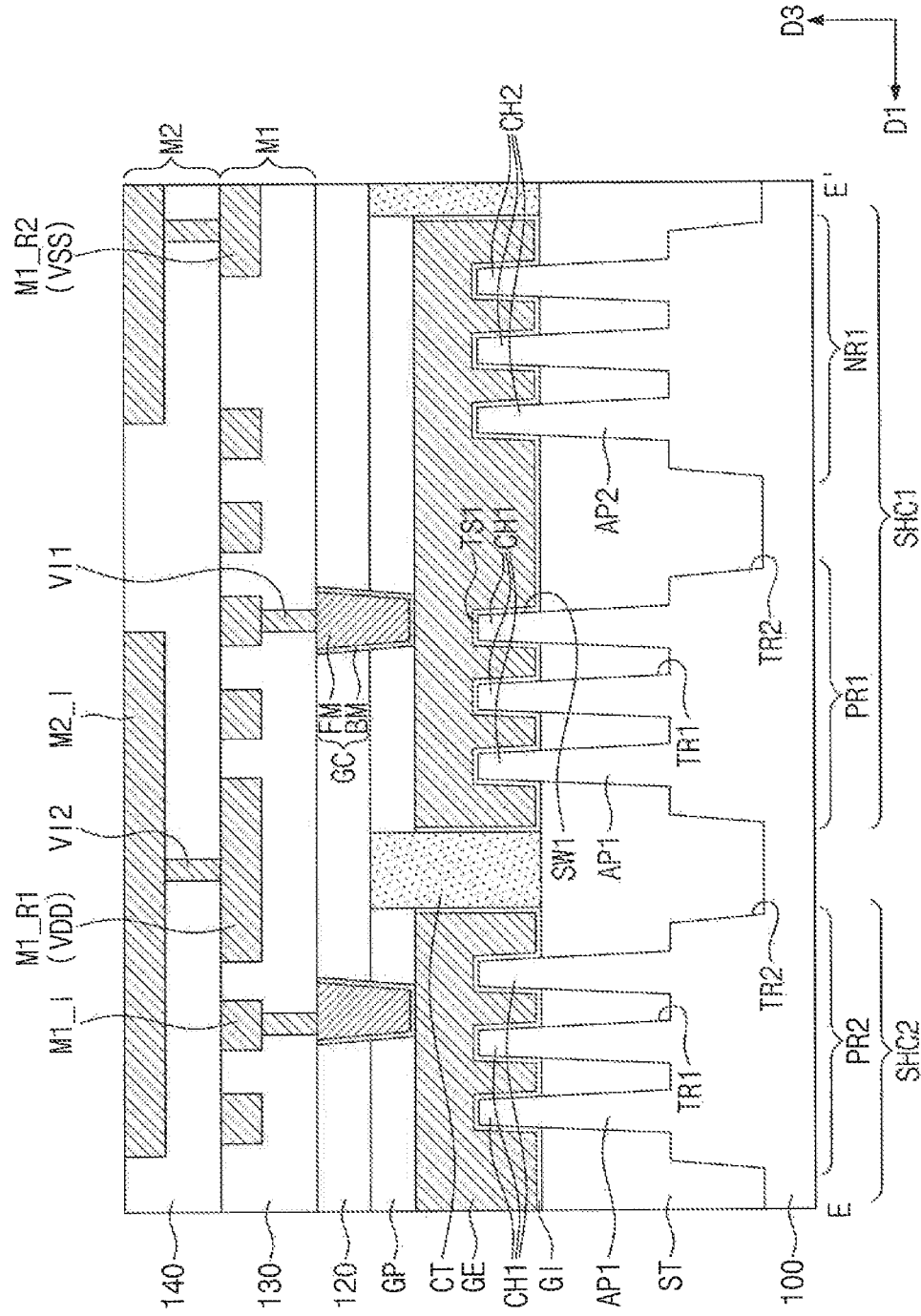

SEMICONDUCTOR DEVICE

CROSS-REFERENCE TO RELATED APPLICATION

This application claims priority under 35 U.S.C. § 119 to Korean Patent Application No. 10-2021-0033628, filed on Mar. 15, 2021 in the Korean Intellectual Property Office, the disclosure of which is incorporated by reference in its entirety herein.

1. TECHNICAL FIELD

The present inventive concept relates to a semiconductor device, and more particularly, to a semiconductor device including a field effect transistor and a method of fabricating the same.

2. DISCUSSION OF RELATED ART

Semiconductor devices are frequently incorporated into electronic devices in the electronic industry due to their relatively small size, multi-functionality, and/or low fabrication cost. Semiconductor devices may include semiconductor memory devices storing logic data, semiconductor logic devices processing operations of logic data, and hybrid semiconductor devices having both memory and logic elements. The demand for semiconductor devices to have a high integration level has increased with the development of the electronic industry. For example, there is an increasing demand for semiconductor devices to have high reliability, high speed, and/or multi-functionality. Semiconductor devices are gradually becoming more complicated and more integrated to provide these characteristics.

SUMMARY

Some embodiment of the present inventive concept provide a semiconductor device has an increased reliability and a method of fabricating the same.

According to an embodiment of the present inventive concept, a semiconductor device includes a substrate that includes a first active region and a second active region. A first active pattern is on the first active region. The first active pattern includes a pair of first source/drain patterns and a first channel pattern between the pair of first source/drain patterns. A second active pattern is on the second active region. The second active pattern includes a pair of second source/drain patterns and a second channel pattern between the pair of second source/drain patterns. A gate electrode includes a first gate electrode on the first channel pattern and a second gate electrode on the second channel pattern. A gate cutting pattern is between the first gate electrode and the second gate electrode. The gate cutting pattern separates the first and second gate electrodes from each other. A pair of gate spacers is on opposite sidewalls of the gate electrode. The pair of gate spacers extends from opposite sidewalls of the first gate electrode along opposite sidewalls of the gate cutting pattern towards opposite sidewalls of the second gate electrode. The gate cutting pattern includes a first part between the pair of gate spacers. A second part is on the first part. A third pan is on the pair of gate spacers. The second part lies between and connects the first part and the third part. A maximum width of the second part is greater than a maximum width of the first part. A maximum width of the third pan is greater than the maximum width of the second part.

According to an embodiment of the present inventive concept, a semiconductor device includes a substrate that includes a first logic cell and a second logic cell that is adjacent to the first logic cell in a first direction. A first active pattern is on the first logic cell. The first active pattern includes a pair of first source/drain patterns and a first channel pattern between the pair of first source/drain patterns. A second active pattern is on the second logic cell. The second active pattern includes a pair of second source/drain patterns and a second channel pattern between the pair of second source/drain patterns. A first gate electrode is on the first channel pattern. A second gate electrode is on the second channel pattern. The second gate electrode is aligned in the first direction with the first gate electrode. A gate cutting pattern is on a boundary between the first logic cell and the second logic cell. The gate cutting pattern is disposed between the first gate electrode and the second gate electrode. A pair of gate spacers extends in the first direction. The pair of gate spacers extends from opposite sidewalls of the first gate electrode along opposite sidewalls of the gate cutting pattern towards opposite sidewalls of the second gate electrode. Each of the pair of gate spacers includes a first gate spacer adjacent to the first and second gate electrodes. A second gate spacer is spaced apart from the first and second gate electrodes with the first gate spacer therebetween. A top surface of the second gate spacer is higher than a top surface of the first gate spacer. The gate cutting pattern covers the top surface of the first gate spacer and the top surface of the second gate spacer.

According to an embodiment of the present inventive concept, a semiconductor device includes a substrate having a logic cell. The logic cell includes a PMOSFET region and an NMOSFET region that are spaced apart from each other in a first direction. The logic cell has first, second, third, and fourth boundaries. The first boundary and the second boundary are opposite to each other in a second direction that intersects the first direction. The third boundary and the fourth boundary are opposite to each other in the first direction. A device isolation layer is on the substrate. The device isolation layer defines a first active pattern on the PMOSFET region and a second active pattern on the NMOSFET region. The first and second active patterns extend in the second direction. An upper portion of each of the first and second active patterns protrudes upwardly from the device isolation layer. A gate electrode extends in the first direction and extends across the first and second active patterns. A first source/drain pattern and a second source/drain pattern is on the upper portions of the first active pattern and the second active pattern, respectively. Each of the first and second source/drain patterns is adjacent to one side of the gate electrode. A pair of gate spacers is on opposite sidewalls of the gate electrode. The pair of gate spacers extends in the first direction. A gate capping pattern is on a top surface of the gate electrode. A separation structure is on at least one of the first and second boundaries. A gate cutting pattern is on at least one of the third and fourth boundaries. A lower portion of the gate cutting pattern is between the pair of gate spacers and is aligned in the first direction with the gate electrode. An interlayer dielectric layer is on the gate capping pattern and the gate cutting pattern. An active contact penetrates the interlayer dielectric layer and is electrically connected with at least one of the first and second source/drain patterns. A gate contact penetrates the interlayer dielectric layer and the gate capping pattern and is electrically connected with the gate electrode. A first metal layer is on the interlayer dielectric layer. The first metal layer includes a power line that vertically overlaps the gate cutting pattern and a plurality of first wiring lines that correspondingly are electrically connected with the active contact and the gate contact. A second metal layer is on the first metal layer The second metal layer includes a plurality of second wiring lines electrically connected to the first metal layer. The gate cutting pattern includes a first part between the pair of gate spacers. A second part is on the first part. A third part is on the pair of gate spacers. The second part lies between and connects the first part and the third part. A maximum width of the second part is greater than a maximum width of the first part. A maximum width of the third part is greater than the maximum width of the second part.

BRIEF DESCRIPTION OF THE DRAWINGS

FIGS. 5A, 5B, 5C, 5D, and 5E illustrate cross-sectional views respectively taken along lines A-A', B-B', C-C', D-D', and E-E', respectively, of FIG. 4 according to embodiments of the present inventive concept.

DETAILED DESCRIPTION OF EMBODIMENTS

Figure 1:
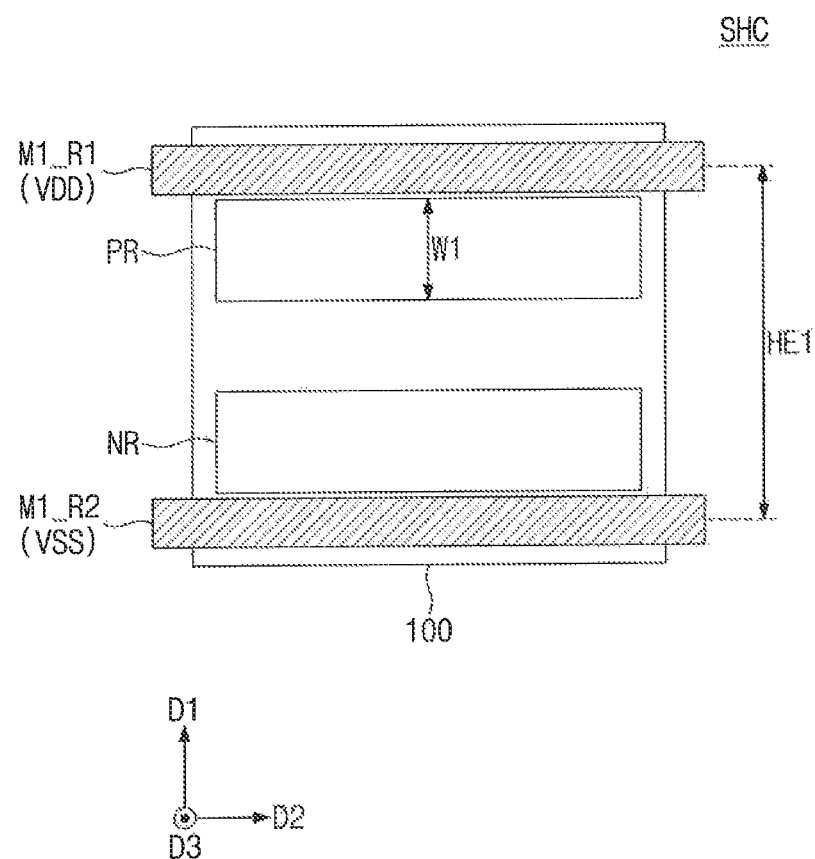
FIGS. 1 to 3 illustrate plan views of logic cells of a semiconductor device according to embodiments of the present inventive concept.
Figure 2:
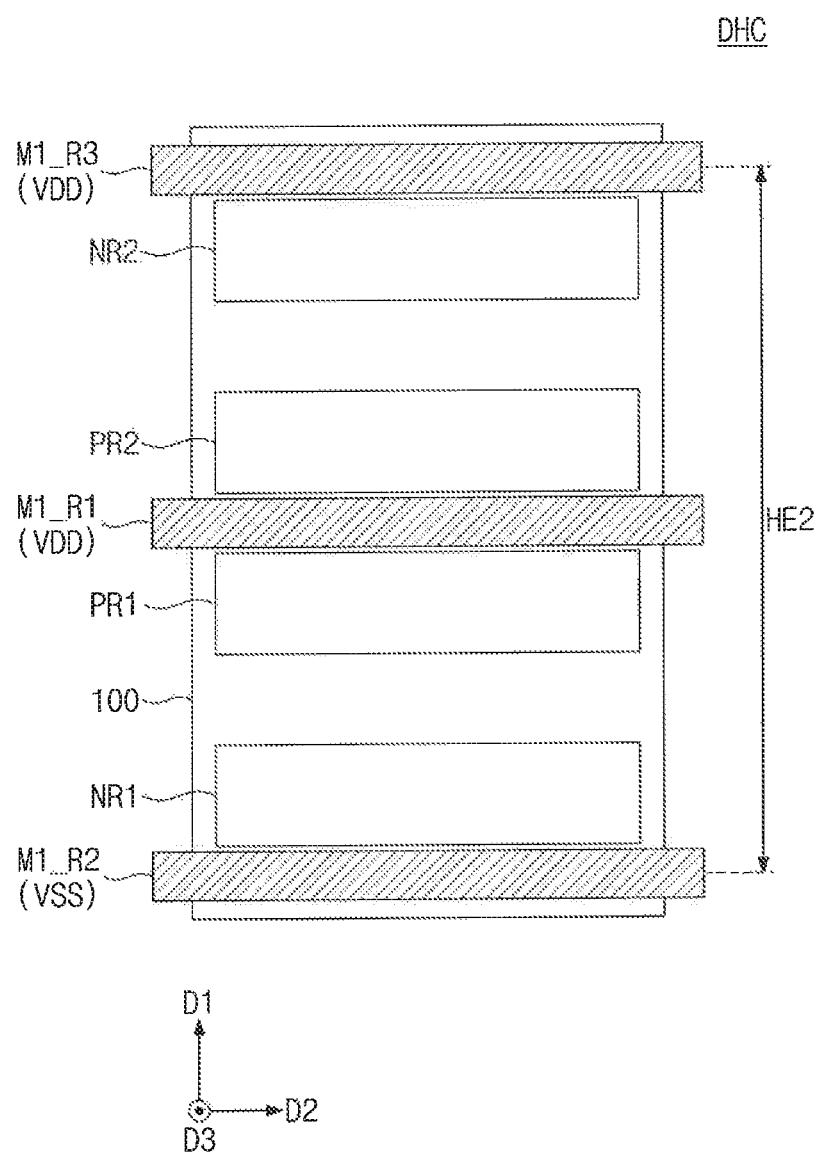
Figure 3:
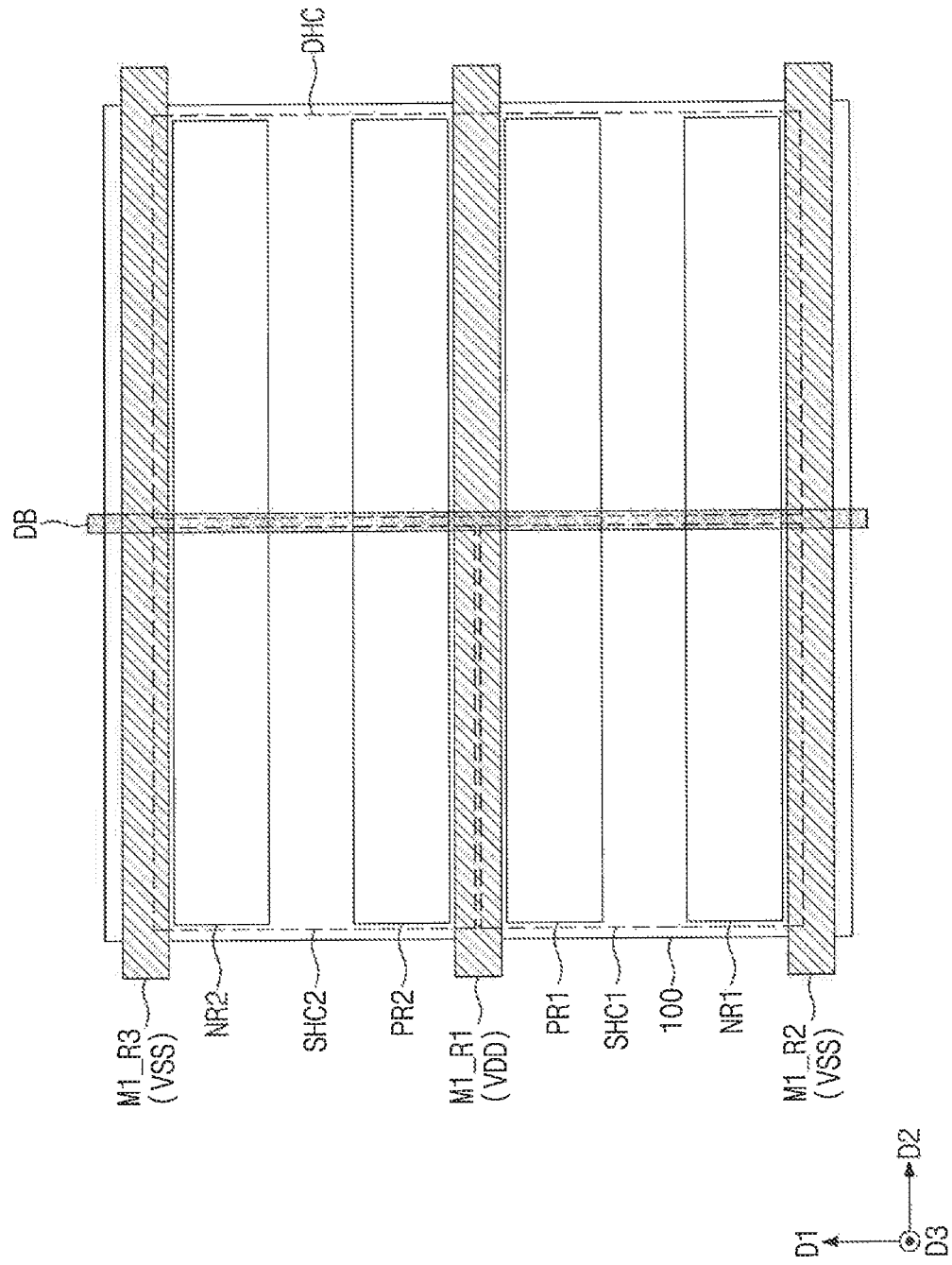

FIGS. 1 to 3 illustrate plan views showing logic cells of a semiconductor device according to some embodiments of the present inventive concept.

Referring to FIG. 1, a single height cell SHC may be provided. For example, a substrate 100 may be provided thereon with a first power line M1_R1 and a second power line M1_R2. In an embodiment, the first power line M1_R1 may be a path for providing a drain voltage VDD, such as a power voltage. The second power line M1_R2 may be a path for providing a source voltage VSS, such as a ground voltage.

The single height cell SHC may be defined between the first power line M1_R1 and the second power line M1_R2. The single height cell SHC may include one p-type metal-oxide-semiconductor field-effect transistor ("PMOSFET") region PR and one n-type metal-oxide-semiconductor field-effect transistor ("NMOSFET") region NR. For example, the single height cell SHC may have a complementary metal-oxide-semiconductor ("CMOS") structure provided between the first power line M1_R1 and the second power line M1_R2.

In an embodiment, each of the PMOSFET and NMOSFET regions PR and NR may have a first width W1 in a first direction D1. A first height HE1 may be defined as a length in the first direction D1 of the single height cell SHC. In an embodiment, the first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device and wiring lines that connect the transistors to each other.

Referring to FIG. 2, a double height cell DHC may be provided. Referring to FIG. 2, a substrate 100 may be provided thereon with a first power line M1_R1, a second power line M1_R2, and a third power line M1_R3. The first power line M1_R1 may be disposed between the second power line M1_R2 and the third power line M1_R3 (e.g., in the first direction D1). In an embodiment, the third power line M1_R3 may be a path for providing a drain voltage VDD.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2 (e.g., in the first direction D1). The second NMOSFET region NR2 may be adjacent to the third power line M1_R3 (e.g., in the first direction D1). The first and second PMOSFET regions PR1 and PR2 may be adjacent to the first power line M1_R1 (e.g., in the first direction D1). When viewed in plan, the first power line M1_R1 may be disposed between the first and second PMOSFET regions PR1 and PR2 (e.g., in the first direction D1).

A second height HE2 may be defined to refer to a length in the first direction D1 of the double height cell DHC. In an embodiment, the second height HE2 may be about twice the first height HE1 of FIG. 1. In an embodiment, the first and second PMOSFET regions PR1 and PR2 of the double height cell DHC may collectively operate as a single PMOSFET region.

Therefore, the double height cell DHC may have a PMOS transistor whose size is greater than that of a PMOS transistor included in the single height cell SHC discussed above in FIG. 1. For example, the size of the PMOS transistor included in the double height cell DHC may be about twice that of the PMOS transistor included in the single height cell SHC. The double height cell DHC may operate at a higher speed than that of the single height cell SHC. The double height cell DHC shown in FIG. 2 may be defined as a multi-height cell. In an embodiment, the multi-height cell may include a triple height cell whose cell height is about three times that of the single height cell SHC, a quadruple height cell whose cell height is about four times that of the single height cell SHC, etc.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2 (e.g., in the first direction D1). The second single height cell SHC2 may be disposed between the first power line M1_R1 and a third power line M1_R3 (e.g., in the first direction D1). The second single height cell SHC2 may be adjacent in the first direction D1 to the first single height cell SHC1.

The double height cell DHC may be disposed between the second power line M1_R2 and the third power line M1_R3 (e.g., in the first direction D1). The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. In an embodiment, the separation structure DB may electrically separate an active region of the double height cell DHC from an active region of each of the first and second single height cells SHC1 and SHC2.

Figure 4:
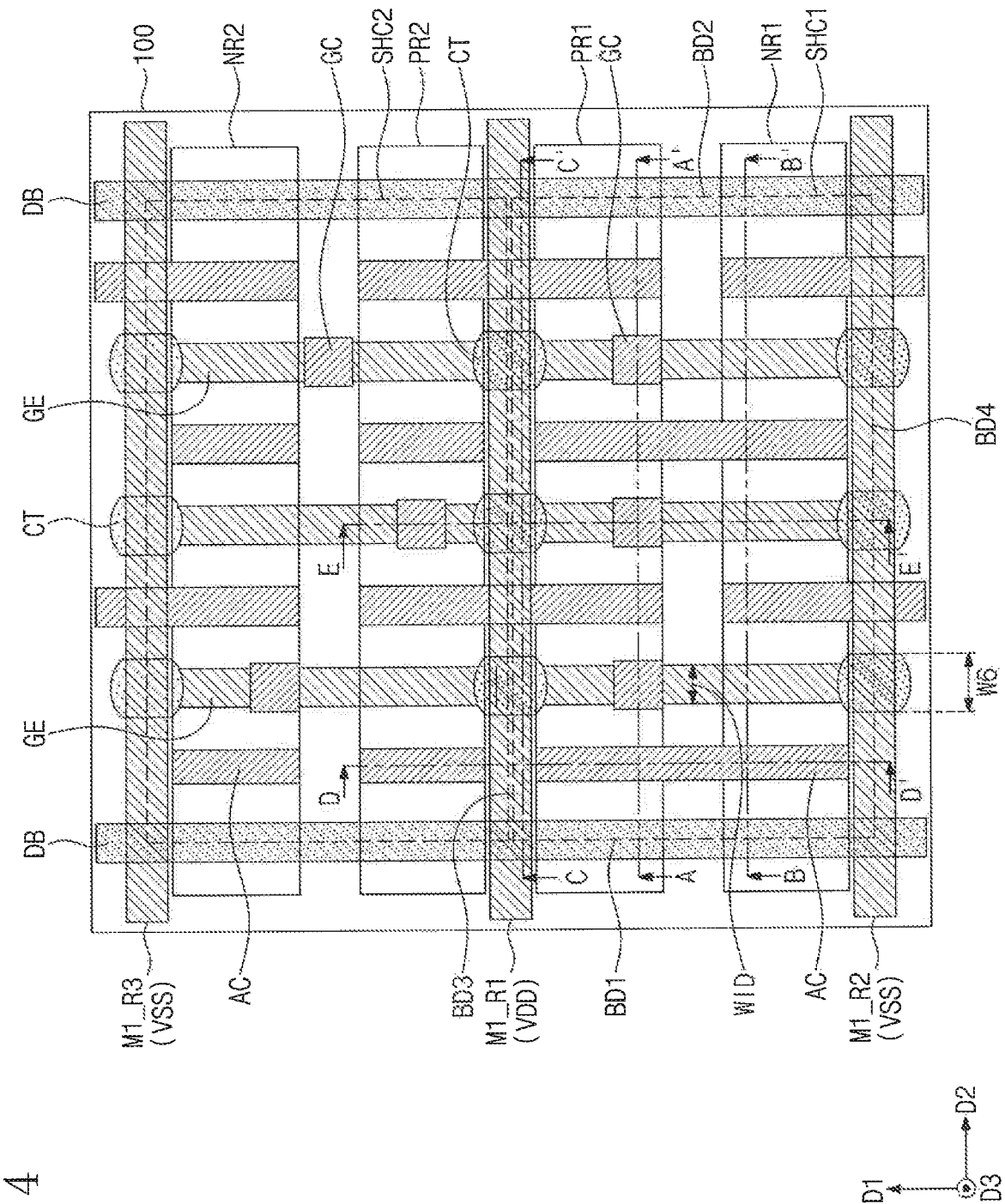
FIG. 4 illustrates a plan view of a semiconductor device according to an embodiment of the present inventive concept.

FIG. 4 illustrates a plan view showing a semiconductor device according to some embodiments of the present inventive concept. FIGS. 5A, 5B, 5C, 5D, and 5E illustrate cross-sectional views respectively taken along lines A-A', B-B', C-C', D-D', and E-E' of FIG. 4. FIG. 6A illustrates an enlarged cross-sectional view showing section M of FIG. 5B. FIG. 6B illustrates an enlarged cross-sectional view showing section N of FIG. 5C. A semiconductor device shown in FIGS. 4 and 5A to 5E is a detailed example of the first and second single height cells SHC1 and SHC2 of FIG. 3.

Referring to FIGS. 4 and 5A to 5E, first and second single height cells SHC1 and SHC2 may be provided on a substrate 100. Each of the first and second single height cells SHC1 and SHC2 may include logic transistors included in a logic circuit. In an embodiment, the substrate 100 may be a compound semiconductor substrate or a semiconductor substrate including silicon, germanium, or silicon-germanium. For example, the substrate 100 may be a silicon substrate. However, embodiments of the present inventive concept are not limited thereto.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in a second direction D2. In an embodiment, the second direction D2 may be perpendicular to the first direction D1. However, embodiments of the present inventive concept are not limited thereto and the second direction D2 may cross the first direction D1 in various different angles.

In an embodiment, a second trench TR2 formed on an upper portion of the substrate 100 may define the first PMOSFET region PR1, the second PMOSFET region PR2, the first NMOSFET region NR1, and the second NMOSFET region NR2. For example, the second trench TR2 may be positioned between the first NMOSFET region NR1 and the first PMOSFET region PR1 (e.g., in the first direction D1). The second trench TR2 may be positioned between the first PMOSFET region PR1 and the second PMOSFET region PR2 (e.g., in the first direction D1). The second trench TR2 may be positioned between the second PMOSFET region PR2 and the second NMOSFET region NR2 (e.g., in the first direction D1).

Figure 5A:
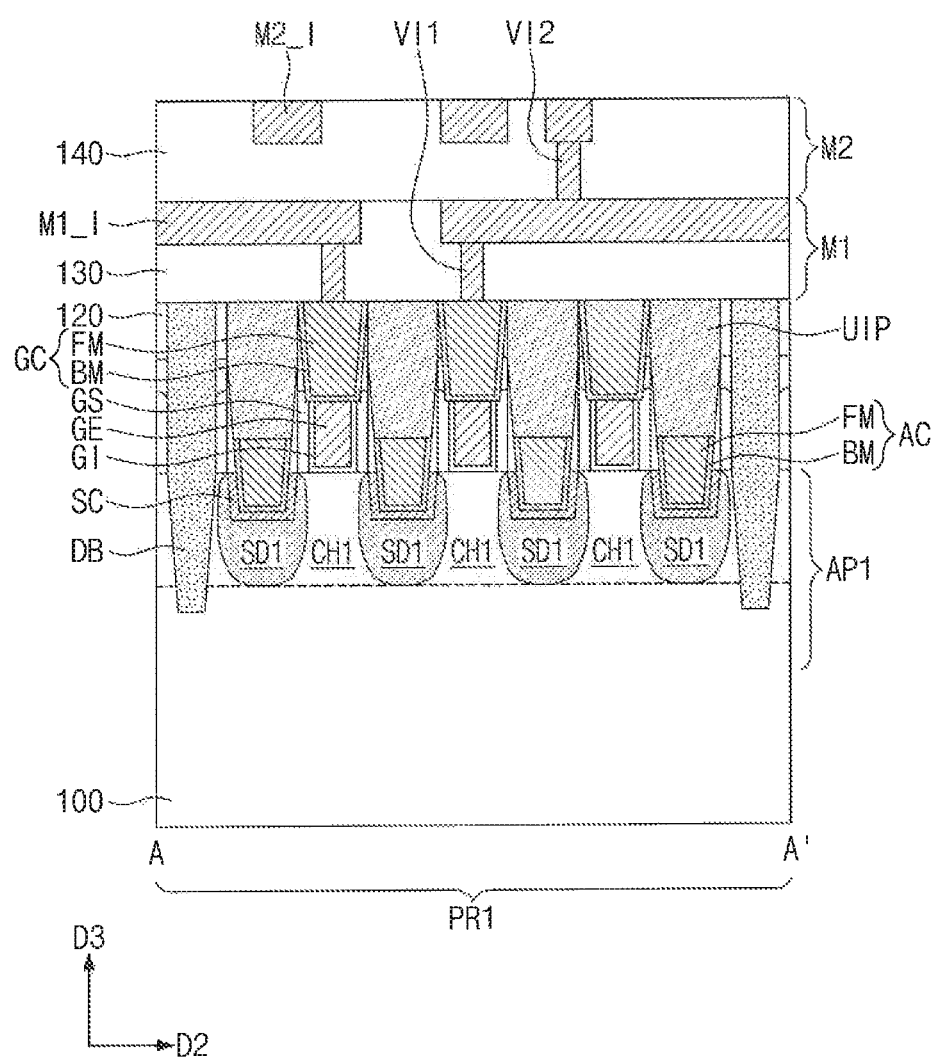
Figure 5B:
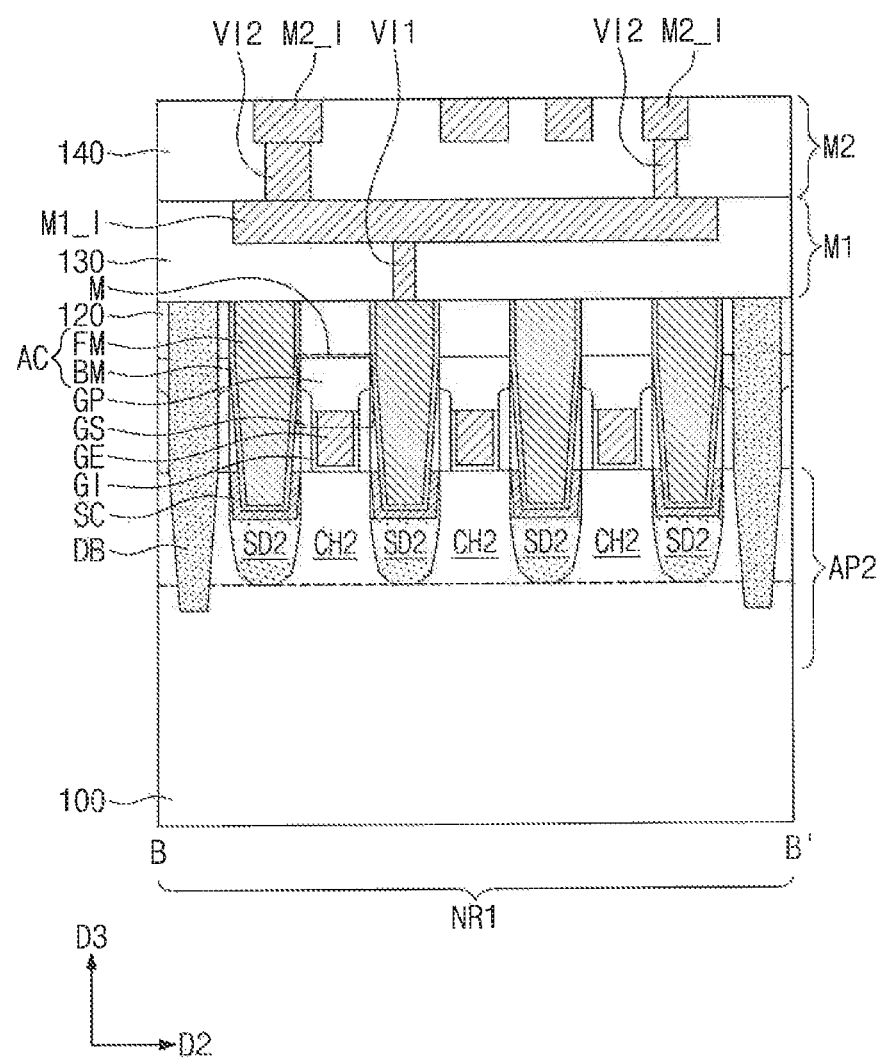
Figure 5C:
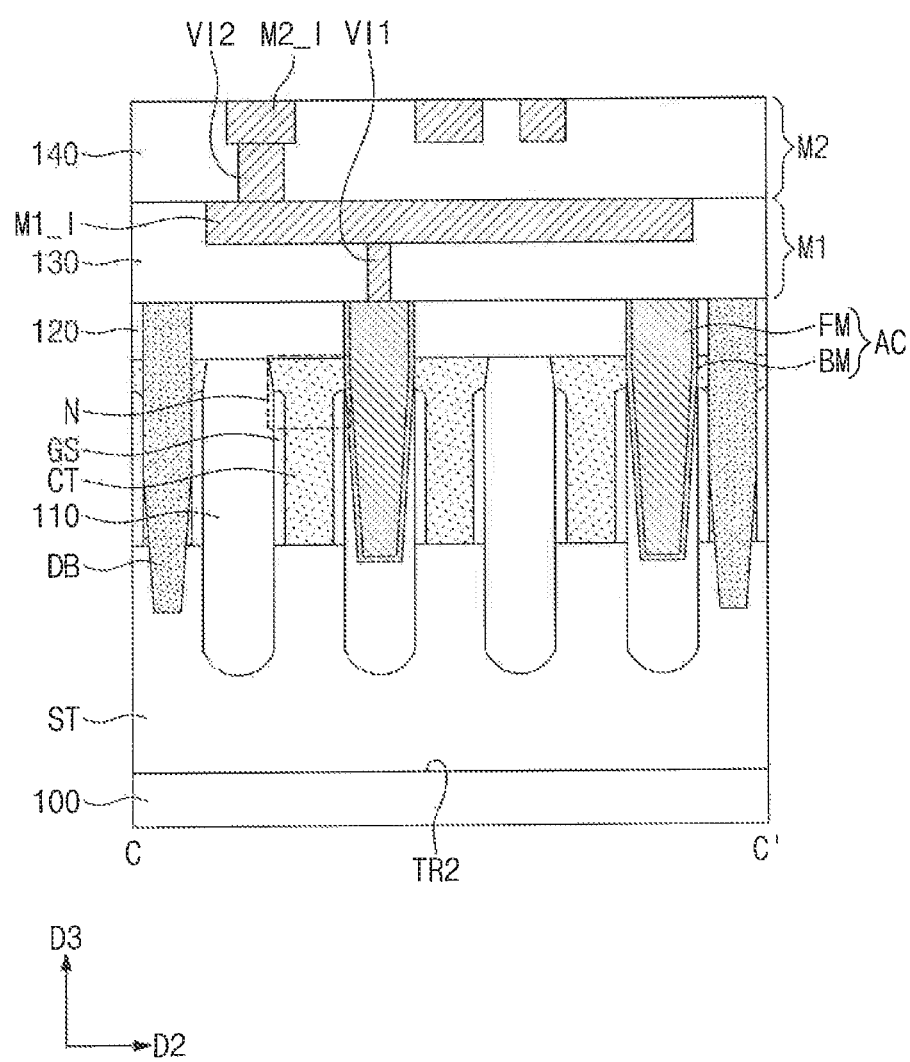
Figure 6A:
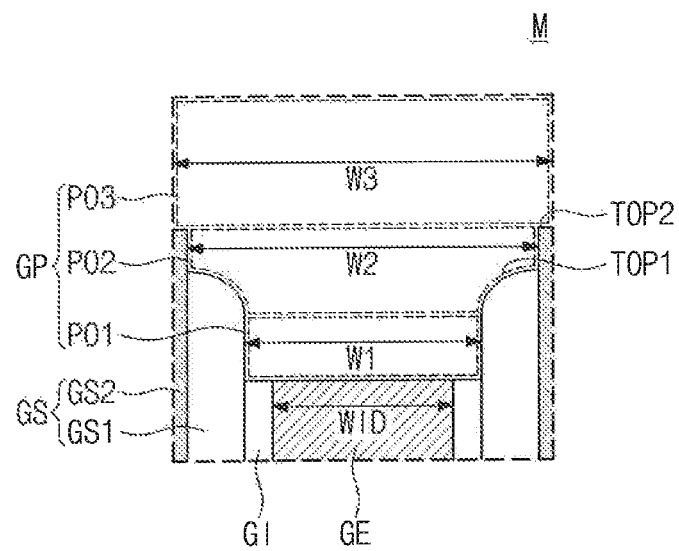
FIG. 6A illustrates an enlarged cross-sectional view showing section M of FIG. 5B according to embodiments of the present inventive concept.
Figure 6B:
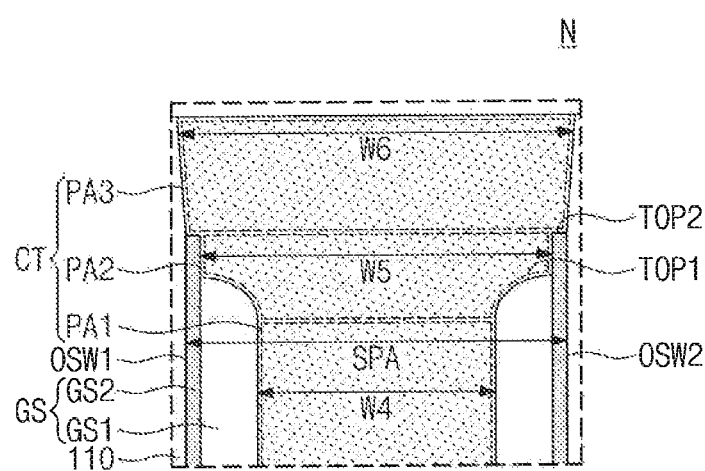
FIG. 6B illustrates an enlarged cross-sectional view showing section N of FIG. 5C according to embodiments of the present inventive concept.
Figure 7:
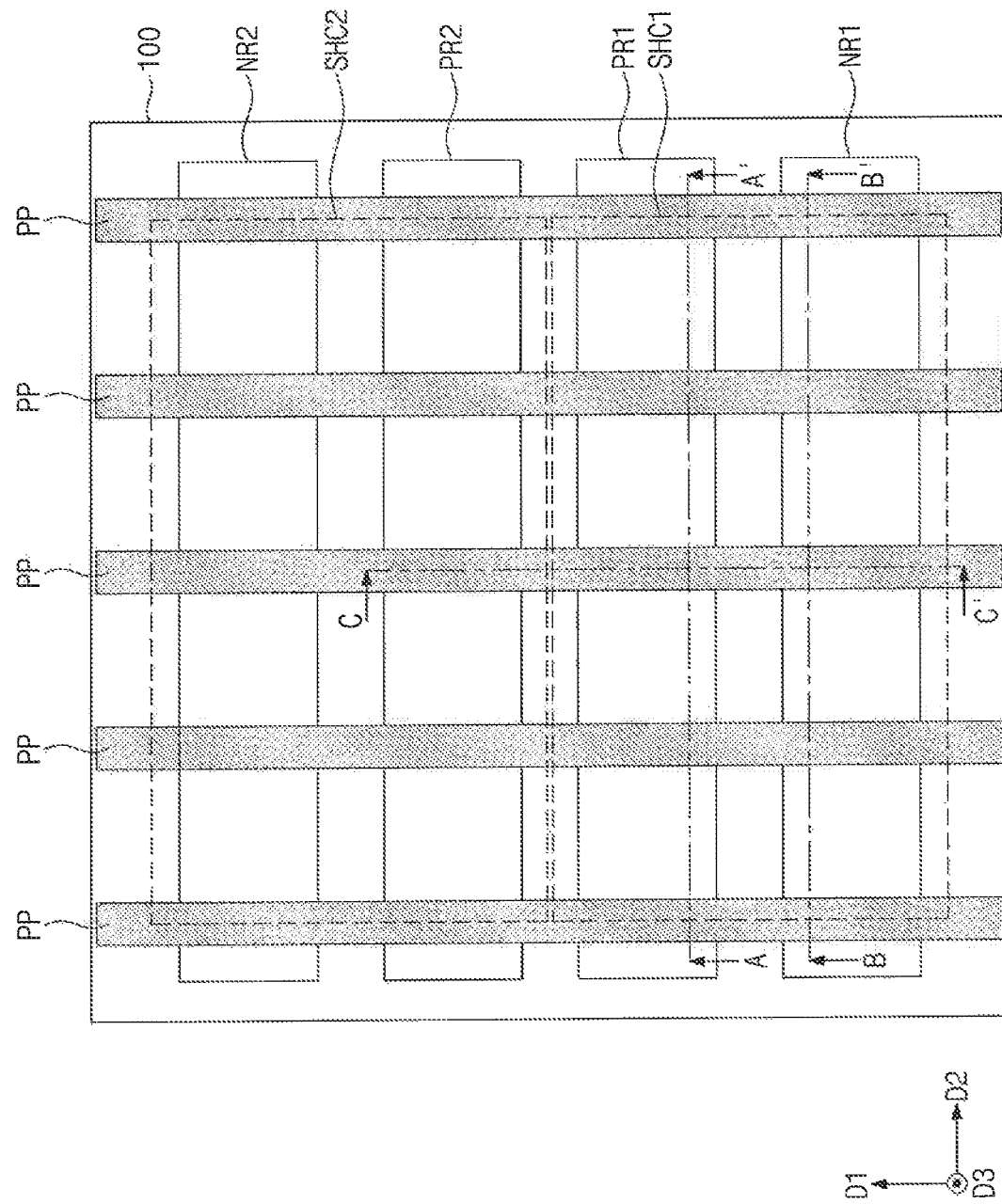
FIGS. 7, 9, 11, 13, 15, 17, and 19 illustrate plan views showing a method of fabricating a semiconductor device according to embodiments of the present inventive concept.
Figure 8A:
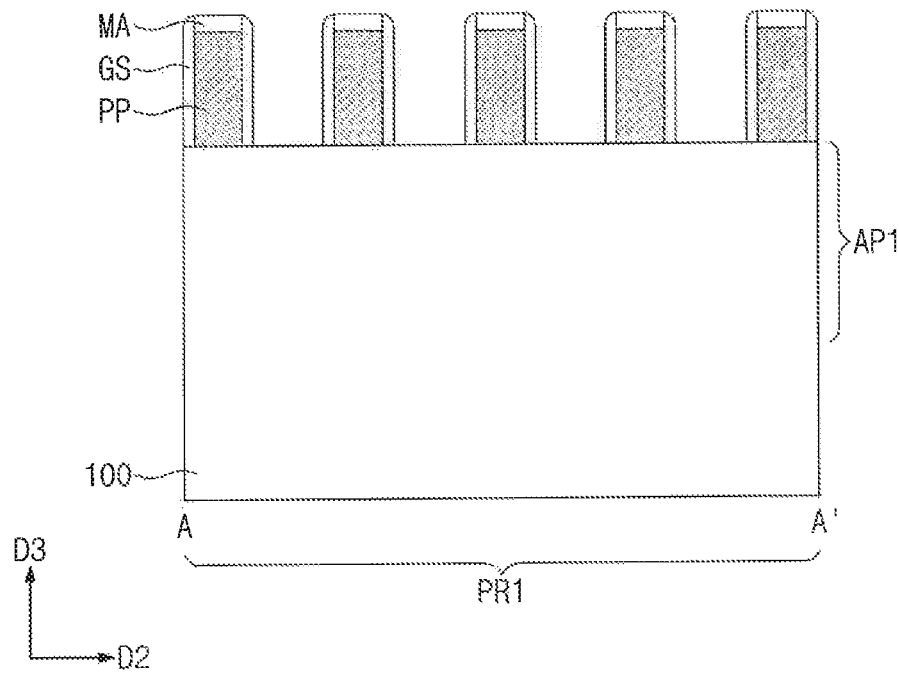
FIGS. 8A, 10A, 12A, 14A, 16A, 18A, and 20A illustrate cross-sectional views of a method of fabricating a semiconductor device taken along line A-A' of FIGS. 7, 9, 11, 13, 15, 17, and 19, respectively, according to embodiments of the present inventive concept.
Figure 8B:
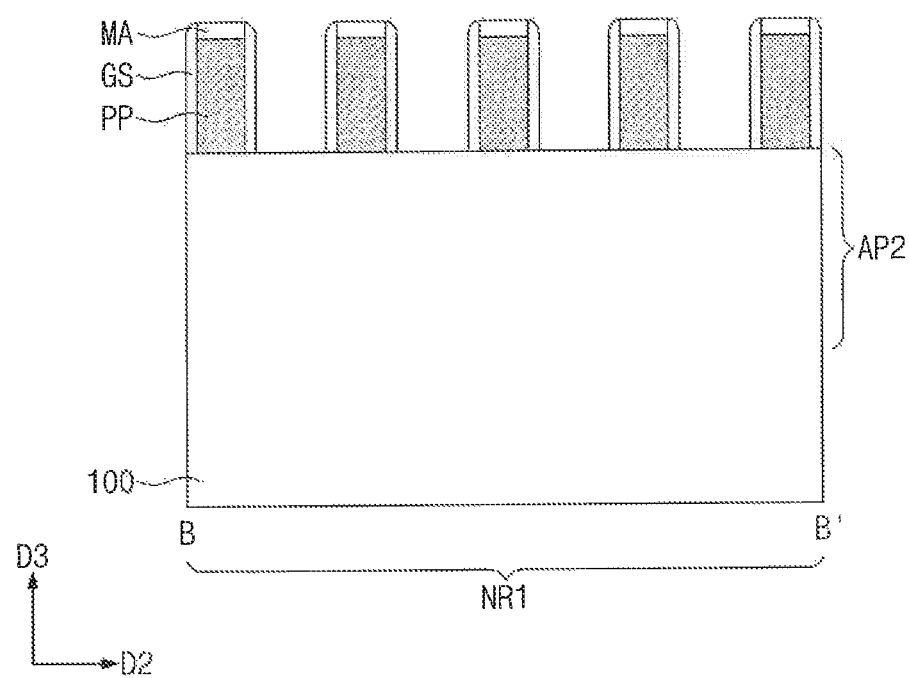
FIGS. 8B, 10B, 12B, 14B, 16B, 18B, and 20B illustrate cross-sectional views of a method of fabricating a semiconductor device taken along line B-B' of FIGS. 7, 9, 11, 13, 15, 17, and 19, respectively, according to embodiments of the present inventive concept.
Figure 8C:
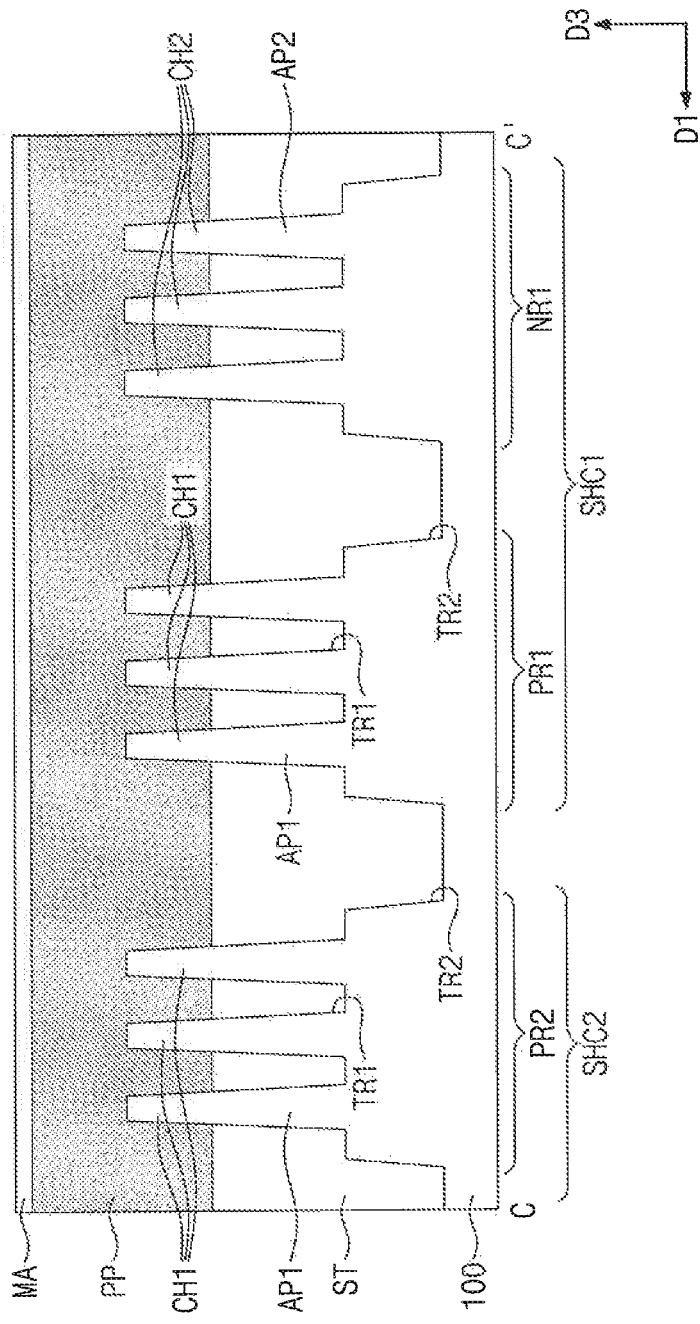
FIGS. 8C, 10C, 12C, 14C, 16C, 18C, and 20C illustrate cross-sectional views of a method of fabricating a semiconductor device taken along line C-C' of FIGS. 7, 9, 11, 13, 15, 17, and 19, respectively, according to embodiments of the present inventive concept.
Figure 9:
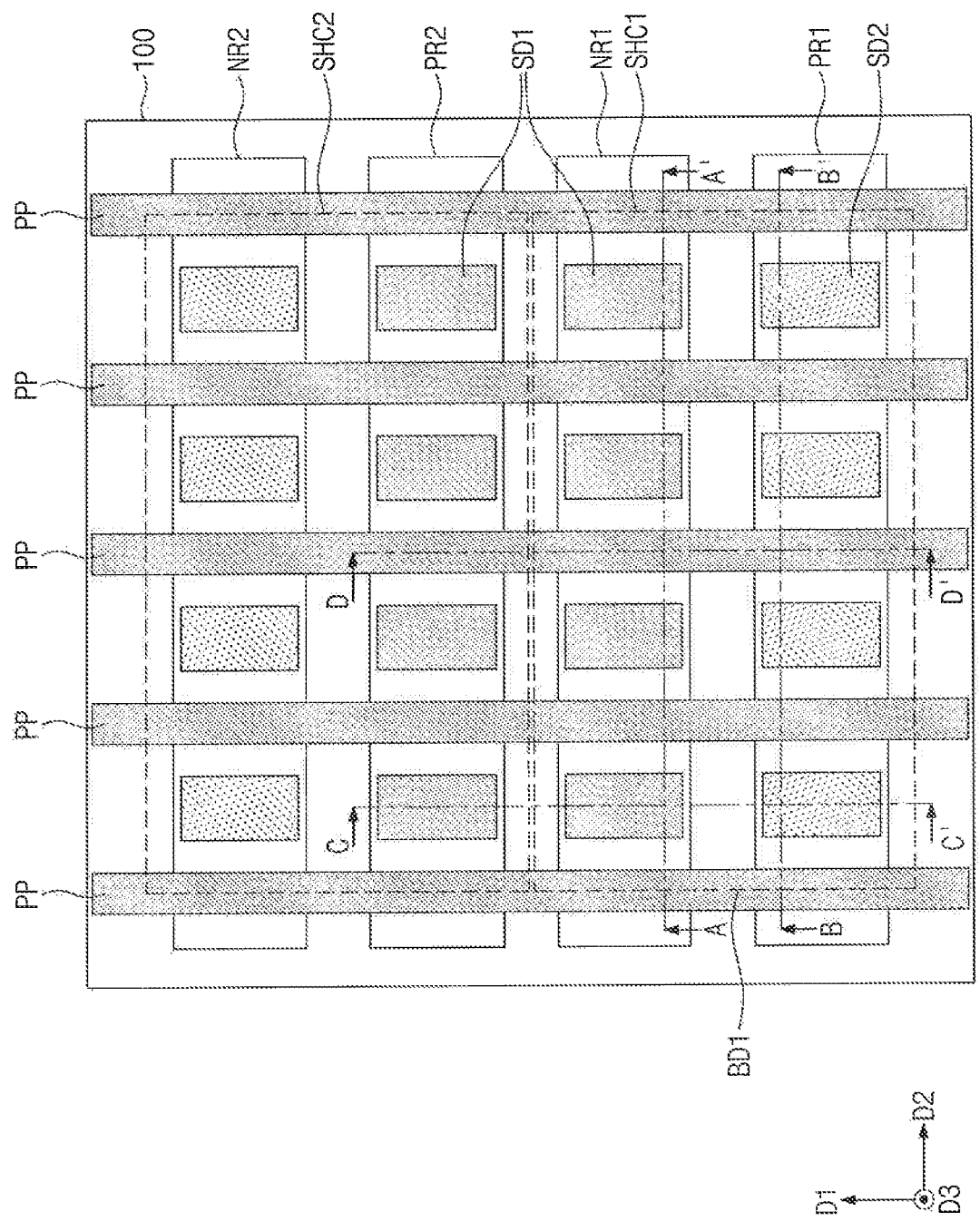
Figure 10A:
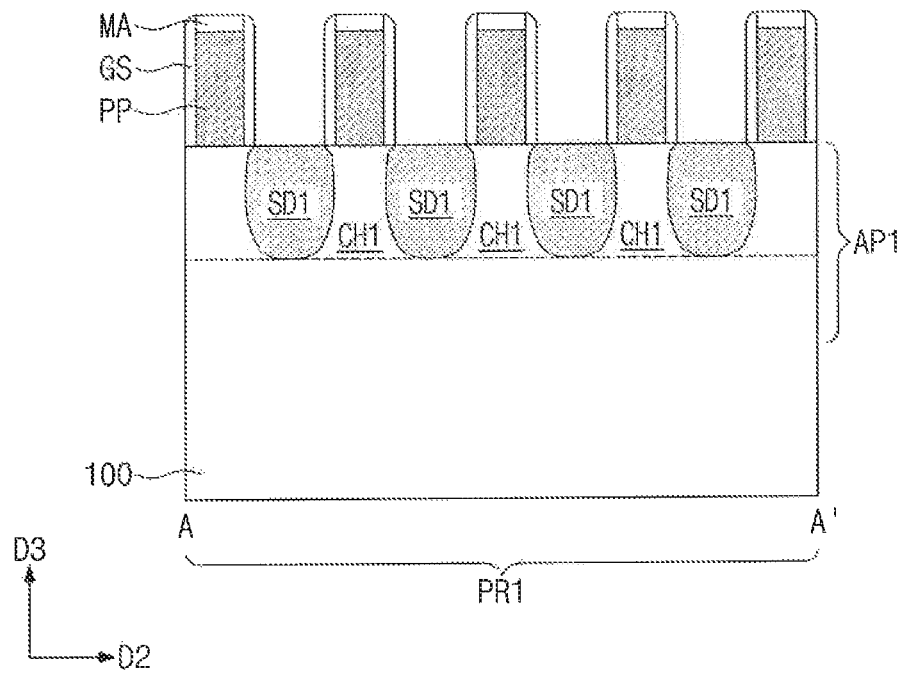
Figure 10B:
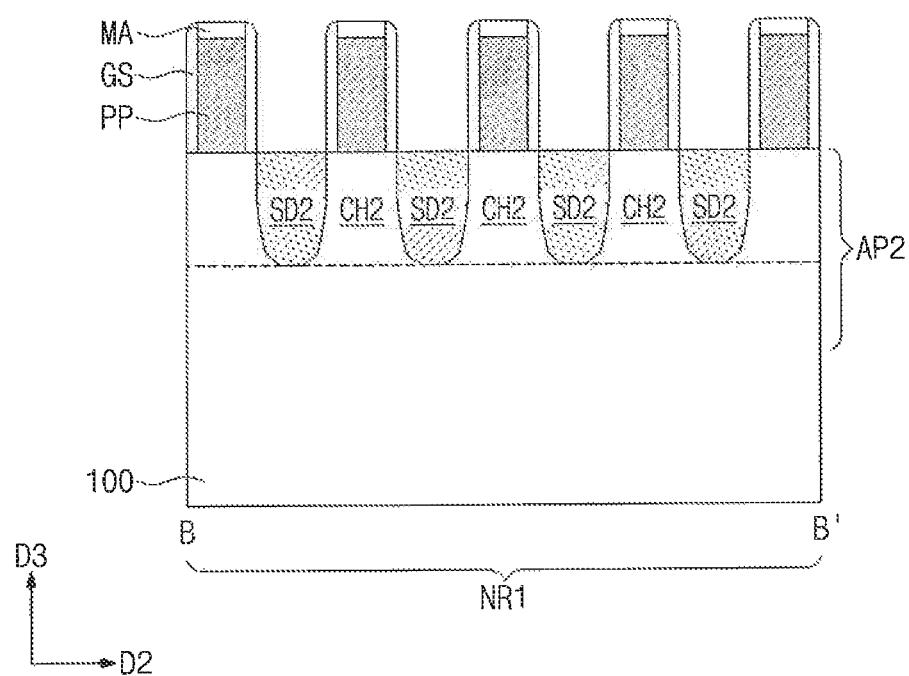
Figure 10C:
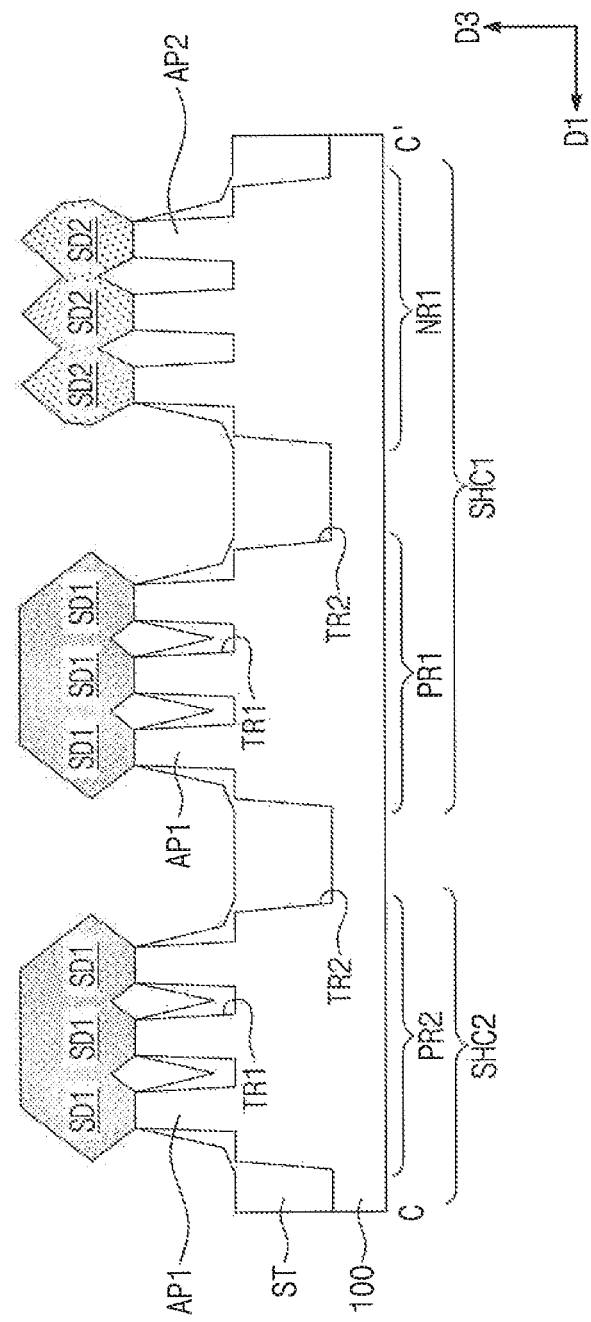
Figure 10D:
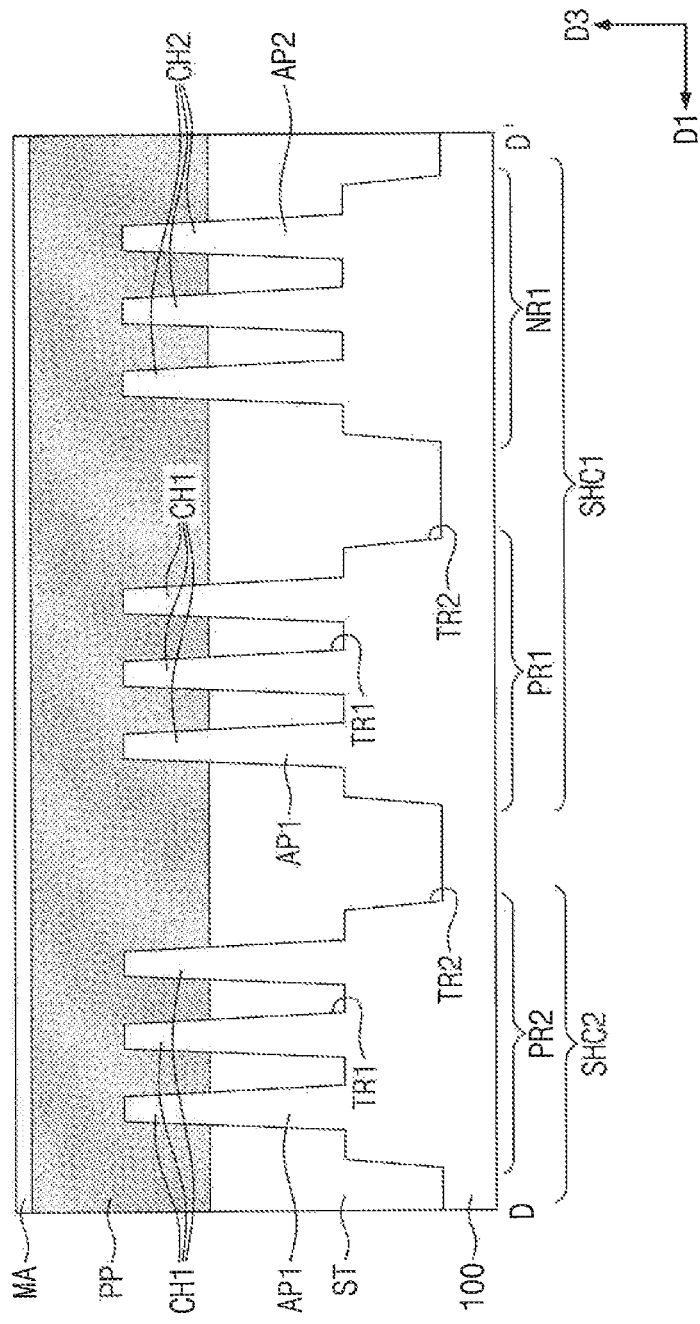
FIGS. 10D, 12D, 14D, 16D, 18D, and 20D illustrate cross-sectional views of a method of fabricating a semiconductor device taken along line D-D' of FIGS. 9, 11, 13, 15, 17, and 19, respectively, according to embodiments of the present inventive concept.
Figure 11:
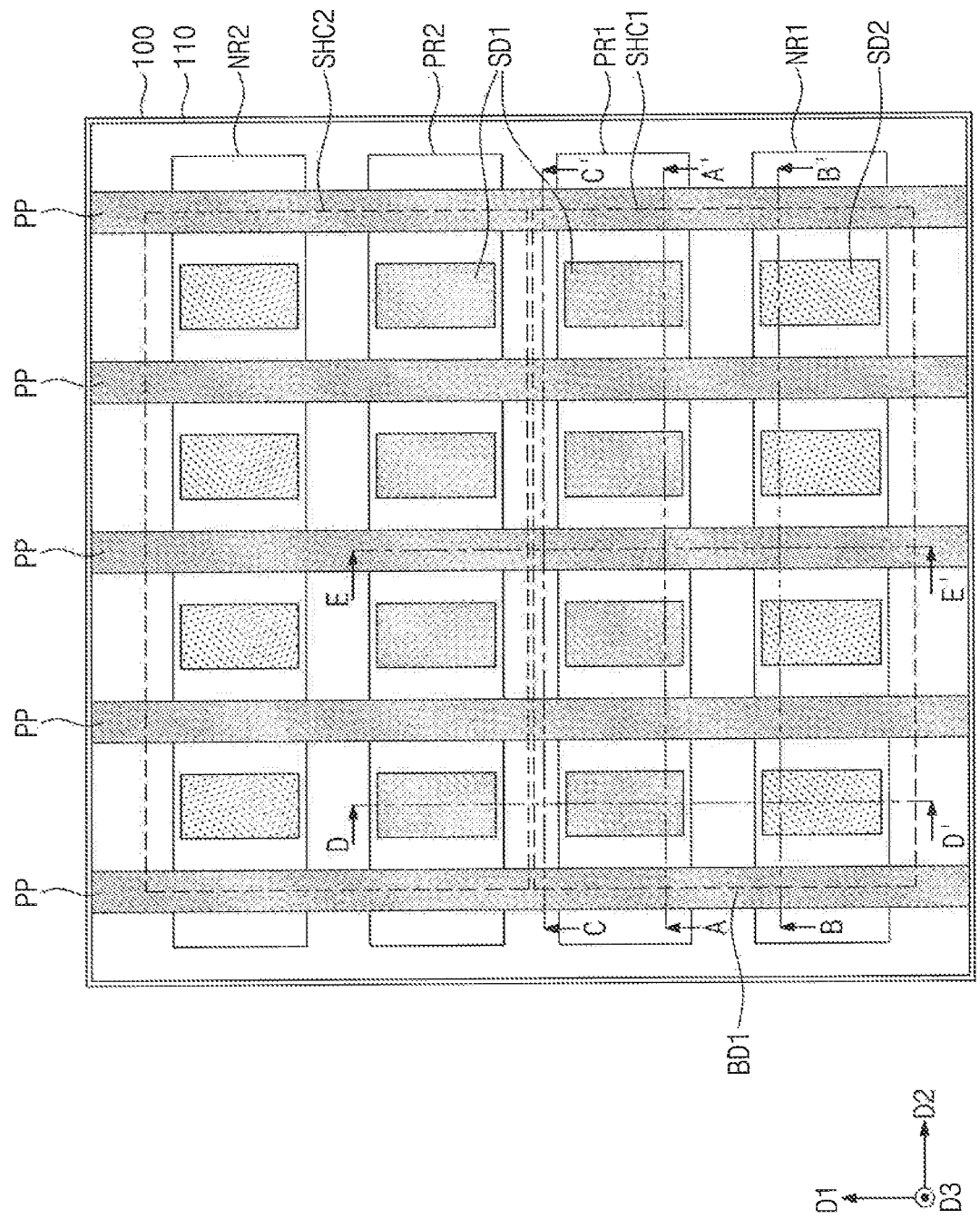
Figure 12A:
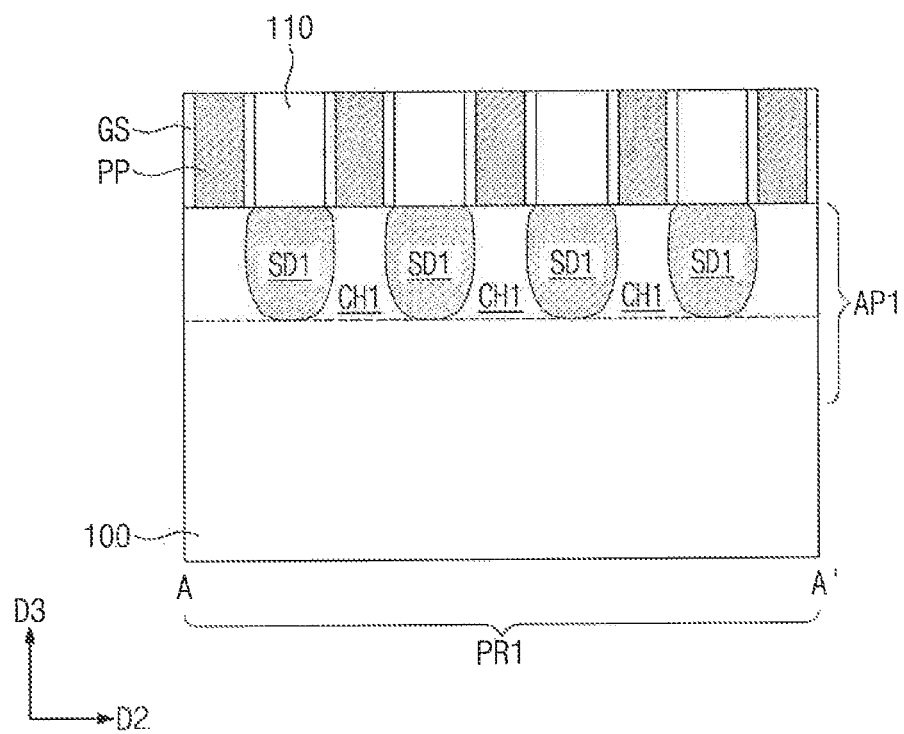
Figure 12B:
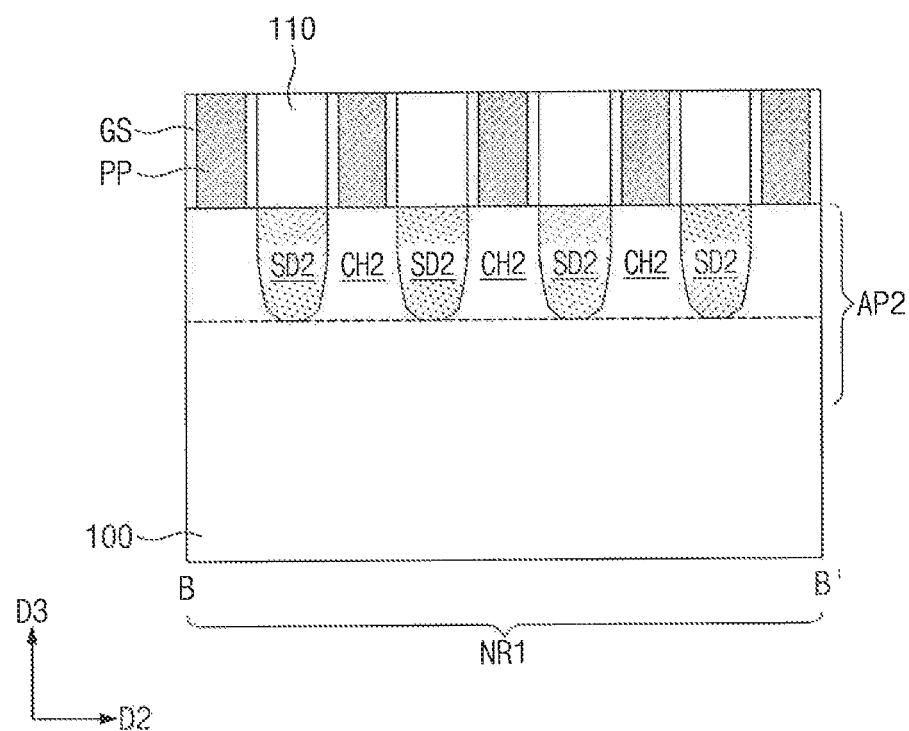
Figure 12C:
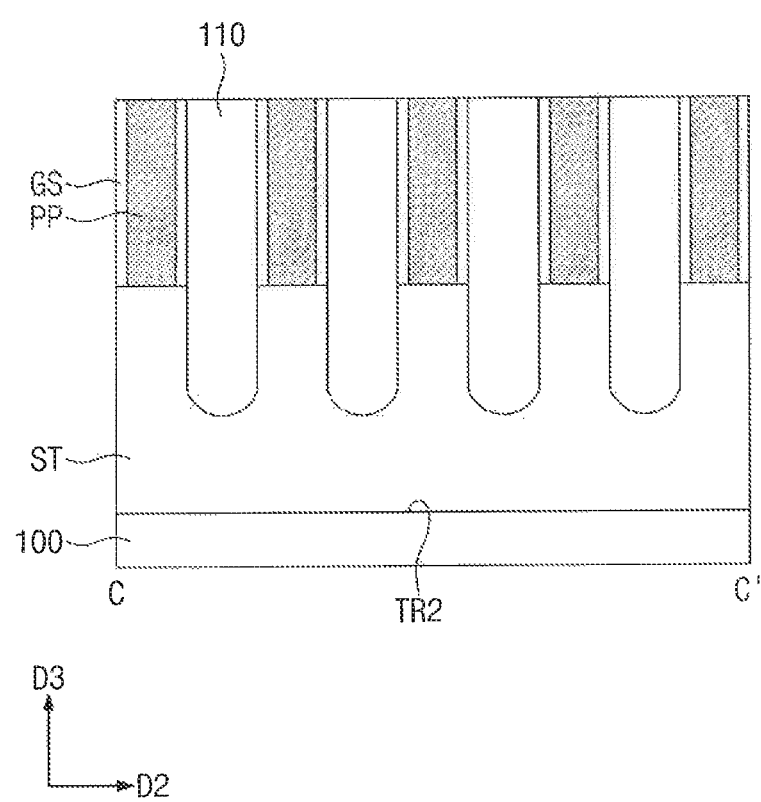
Figure 12D:
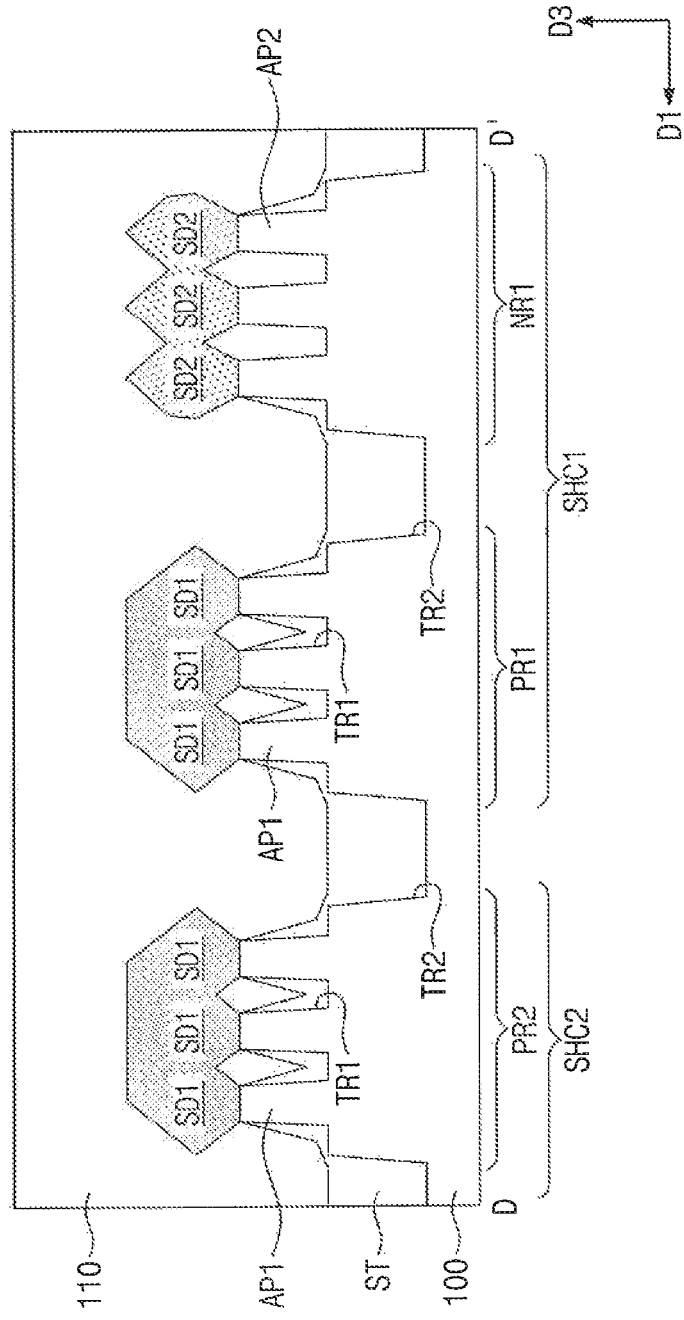
Figure 12E:
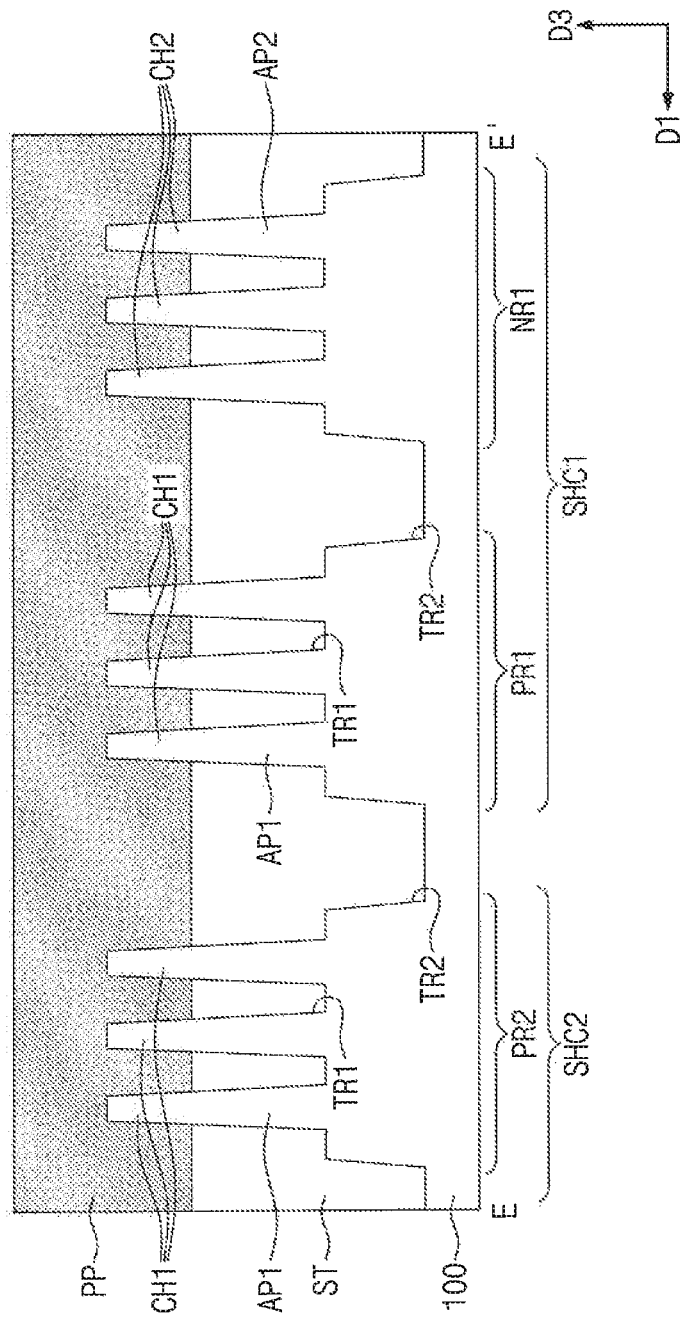
FIGS. 12E, 14E, 16E, 18E, and 20E illustrate cross-sectional views of a method of fabricating a semiconductor device taken along line E-E' of FIGS. 11, 13, 15, 17, and 19, respectively, according to embodiments of the present inventive concept.
Figure 13:
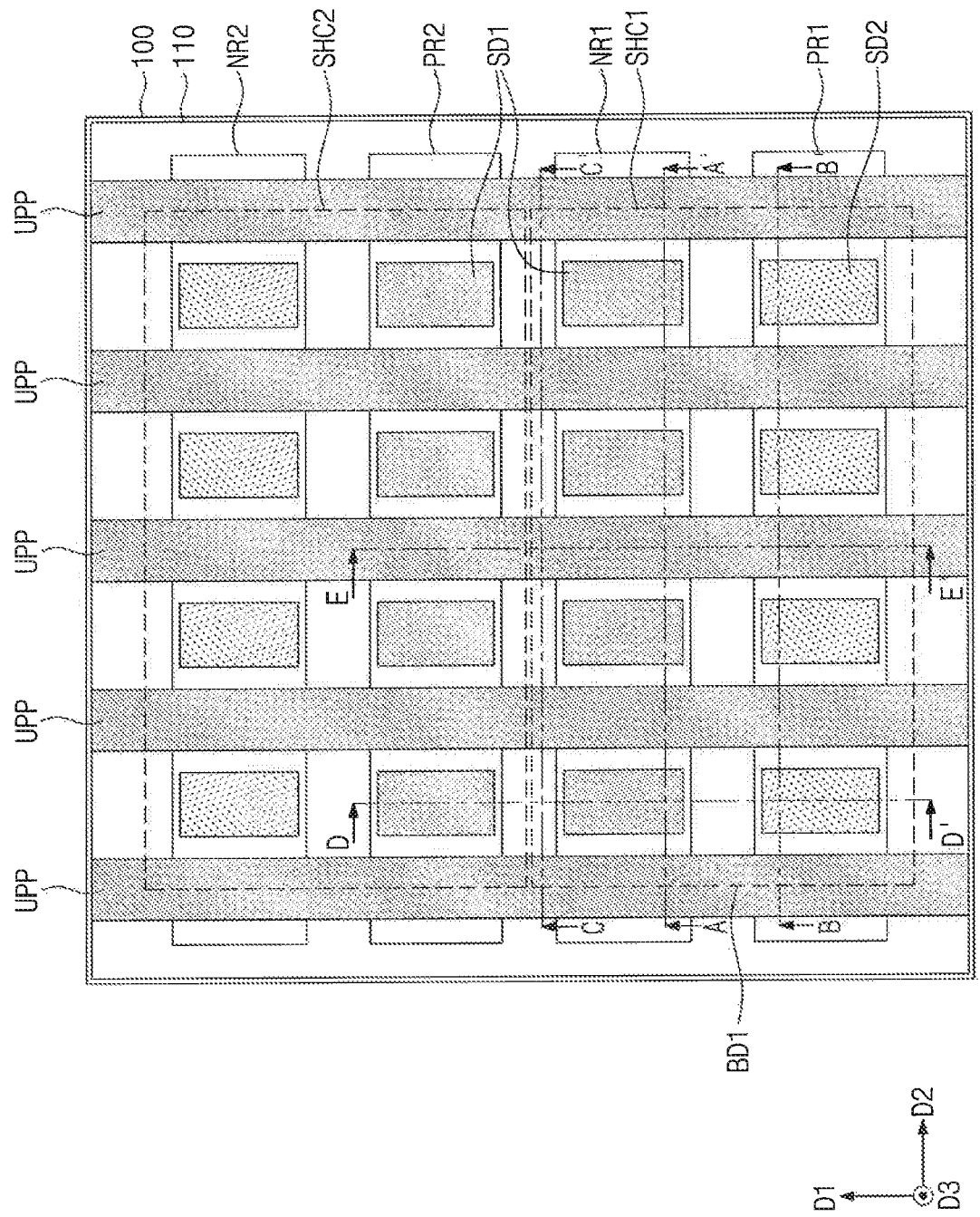
Figure 14A:
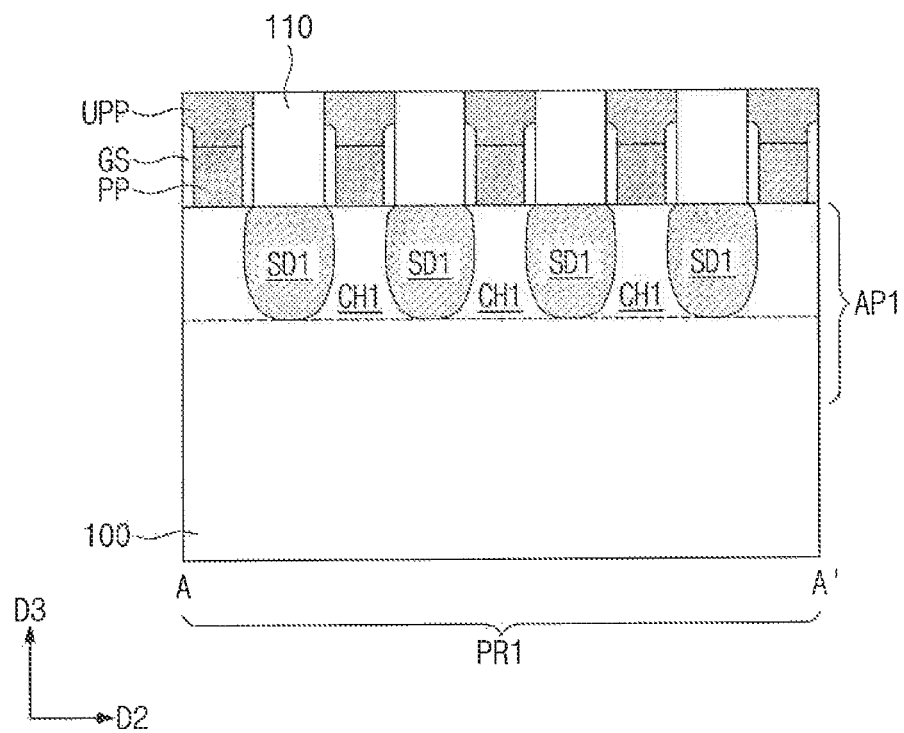
Figure 14B:
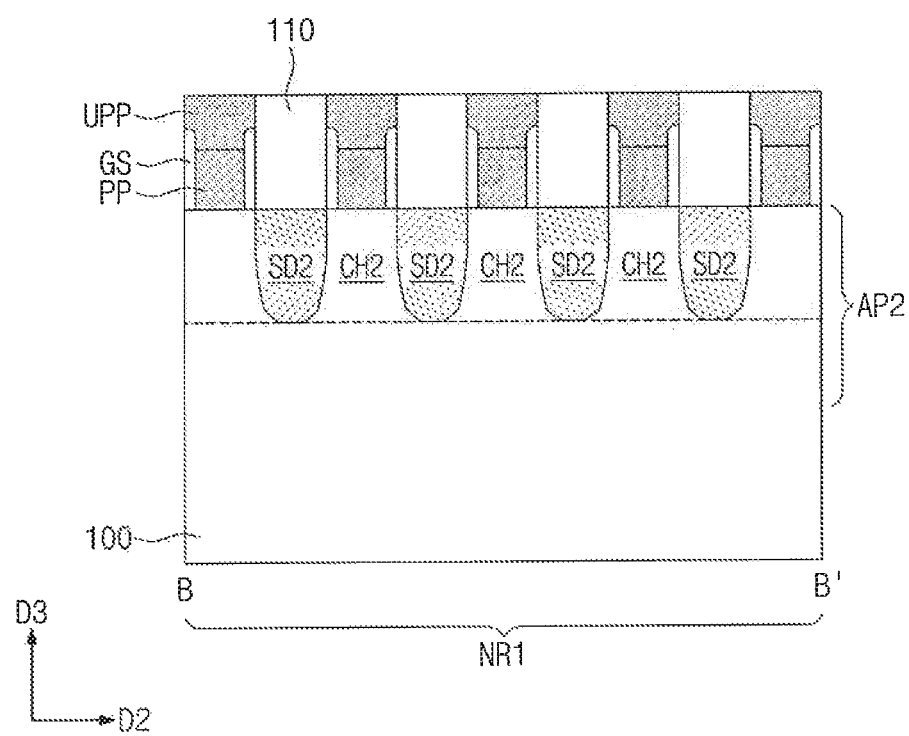
Figure 14C:
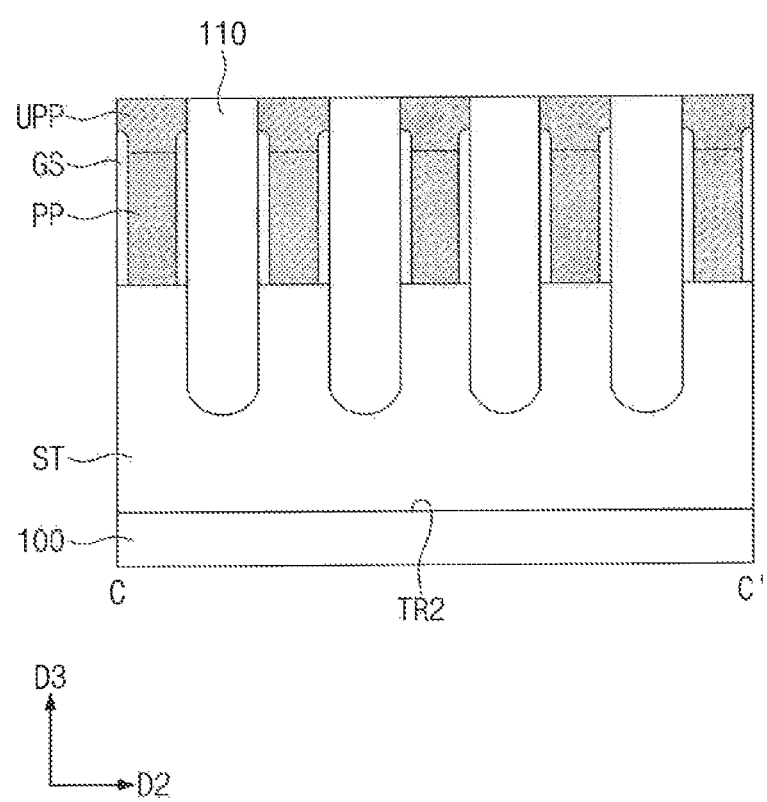
Figure 14D:
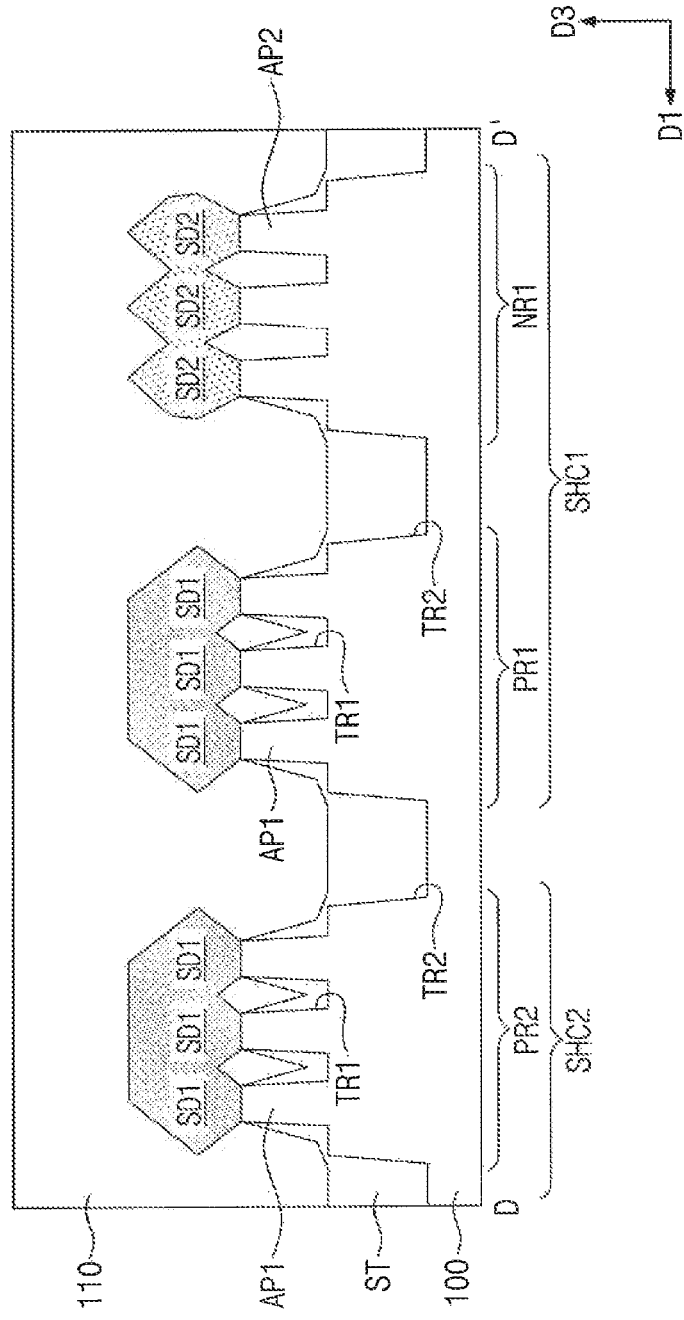
Figure 14E:
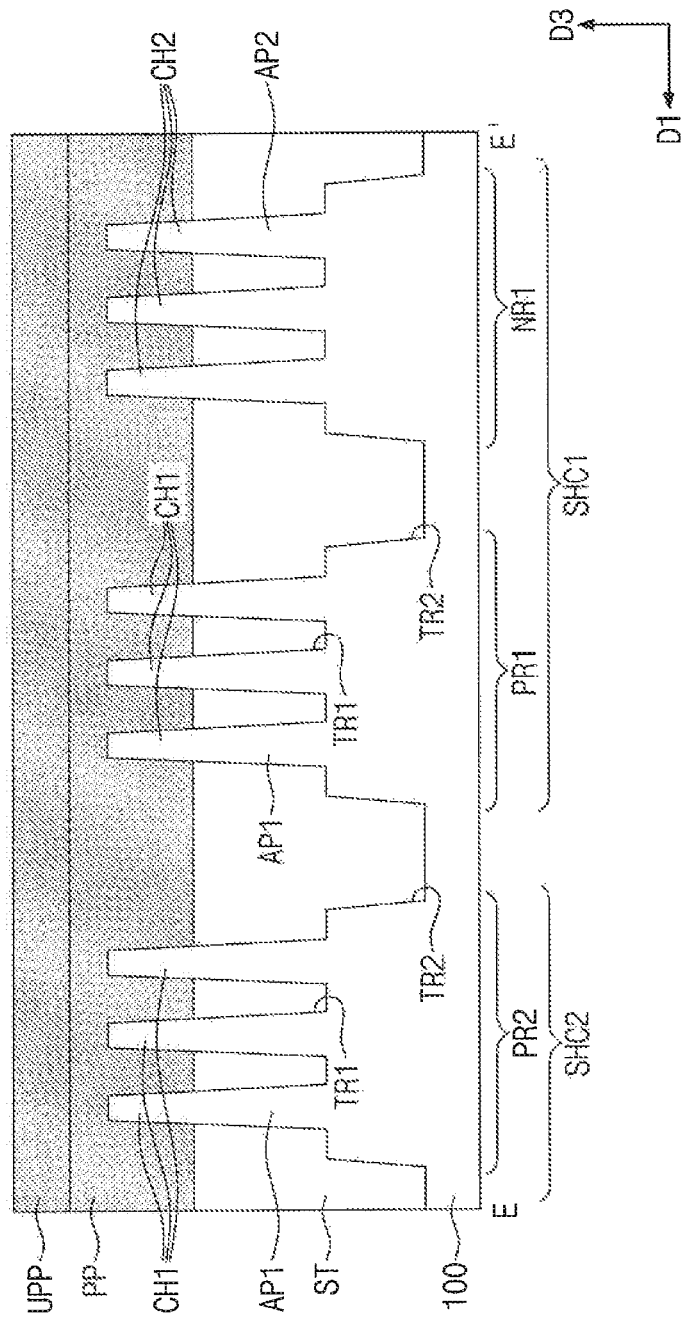
Figure 15:
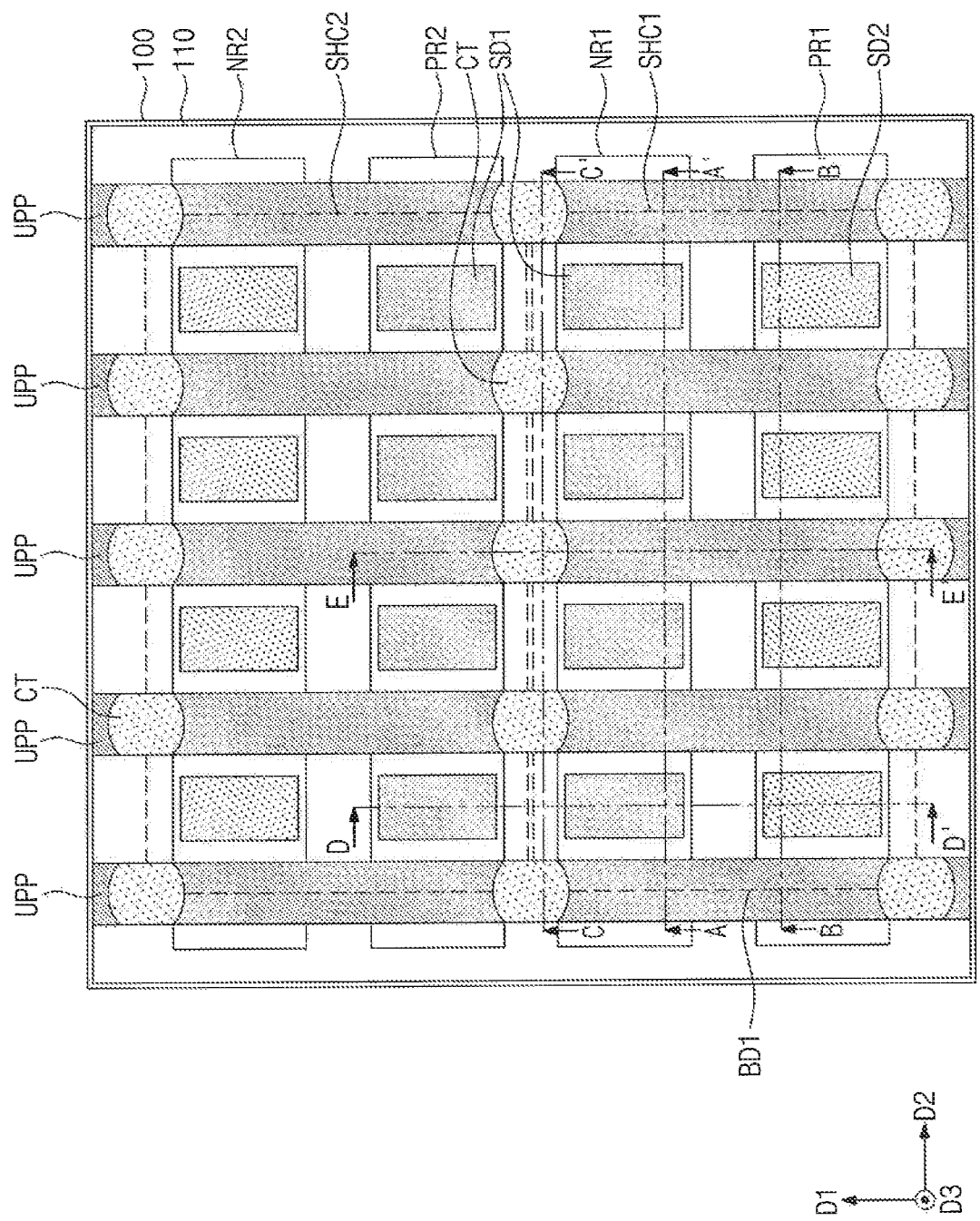
Figure 16A:
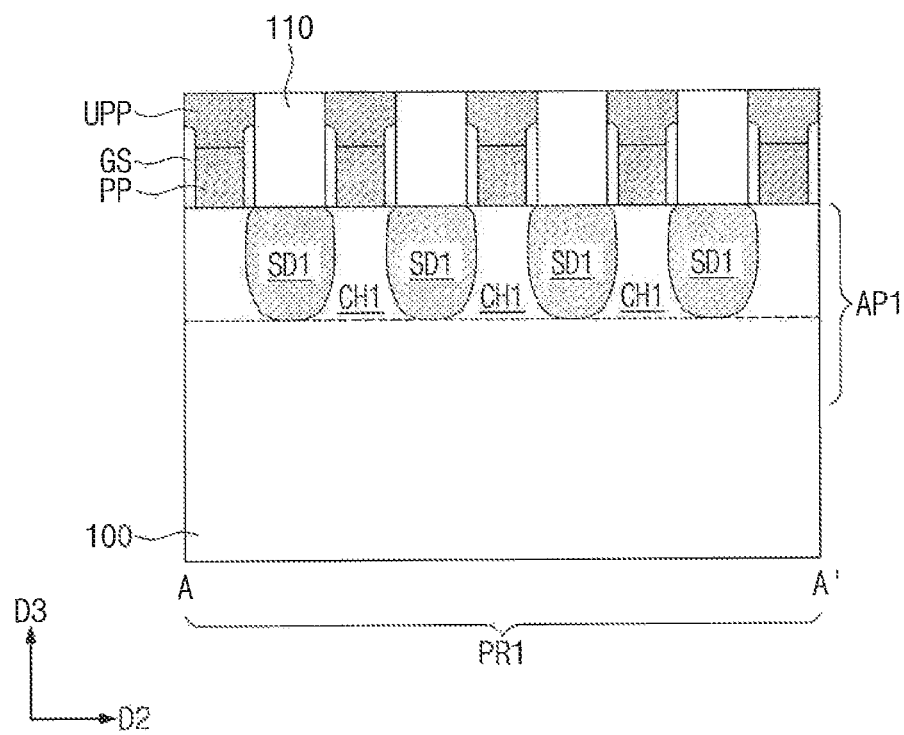
Figure 16B:
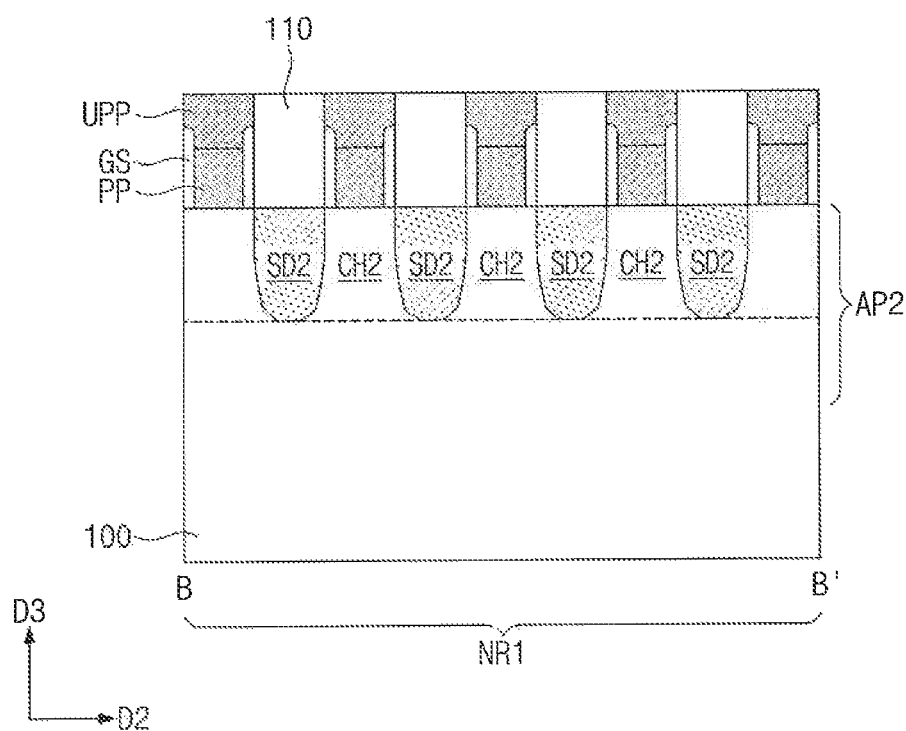
Figure 16C:
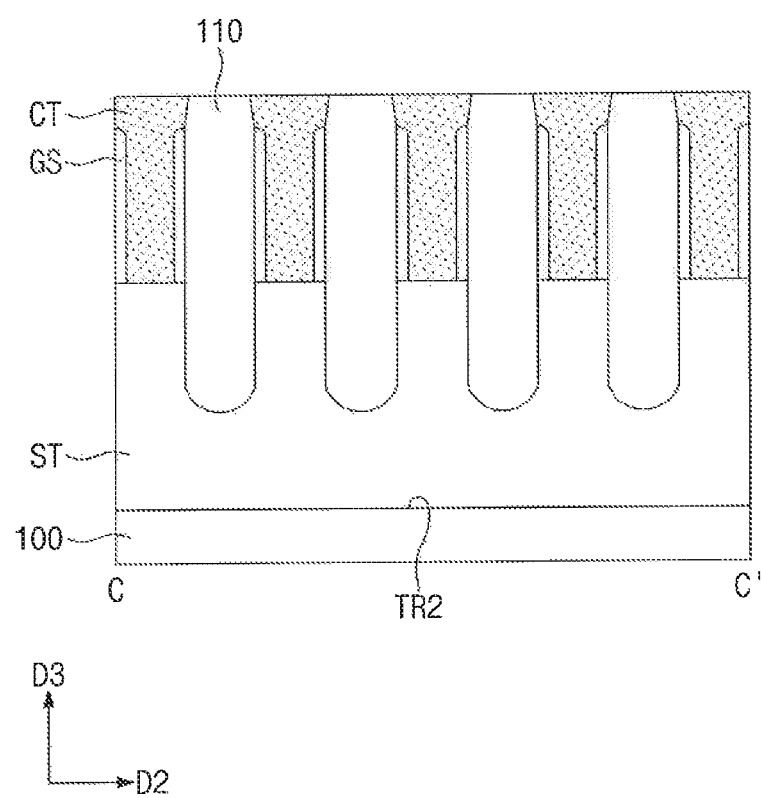
Figure 16D:
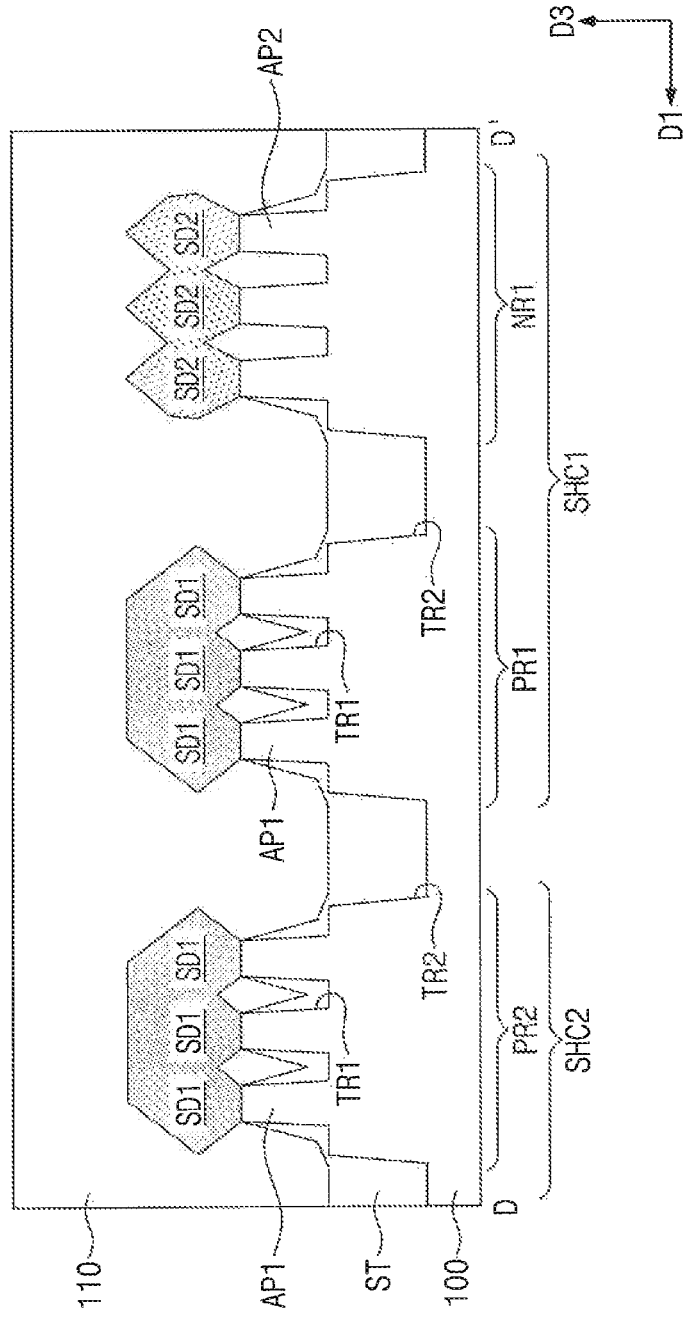
Figure 16E:
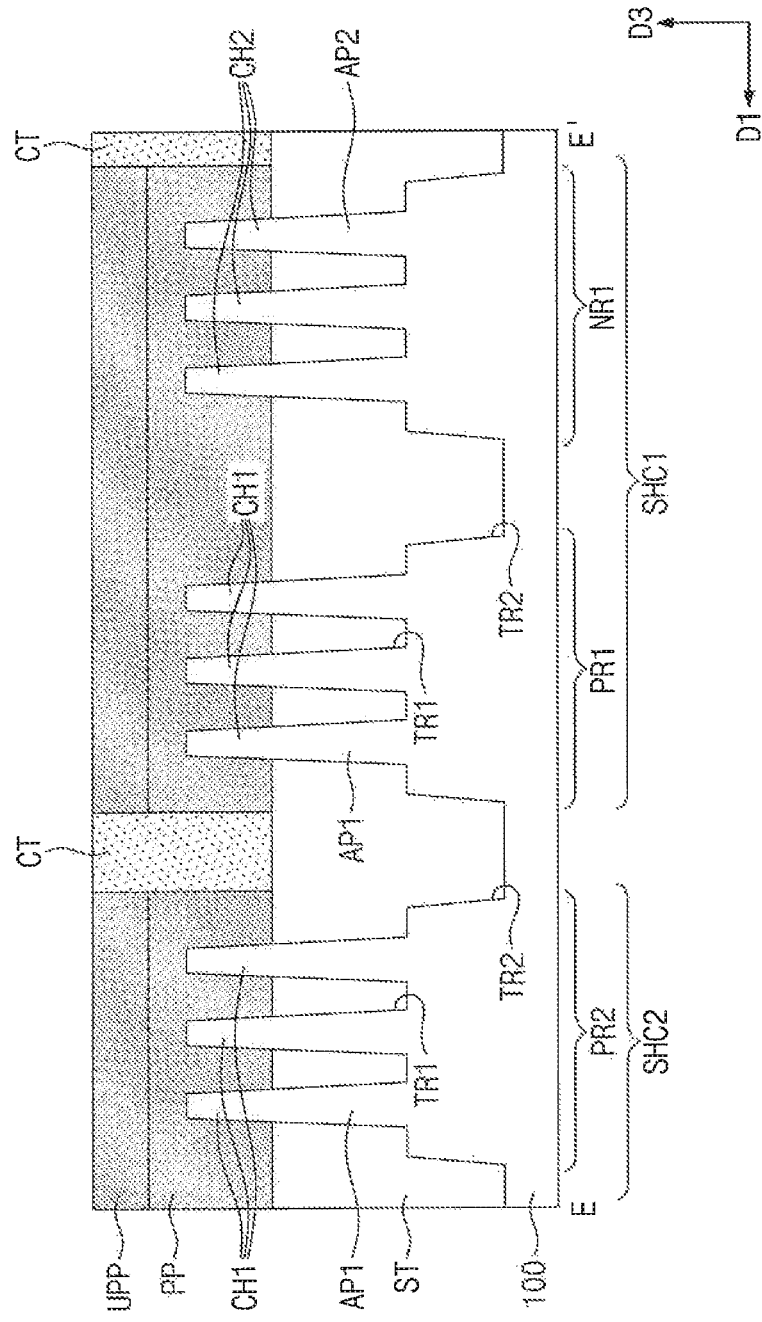
Figure 17:
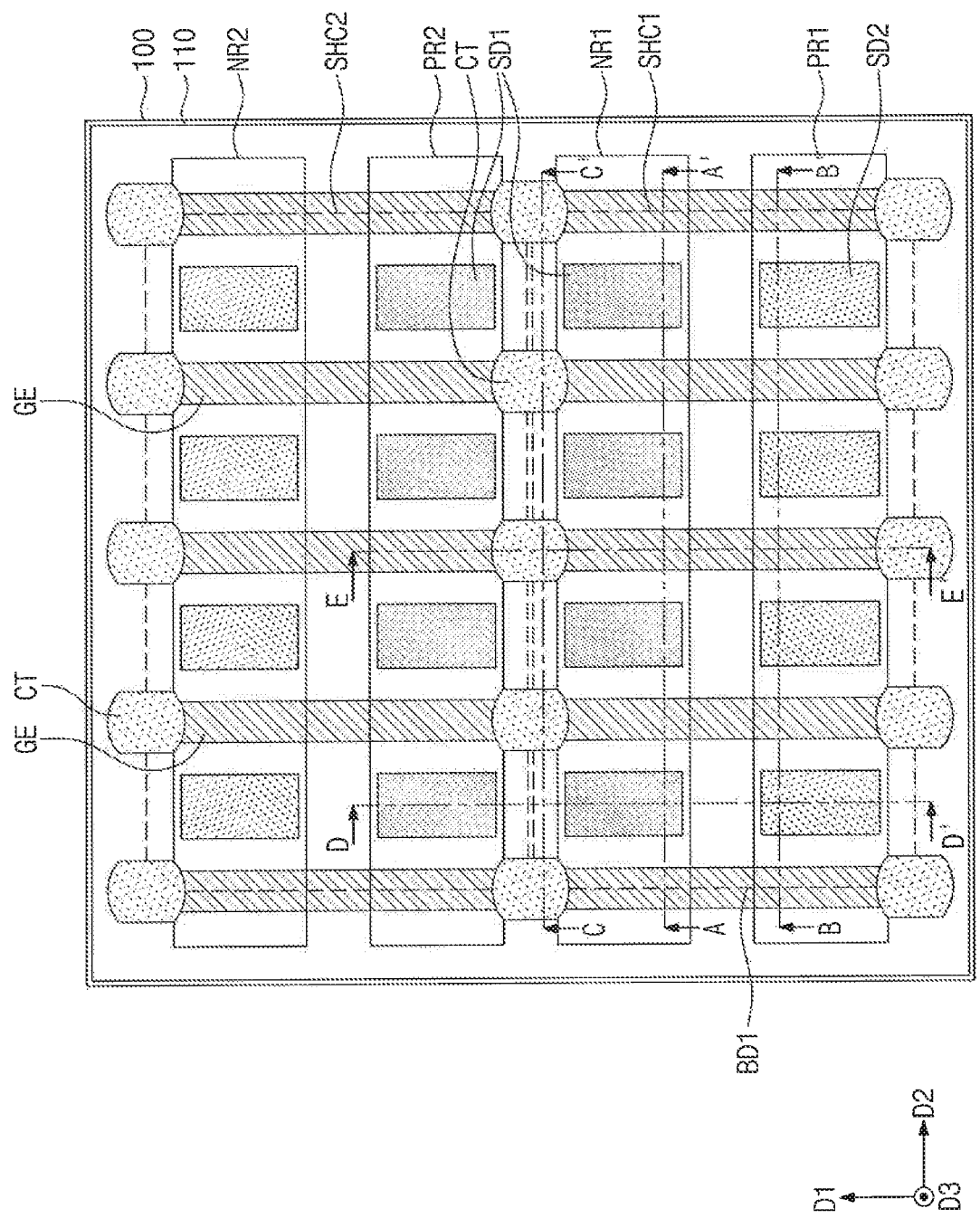
Figure 18A:
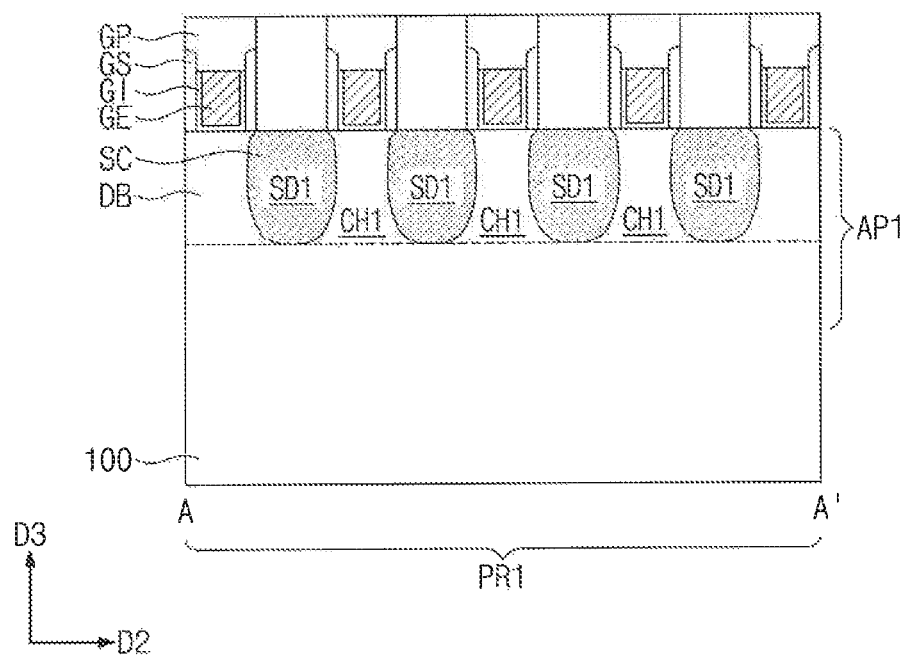
Figure 18B:
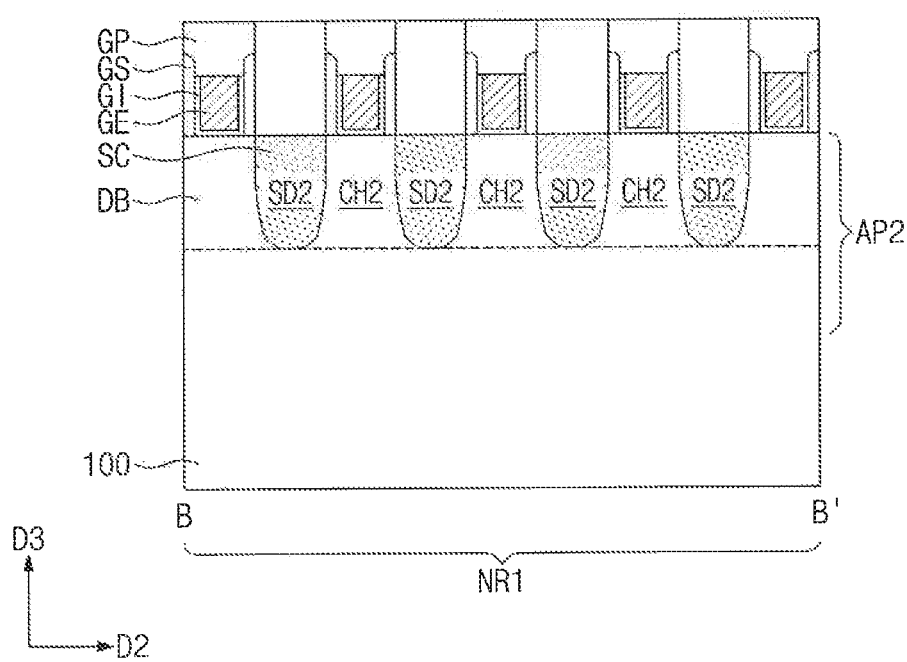
Figure 18C:
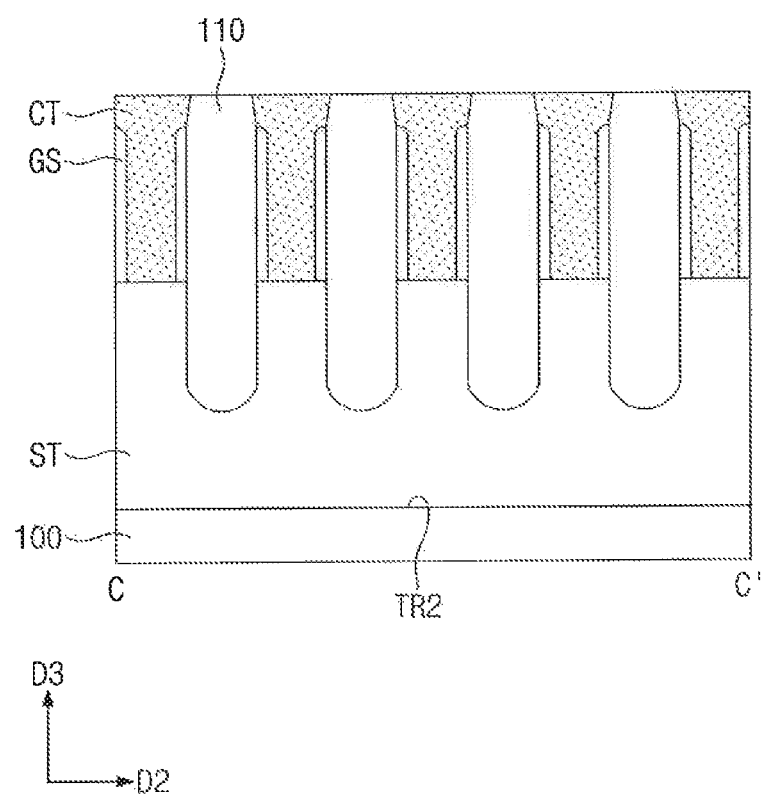
Figure 18D:
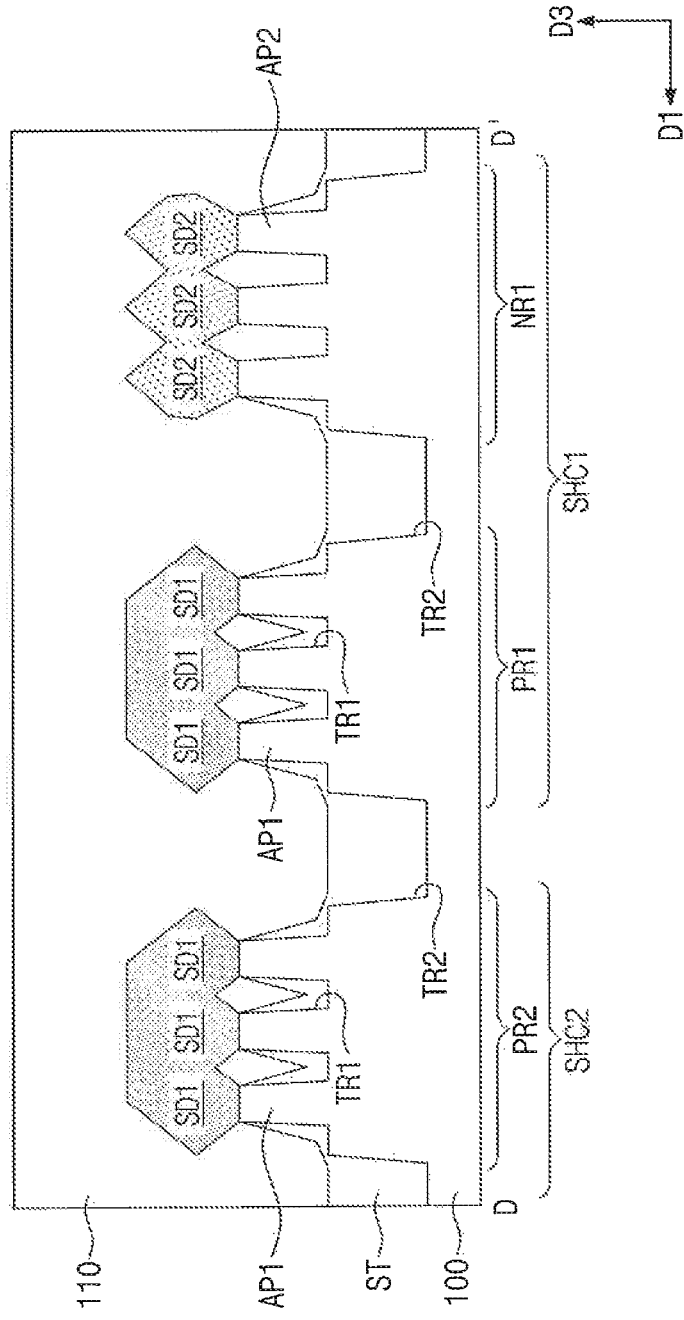
Figure 18E:
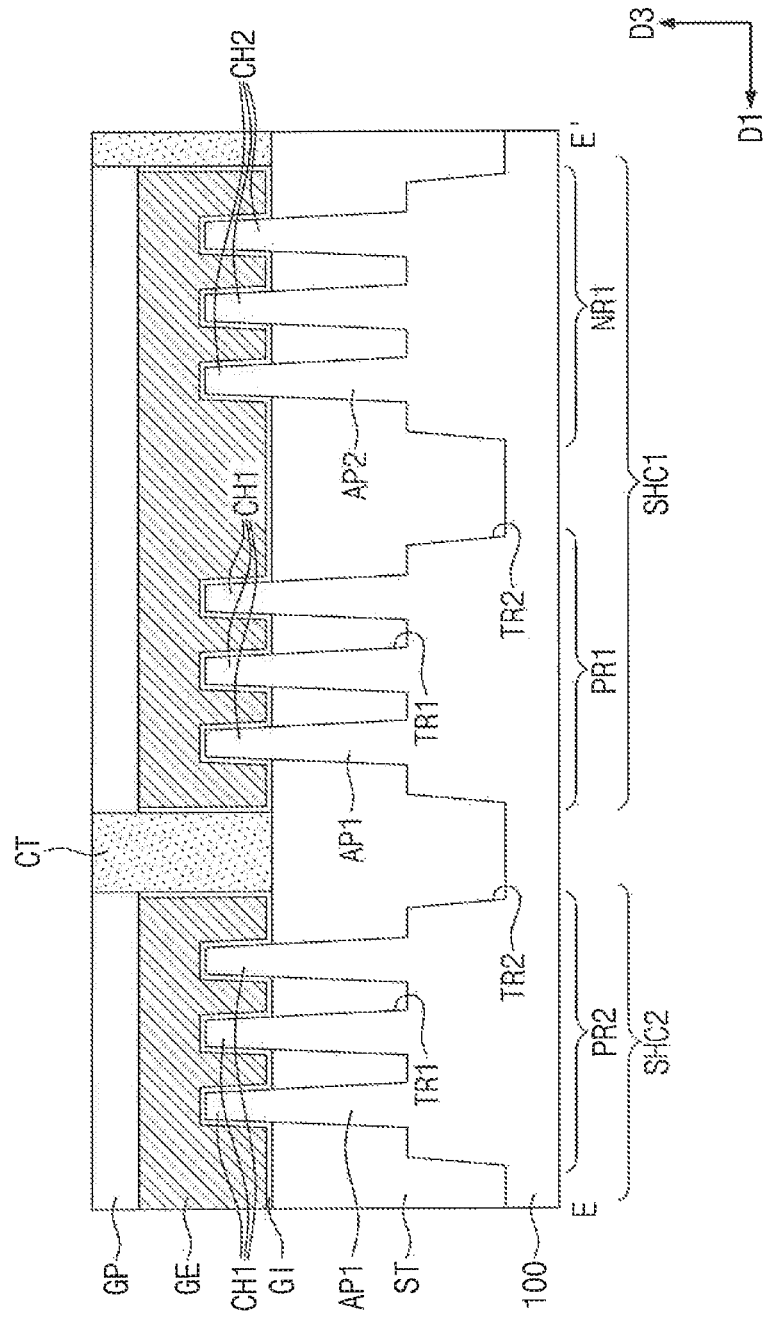
Figure 19:
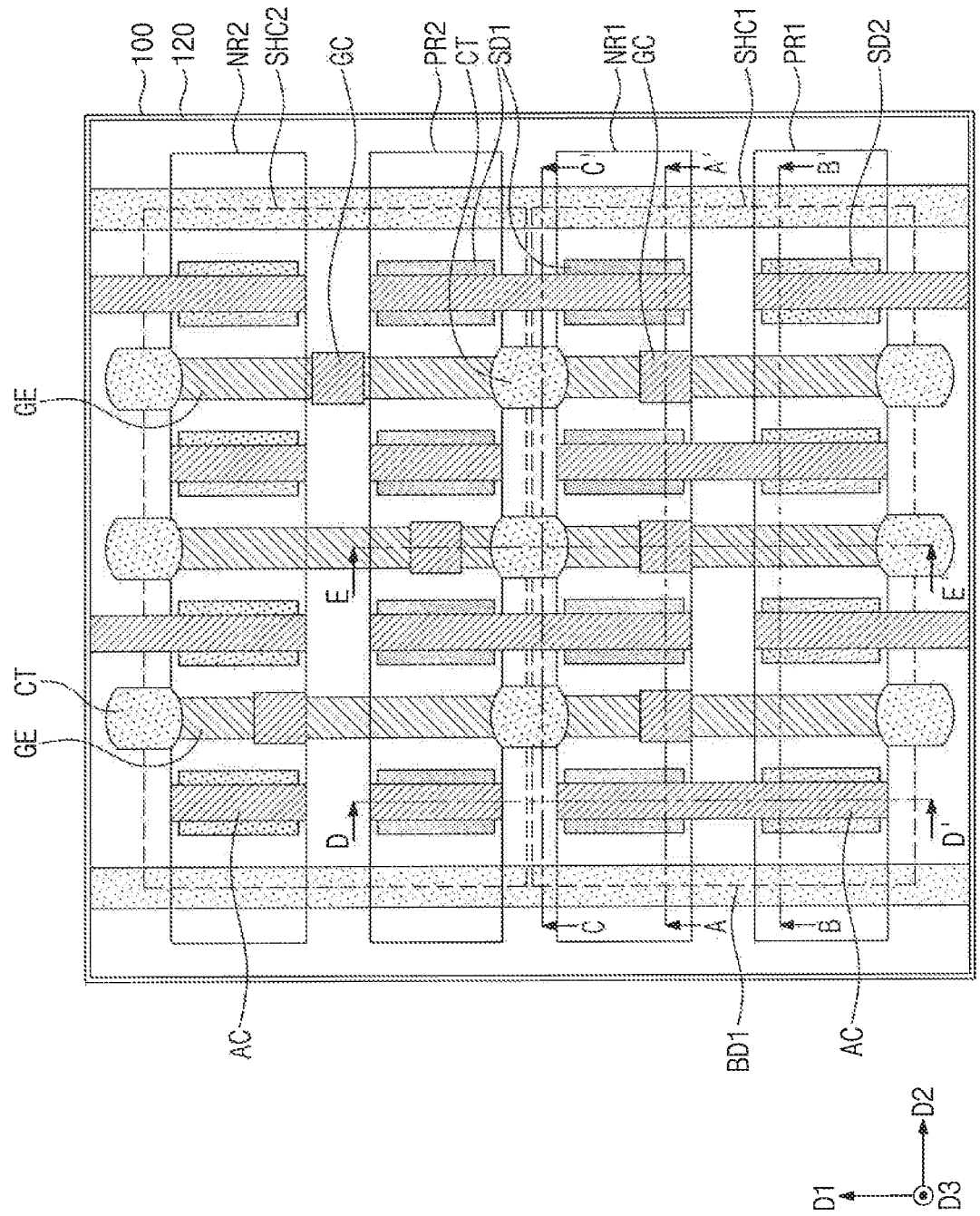
Figure 20A:
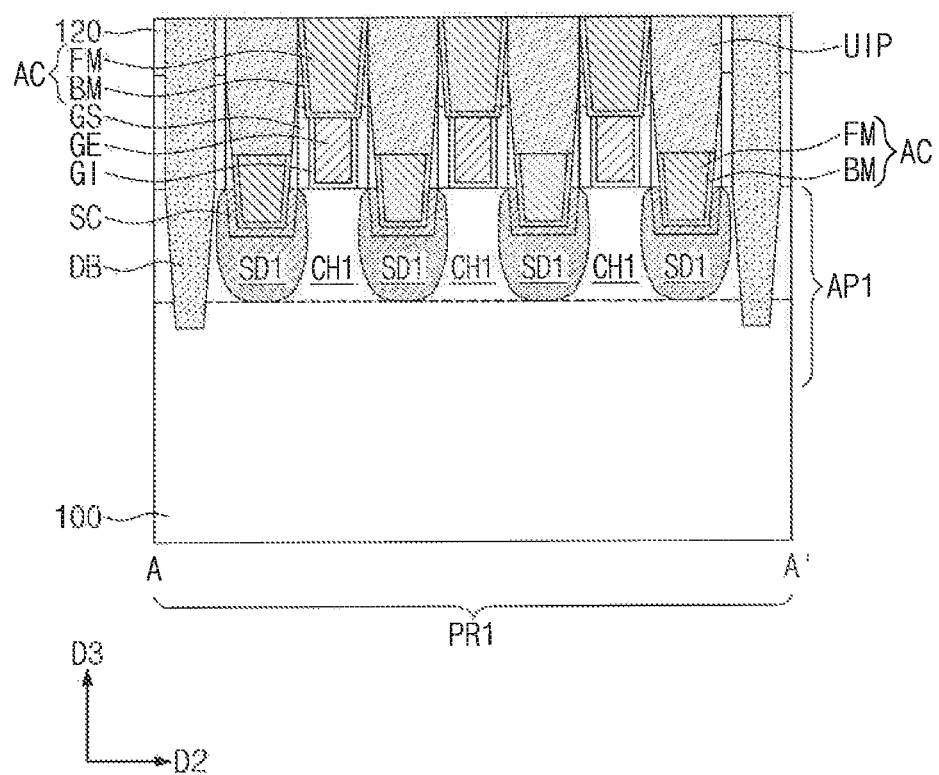
Figure 20B:
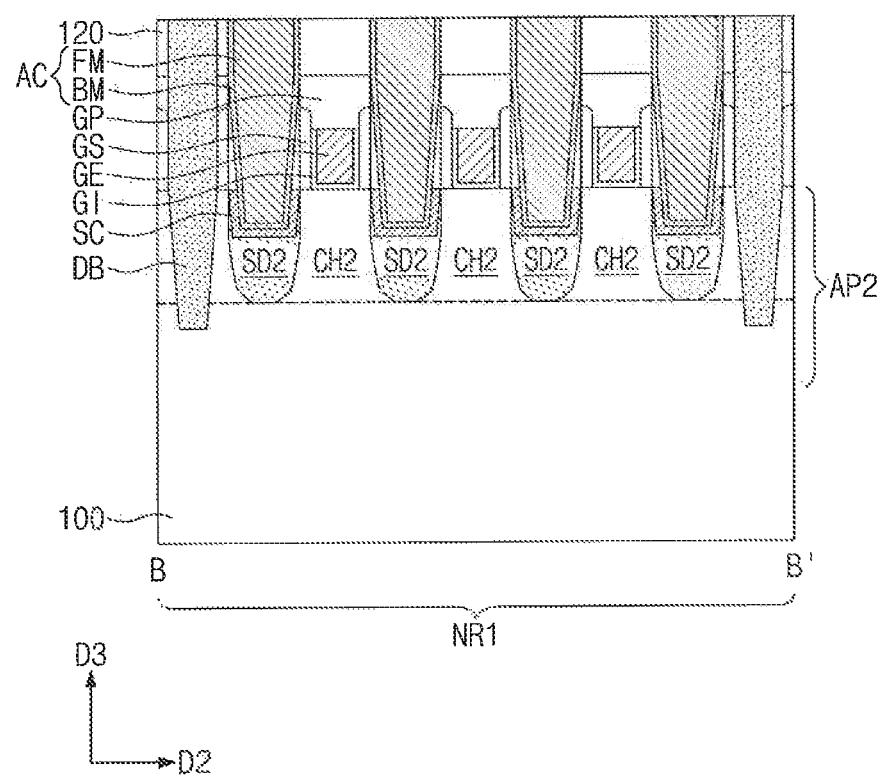
Figure 20C:
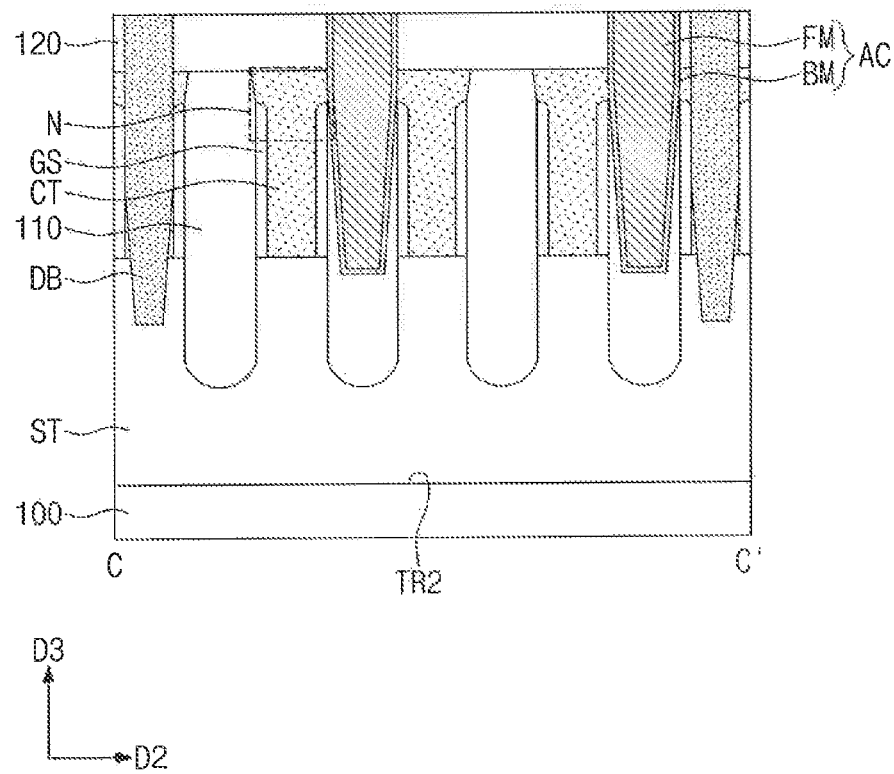
Figure 20D:
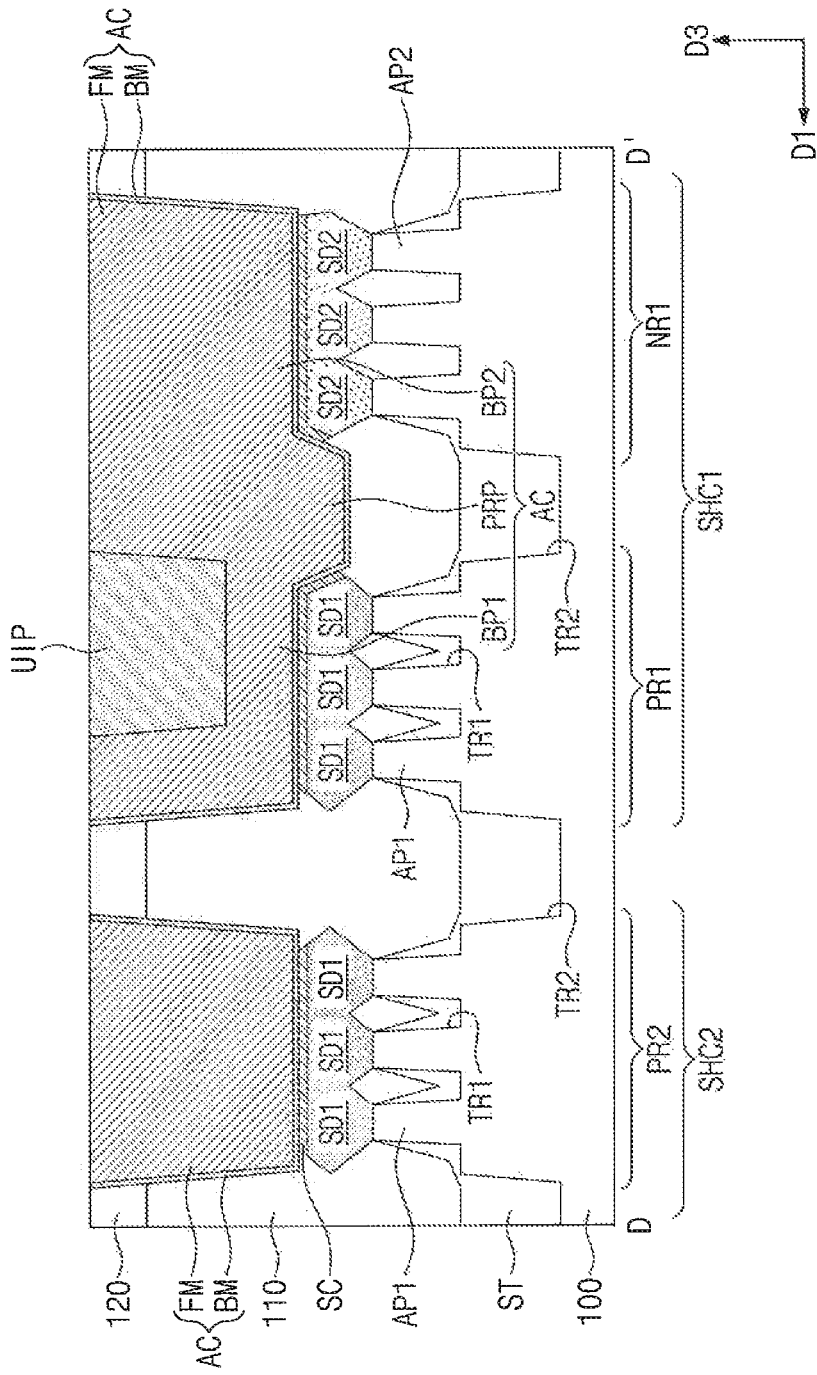
Figure 20E:
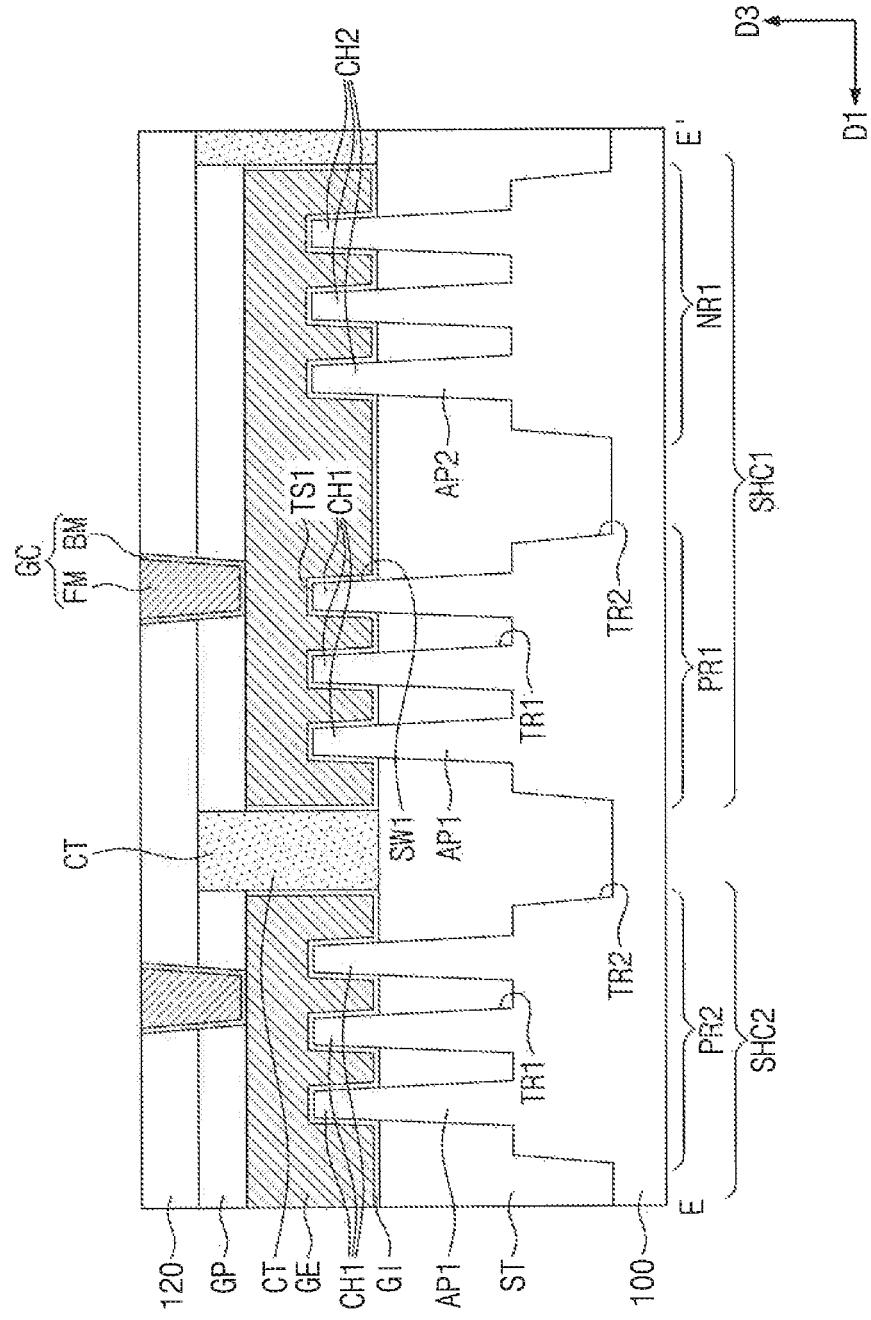

As shown in FIG. 5A, first active patterns AP1 may be provided on each of the first and second PMOSFET regions PR1 and PR2. As shown in FIG. 5B, second active patterns AP2 may be provided on each of the first and second NMOSFET regions NR1 and NR2.

In an embodiment, the first and second active patterns AP1 and AP2 may extend longitudinally parallel to each other in the second direction D2. The first and second active patterns AP1 and AP2 may be vertically protruding portions of the substrate 100. A first trench TR1 may be defined between neighboring first active patterns AP1 and between neighboring second active patterns AP2. The first trench TR1 may be shallower than the second trench TR2.

As shown in FIG. 5E, a device isolation layer ST may fill the first and second trenches TR1 and TR2. In an embodiment, the device isolation layer ST may include a silicon oxide layer. The first and second active patterns AP1 and AP2 may have upper portions that vertically protrude upwardly from the device isolation layer ST (see FIG. 5E). For example, the first and second active patterns AP1 and AP2 may have upper portions that protrude upwardly in a third direction D3 that is perpendicular to the first and second directions D1, D2. The first and second active patterns AP1 and AP2 may each have a fin shape at the upper portion thereof. The device isolation layer ST may not cover the upper portion of the first active pattern AP1 or the upper portion of the second active pattern AP2. The device isolation layer ST may cover a lower sidewall of each of the first and second active patterns AP1 and AP2.

First source/drain patterns SD1 may be provided on each of the first and second PMOSFET regions PR1 and PR2. The first source/drain patterns SD1 may be provided on the upper portion of each of the first active patterns AP1. The first source/drain patterns SD1 may be impurity regions having a first conductivity type (e.g., a p-type). A first channel pattern CH1 may be interposed between a pair of first source/drain patterns SD1 that are adjacent to each other in the second direction D2.

Second source/drain patterns SD2 may be provided on each of the first and second NMOSFET regions NR1 and NR2. The second source/drain patterns SD2 may be provided on the upper portion of each of the second active patterns AP2. The second source/drain patterns SD2 may be impurity regions having a second conductivity type (e.g., an n-type). A second channel pattern CH2 may be interposed between a pair of second source/drain patterns SD2 that are adjacent to each other in the second direction D2.

In an embodiment, the first and second source/drain patterns SD1 and SD2 may be epitaxial patterns formed by a selective epitaxial growth process. For example, the first and second source/drain patterns SD1 and SD2 may have their top surfaces coplanar with the top surfaces of the first and second channel patterns CH1 and CH2. However, embodiments of the present inventive concept are not limited thereto. For example, in an embodiment, the first and second source/drain patterns SD1 and SD2 may have their top surfaces higher than the top surfaces of the first and second channel patterns CH1 and CH2.

The first source/drain pattern SD1 may include a semiconductor element (e.g., SiGe) having a lattice constant that is greater than that of a semiconductor element of the substrate 100. Therefore, a pair of first source/drain patterns SD1 may provide a compressive stress to the first channel pattern CH1 therebetween. For example, the second source/drain pattern SD2 may include the same semiconductor element (e.g., Si) as that of the substrate 100.

Gate electrodes GE may be arranged to extend in the first direction D1, while running across the first and second active patterns AP1 and AP2. The gate electrodes GE may be arranged along the second direction D2 at a first pitch (e.g., height in the third direction D3). The gate electrodes GE may vertically overlap the first and second channel patterns CH1 and CH2. Each of the gate electrode GE may surround a top surface and opposite sidewall sidewalls of each of the first and second channel patterns CH1 and CH2.

Referring again to FIG. 5E, the gate electrode GE may be disposed on a first top surface TS1 of the channel pattern CH1 or CH2 and also on at least one first sidewall SW1 of the channel pattern CH1 or CH2. For example, a transistor according to some embodiments may be a three-dimensional field effect transistor (e.g., FinFET) in which the gate electrode GE three-dimensionally surrounds the first and second channel patterns CH1 and CH2.

Referring back to FIGS. 4 and 5A to 5E, the first single height cell SHC1 may have a first boundary BD1 and a second boundary BD2 that are opposite to each other in the second direction D2. The first and second boundaries BD1 and BD2 may extend longitudinally in the first direction D1. The first single height cell SHC1 may have a third boundary BD3 and a fourth boundary BD4 that are opposite to each other in the first direction D1. The third and fourth boundaries BD3 and BD4 may extend longitudinally in the second direction D2.

Gate cutting patterns CT may be disposed on a boundary parallel to the second direction D2 of each of the first and second single height cells SHC1 and SHC2. For example, the gate cutting patterns CT may be disposed on the third and fourth boundaries BD3 and BD4 of the first single height cell SHC1. In an embodiment, the gate cutting patterns CT may be arranged at the first pitch along the third boundary BD3. The gate cutting patterns CT may be arranged at the first pitch along the fourth boundary BD4. When viewed in plan, the gate cutting patterns CT on the third and fourth boundaries BD3 and BD4 may be disposed to overlap corresponding gate electrodes GE.

Referring to FIG. 5E, the gate cutting pattern CT may extend in a third direction D3 from the device isolation layer ST to a second interlayer dielectric layer 120 which will be discussed below. The gate cutting pattern CT may have a top surface higher than a top surface of the gate electrode GE. In an embodiment, the top surface of the gate cutting pattern CT may be substantially coplanar with that of a gate capping pattern GP which will be discussed below. In an embodiment, the gate cutting pattern CT may include a dielectric material, such as a silicon nitride layer, a silicon oxide layer, or a combination thereof. However, embodiments of the present inventive concept are not limited thereto.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2 (e.g., in the first direction D1). The gate electrodes GE are aligned in the first direction D1. For example, one or more gate cutting patterns CT may divide the gate electrode GE extending in the first direction D1 into a plurality of gate electrodes GE.

A pair of gate spacers GS may be disposed on opposite sidewalls of each of the gate electrodes GE. The gate spacers GS may extend in the first direction D1 along the gate electrodes GE. For example, the gate spacers GS may extend longitudinally in the first direction D1 from opposite sidewalls of the gate electrode GE of the first single height cell SHC1 along opposite sidewalls of the gate cutting pattern CT towards opposite sidewalls of the gate electrode GE of the second single height cell SHC2. The gate spacers GS may have top surfaces that are higher than the top surface of the gate electrode GE adjacent thereto. The top surface of the gate spacer GS may be lower than the top surface of a gate capping pattern GP which will be discussed below. The top surface of the gate spacer GS may be lower than the top surface of the gate cutting pattern CT.

In an embodiment, the gate spacer GS may include at least one compound selected from SiCN, SiCON, and SiN. In some embodiments of the present inventive concept, referring to FIG. 6A, the gate spacer GS may have a multi-layered structure including a first gate spacer GS1 and a second gate spacer GS2. The first and second gate spacers GS1 and GS2 may include different materials from each other. For example, the first gate spacer GS1 may include SiOCN or a low-k dielectric material, and the second gate spacer GS2 may include SiN having a high etch resistance. The first gate spacer GS1 may have a dielectric constant less than the dielectric constant of the second gate spacer GS2. The first gate spacer GS1 may have a thickness in the second direction D2 greater than a thickness in the second direction D2 of the second gate spacer GS2.

Referring again to FIGS. 4 and 5A to 5E, a gate capping pattern GP may be disposed on each of the gate electrodes GE. The gate capping pattern GP may extend longitudinally in the first direction D1 along the gate electrode GE. In an embodiment, the gate capping pattern GP may include a material having an etch selectivity with respect to first and second interlayer dielectric layers 110 and 120 which will be discussed below. For example, the gate capping pattern GP may include at least one compound selected from SiON, SiCN, SiCON, and SiN. However, embodiments of the present inventive concept are not limited thereto.

A gate dielectric layer GI may be interposed between the gate electrode GE and the first active pattern AP1 and between the gate electrode GE and the second active pattern AP2. The gate dielectric layer GI may extend along a bottom surface of the gate electrode GE that overlies the gate dielectric layer GI. For example, the gate dielectric layer GI may cover the first top surface TS1 and the first sidewall SW1 of the channel pattern CH1 or CH2. The gate dielectric layer GI may cover a top surface of the device isolation layer ST that underlies the gate electrode GE.

In some embodiments of the present inventive concept, the gate dielectric layer GI may include a high-k dielectric material having a dielectric constant that is greater than the dielectric constant of a silicon oxide layer. For example, in an embodiment, the high-k dielectric material may include at least one compound selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, a semiconductor device according to the present inventive concept may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. In an embodiment, the ferroelectric material layer may include, for example, at least one compound selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). In an embodiment, the hafnium zirconium oxide may be a compound of hafnium (Hf), zirconium (Zr), and oxygen (O).

The ferroelectric material layer may further include impurities doped thereinto. For example, the impurities may include at least one compound selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The impurities included in the ferroelectric material layer may be changed depending on what ferroelectric material is included in the ferroelectric material layer.

For example, when the ferroelectric material layer includes hafnium oxide, the ferroelectric material layer may include at least one impurity selected from gadolinium (Gd), silicon (Si), zirconium (Zr), aluminum (Al), and yttrium (Y). However, embodiments of the present inventive concept are not limited thereto.

In an embodiment, when the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one compound selected from silicon oxide and high-k metal oxide. The metal oxide included in the paraelectric material layer may include, for example, at least one compound selected from hafnium oxide, zirconium oxide, and aluminum oxide. However, embodiments of the present inventive concept are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from the crystal structure of the hafnium oxide included in the paraelectric material layer.

The ferroelectric material layer may have a thickness having ferroelectric properties. For example, in an embodiment, the thickness of the ferroelectric material layer may be in a range of about 0.5 nm to about 10 nm. However, embodiments of the present inventive concept are not limited thereto. Since ferroelectric materials have their own critical thickness that exhibits ferroelectric properties, the thickness of the ferroelectric material layer may depend on the ferroelectric material.

For example, the gate dielectric layer GI may include a single ferroelectric material layer. In another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

In an embodiment, the first metal pattern may include a metal nitride layer. For example, the first metal pattern may include nitrogen (N) and at least one metal selected from titanium (Ti), tantalum (Ta), aluminum (Al), tungsten (W), and molybdenum (Mo). The first metal pattern may further include carbon (C). The first metal pattern may include a plurality of stacked work-function metal layers.

The second metal pattern may include metal having a resistance that is less than the resistance of the first metal pattern. For example, the second metal pattern may include at least one metal selected from tungsten (W), aluminum (Al), titanium (Ti), and tantalum (Ta).

A first interlayer dielectric layer 110 may be disposed on the substrate 100. The first interlayer dielectric layer 110 may cover the gate spacers GS and the first and second source/drain patterns SD1 and SD2. In an embodiment, the first interlayer dielectric layer 110 may have a top surface substantially coplanar with the top surfaces of the gate capping patterns GP. The top surface of the first interlayer dielectric layer 110 may be substantially coplanar with the top surfaces of the gate cutting patterns CT.

The first interlayer dielectric layer 110 may be provided thereon with a second interlayer dielectric layer 120 that covers the gate capping patterns GP and the gate cutting patterns CT. A third interlayer dielectric layer 130 may be disposed on the second interlayer dielectric layer 120. A fourth interlayer dielectric layer 140 may be provided on the third interlayer dielectric layer 130. For example, the first, second, third, and fourth interlayer dielectric layers 110, 120, 130, and 140 may include a silicon oxide layer. However, embodiments of the present inventive concept are not limited thereto.

A pair of separation structures DB may be arranged on both sides of each of the first and second single height cells SHC1 and SHC2 that are opposite to each other in the second direction D2. For example, the pair of separation structures DB may be correspondingly disposed on first and second boundaries BD1 and BD2 of the first single height cell SHC1. The separation structure DB may extend in the first direction D1 parallel to the gate electrodes GE. A pitch between the separation structure DB and the adjacent gate electrode GE may be the same as the first pitch.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 and to correspondingly have electrical connection with the first and second source/drain patterns SD1 and SD2. Each of the active contacts AC may be disposed between a pair of gate electrodes GE. In an embodiment, when viewed in plan, each of the active contacts AC may have a linear or bar shape that extends in the first direction D1.

In an embodiment, the active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. The active contact AC may cover a portion of the top surface of the gate capping pattern GP.

Silicide patterns SC may be correspondingly interposed between the active contacts AC and the first source/drain patterns SD1 and between the active contacts AC and the second source/drain patterns SD2. The active contacts AC may be electrically connected through the silicide patterns SC to the first and second source/drain patterns SD1 and SD2. In an embodiment, the silicide pattern SC may include metal silicide, for example, at least one compound selected from titanium silicide, tantalum silicide, tungsten silicide, nickel silicide, and cobalt silicide.

Referring back to FIG. 5D, at least one active contact AC on the first single height cell SHC1 may electrically connect the first source/drain pattern SD1 of the first PMOSFET region PR1 to the second source/drain pattern SD2 of the first NMOSFET region NR1. For example, the active contact AC may extend in the first direction D1 from the second source/drain pattern SD2 of the first NMOSFET region NR1 to the first source/drain pattern SD1 of the first PMOSFET region PR1. The active contact AC may include a first body BP1 on the first source/drain pattern SD1 and a second body BP2 on the second source/drain pattern SD2. The first body BP1 may be connected through the silicide pattern SC to a top surface of the first source/drain pattern SD1, and the second body BP2 may be connected through the silicide pattern SC to a top surface of the second source/drain pattern SD2. The active contact AC may further include a protrusion PRP interposed between the first body BP1 and the second body BP2 (e.g., in the first direction D1). The protrusion PRP may be disposed on the device isolation layer ST between the first PMOSFET region PR1 and the first NMOSFET region NR1.

In an embodiment, the protrusion PRP may extend from the first body BP1 toward the device isolation layer ST, while extending along an inclined sidewall of the first source/drain pattern SD1. The protrusion PRP may extend from the second body BP2 toward the device isolation layer ST, while extending along an inclined sidewall of the second source/drain pattern SD2. The protrusion PRP may have a bottom surface lower than a bottom surface of each of the first and second bodies BP1 and BP2. The bottom surface of the protrusion PRP may be located higher than the device isolation layer ST. For example, the protrusion PRP may be spaced apart from the device isolation layer ST (e.g., in the third direction D3) across the first interlayer dielectric layer 110.

According to some embodiments of the present inventive concept, the active contact AC may not only be connected through the first body BP1 to the top surface of the first source/drain pattern SD1, but may also be connected through the protrusion PRP to the inclined sidewall of the first source/drain pattern SD1. For example, the protrusion PRP may increase a contact area between the active contact AC and the first source/drain pattern SD1. Therefore, there may be a reduction in resistance between the active contact AC and the first source/drain pattern SD1. Likewise, the protrusion PRP may provide a reduction in resistance between the active contact AC and the second source/drain pattern SD2. Therefore, it may be possible to increase an operating speed of a semiconductor device according to some embodiments of the present inventive concept.

Gate contacts GC may be provided to penetrate the second interlayer dielectric layer 120 and the gate capping pattern GP and to correspondingly have electrical connection with the gate electrodes GE. When viewed in plan, the gate contacts GC on the first single height cell SHC1 may be disposed to overlap the first PMOFET region PR1. For example, the gate contacts GC on the first single height cell SHC1 may be provided on the first active pattern AP1 (see FIG. 5A).

On the gate electrode GE, the gate contact GC may be freely disposed in various different positions. For example, in an embodiment, the gate contacts GC on the second single height cell SHC2 may be disposed on the device isolation layer ST that fills the second PMOSFET region PR2, the second NMOSFET region NR2, and the second trench TR2 (see FIG. 4).

Figure 5D:
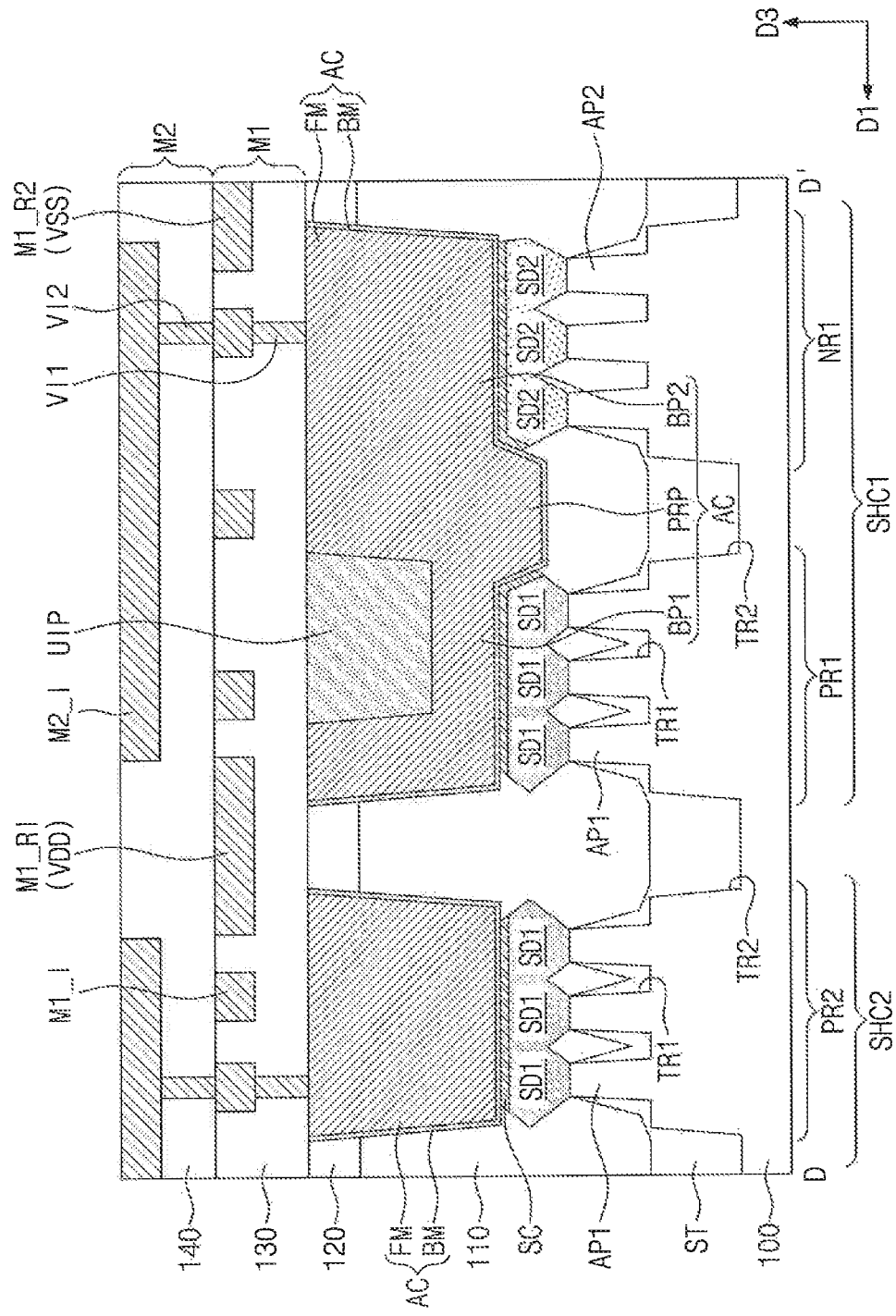

In some embodiments of the present inventive concept, referring to FIGS. 5A and 5D, an upper dielectric pattern UIP may fill an upper portion of the active contact AC adjacent to the gate contact GC (e.g., in the second direction D2). In an embodiment, the upper dielectric pattern UIP may have a bottom surface that is lower than the bottom surface of the gate contact GC. For example, the upper dielectric pattern UIP may cause the active contact AC adjacent to the gate contact GC to have a top surface lower than the bottom surface of the gate contact GC. Therefore, it may be possible to prevent a short circuit resulting from contact between the gate contact GC and its adjacent active contact AC.

Each of the active contact AC and the gate contact GC may include a conductive pattern FM and a barrier pattern BM that surrounds the conductive pattern FM. For example, in an embodiment, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one metal selected from titanium, tantalum, tungsten, nickel, cobalt, and platinum. The metal nitride layer may include at least one layer selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be disposed in the third interlayer dielectric layer 130. For example, the first metal layer M1 may include a first power line M1_R1, a second power line M1_R2, a third power line M1_R3, and first wiring lines M1_I. The first power line M1_R1, the second power line M1_R2, the third power line M1_R3, and the first wiring lines M1_I of the first metal layer M1 may extend longitudinally parallel to each other in the second direction D2.

For example, the first and second power lines M1_R1 and M1_R2 may be correspondingly disposed on the third and fourth boundaries BD3 and BD4 of the first single height cell SHC1. The first power line M1_R1 may extend longitudinally in the second direction D2 along the third boundary BD3. The second power line M1_R2 may extend longitudinally in the second direction D2 along the fourth boundary BD4. For example, as shown in FIG. 5E, the gate cutting patterns CT may vertically overlap at least one of the first and second power lines M1_R1 and M1_R2.

The first wiring lines M1_I of the first metal layer M1 may be arranged along the first direction D1 at a second pitch. The second pitch may be less than the first pitch. In an embodiment, each of the first wiring lines M1_I may have a line-width that is less than the line-width of each of the first, second, and third power lines M1_R1, M1_R2, and M1_R3.

The first metal layer M1 may further include first vias VI1. The first vias VI1 may be correspondingly disposed below the lines M1_R1, M1_R2, M1_R3, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, M1_R3, and M1_I of the first metal layer M1.

For example, a line and its underlying first via VI1 of the first metal layer M1 may be formed by individual processes.

For example, the line and its underlying first via VI1 of the first metal layer M1 may each be formed by a single damascene process. In an embodiment, a sub-20 nm process may be employed to fabricate a semiconductor device. However, embodiments of the present inventive concept are not limited thereto.

A second metal layer M2 may be disposed in the fourth interlayer dielectric layer 140. The second metal layer M2 may include a plurality of second wiring lines M2_1. In an embodiment, the second wiring lines M2_1 of the second metal layer M2 may each have a linear or bar shape that extends longitudinally in the first direction D1. For example, the second wiring lines M2_1 may extend longitudinally parallel to each other in the first direction D1.

The second metal layer M2 may further include second vias VI2 correspondingly disposed below the second wiring lines M2_1. A line of the first metal layer M1 may be electrically through the second via VI2 to a corresponding line of the second metal layer M2. In an embodiment, a line and its underlying second via VI2 of the second metal layer M2 may be simultaneously formed by a dual damascene process.

The first and second metal layers M1 and M2 may have lines that include the same or different conductive materials. For example, the first and second metal layers M1 and M2 may have lines that include at least one metallic material selected from aluminum, copper, tungsten, molybdenum, and cobalt. In an embodiment, other metal layers (e.g., M3, M4, M5, etc.) may be additionally stacked on the fourth interlayer dielectric layer 140. Each of the stacked metal layers may include wiring lines for routing between cells.

With reference to FIG. 6A, the following description will focus on an upper portion of the gate electrode GE and a structure of the gate capping pattern GP according to some embodiments of the present inventive concept. The gate spacer GS may include a first gate spacer GS1 and a second gate spacer GS2 that are disposed side by side in the second direction D2. The first gate spacer GS1 may have a first top surface TOP1, and the second gate spacer GS2 may have a second top surface TOP2. In an embodiment, the second top surface TOP2 may be positioned higher than the first top surface TOP1. The first top surface TOP1 may be positioned higher than the top surface of the gate electrode GE.

The gate capping pattern GP may be disposed on the gate electrode GE and the gate spacer GS. The gate capping pattern GP may include a first part PO1, a second pan PO2, and a third part PO3. The first part PO1 may be interposed between a pair of first gate spacers GS1 adjacent to each other (e.g., in the second direction D2). The first part PO1 may cover the top surface of each of the gate electrode GE and the gate dielectric layer GI. A first width W1 may be given as a maximum width in the second direction D2 of the first part PO1.

The second part PO2 may be disposed on the first part PO1. The second part PO2 may be interposed between a pair of second gate spacers GS2 adjacent to each other (e.g., in the second direction D2). The second part PO2 may cover the first top surface TOP1 of the first gate spacer GS1. A width in the second direction D2 of the second part PO2 may increase along the third direction D3 towards the top surface of the second part PO2 (e.g., in a direction away from the substrate 100). A second width W2 may be a maximum width of the second part PO2. The second width W2 may be greater than the first width W1.

The third part PO3 may be disposed on the second part PO2. The third part PO3 may cover the second top surface TOP2 of the second gate spacer GS2. A third width W3 may be a maximum width in the second direction D2 of the third part PO3. The third width W3 may be greater than the second width W2. Each of the first, second, and third widths W1, W2, and W3 of the gate capping pattern GP may be greater than a width WID in the second direction D2 of the gate electrode GE.

The gate capping pattern GP according to an embodiment of the present inventive concept may be provided to completely cover the top surface of the gate spacer GS. When forming the active contact AC adjacent to the gate electrode GE, the gate capping pattern GP may effectively prevent an etching material from entering the gate electrode GE. Therefore, the active contact AC may be formed to be a self-aligned contact without process failure.

With reference to FIG. 6B, the following description will focus on an upper structure of the gate cutting pattern CT according to some embodiments of the present inventive concept. The gate spacer GS adjacent to the gate cutting pattern CT may have a structure substantially the same as the structure of the gate spacer GS adjacent to the gate electrode GE discussed above with reference to FIG. 6A.

The gate cutting pattern CT may include a first part PA1, a second part PA2, and a third part PA3. The first part PA1 may be interposed between a pair of first gate spacers GS1 adjacent to each other (e.g., in the second direction D2). For example, the first part PA1 may directly contact inner sidewalls of the first gate spacers GS1. The first part PA) may have a width in the second direction D2 that does not substantially change along the third direction D3. For example, the first part PA1 may have a fourth width W4 in the second direction D2.

The second part PA2 may be disposed on the first part PA1. The second part PA2 may be interposed between a pair of second gate spacers GS2 adjacent to each other (e.g., in the second direction D2). The second part PA2 may cover the first top surface TOP1 of the first gate spacer GS1 and an upper portion of the inner sidewalls of the first gate spacers GS1. A width in the second direction D2 of the second part PA2 may increase along the third direction D3 towards a top surface of the second part PA2 (e.g., in a direction away from the substrate 100). A fifth width W5 may be a maximum width in the second direction D2 of the second part PA2. The fifth width W5 may be greater than the fourth width W4.

The third part PA3 may be disposed on the second part PA2. The third part PA3 may cover the second top surface TOP2 of the second gate spacer GS2. A width in the second direction D2 of the third part PA3 may increase along the third direction D3 towards a top surface of the third part PA3 (e.g., in a vertical direction away from the substrate 100). A sixth width W6 may be a maximum width of the third part PA3 in the second direction D2. The sixth width W6 may be greater than the fifth width W5.

One of a pair of second gate spacers GS2 in FIG. 6B may have a first outer sidewall OSW1 covered with the first interlayer dielectric layer 110, and the other of a pair of second gate spacers GS2 in FIG. 6B may have a second outer sidewall OSW2 covered with the first interlayer dielectric layer 110. The sixth width W6 of the third part PA3 may be greater than a distance SPA (e.g., in the second direction D2) between the first outer sidewall OSW1 and the second outer sidewall OSW2. For example, the third part PA3 of the gate cutting pattern CT may have a structure in which a width of the third part PA3 increases along the third direction D3 on the gate spacer GS towards the top surface of the third part PA3 (e.g., in a direction away from the substrate 100).

Referring to FIGS. 6A and 6B, the gate cutting pattern CT may have a width greater than the width of the gate electrode GE. Each of the fourth, fifth, and sixth widths W4, W5, and W6 of the gate cutting pattern CT may be greater than the width WID in the second direction D2 of the gate electrode GE.

According to an embodiment of the present inventive concept, similar to the gate capping pattern GP discussed above in FIG. 6A, the gate cutting pattern CT may also be provided to completely cover the top surface of the gate spacer GS. In addition, the third part PA3 of the gate cutting pattern CT may have a structure that extends sufficiently to completely cover the gate spacer GS. Therefore, when forming the active contact AC adjacent to the gate cutting pattern CT, the gate cutting pattern CT may effectively prevent an etching material from entering the gate electrode GE adjacent to the gate cutting pattern CT. Therefore, the active contact AC may be formed to be a self-aligned contact without process failure.

In addition, according to an embodiment of the present inventive concept, the top surface TOP1 and TOP2 of the gate spacer GS may be lower than the top surface of the gate cutting pattern CT. Accordingly, when the gate electrode GE is formed as discussed below, a metallic material of the gate electrode GE may be prevented from being externally exposed along the gate spacer GS and being in direct contact with the active contact AC.

FIGS. 7, 9, 11, 13, 15, 17, and 19 illustrate plan views showing a method of fabricating a semiconductor device according to some embodiments of the present inventive concept. FIGS. 8A, 10A, 12A, 14A, 16A, 18A, and 20A illustrate cross-sectional views taken along line A-A' of FIGS. 7, 9, 11, 13, 15, 17, and 19, respectively. FIGS. 8B, 10B, 12B, 14B, 16B, 18B, and 20B illustrate cross-sectional views taken along line B-B' of FIGS. 7, 9, 11, 13, 15, 17, and 19, respectively. FIGS. 8C, 10C, 12C, 14C, 16C, 18C, and 20C illustrate cross-sectional views taken along line C-C' of FIGS. 7, 9, 11, 13, 15, 17, and 19, respectively. FIGS. 10D, 12D, 14D, 16D, 18D, and 20D illustrate cross-sectional views taken along line D-D' of FIGS. 9, 11, 13, 15, 17, and 19, respectively. FIGS. 12E, 14E, 16E, 18E, and 20E illustrate cross-sectional views taken along line E-E' of FIGS. 11, 13, 15, 17, and 19, respectively.

Referring to FIGS. 7 and 8A to 8C, a substrate 100 may be provided which includes a first PMOSFET region PR1, a second PMOSFET region PR2, a first NMOSFET region NR1, and a second NMOSFET region NR2. The first NMOSFET region NR1 and the first PMOSFET region PR1 may define a first single height cell SHC1, and the second NMOSFET region NR2 and the second PMOSFET region PR2 may define a second single height cell SHC2.

The substrate 100 may be patterned to form first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2.

A device isolation layer ST may be formed on the substrate 100. In an embodiment, the device isolation layer ST may include a dielectric material, such as a silicon oxide layer. The device isolation layer ST may be recessed until an upper portion of each of the first and second active patterns AP1 and AP2 is exposed. Therefore, the first and second active patterns AP1 and AP2 may have upper portions that vertically protrude upwardly from the device isolation layer ST.

Sacrificial patterns PP may be formed to run across the first and second active patterns AP1 and AP2. In an embodiment, each of the sacrificial patterns PP may be formed to have a linear or bar shape that extends longitudinally in a first direction D1.

For example, the formation of the sacrificial patterns PP may include forming a first sacrificial layer on an entire surface of the substrate 100, forming mask patterns MA on the first sacrificial layer, and performing a patterning process in which the mask patterns MA are used as an etching mask to pattern the first sacrificial layer. In an embodiment, the first sacrificial layer may include polysilicon.

According to some embodiments of the present inventive concept, the patterning process for forming the sacrificial patterns PP may include a lithography process that uses an extreme ultraviolet (EUV) radiation. In this description, the EUV may mean an ultraviolet ray having a wavelength in a range of about 4 nm to about 124 nm, in a range of about 4 nm to about 20 nm, or about 13.5 nm. The EUV may denote light whose energy is in the range of about 6.21 eV to about 124 eV, for example, about 90 eV to about 95 eV.

The lithography process using the EUV may include exposure and development processes in which the EUV is irradiated onto a photoresist layer. For example, the photoresist layer may be an organic photoresist that contains an organic polymer such as polyhydroxystyrene. The organic photoresist may further include a photosensitive compound that is sensitive to the EUV. The organic photoresist may additionally include a material having a relatively high EUV absorption coefficient, for example, an organometallic material, an iodine-containing material, or a fluorine-containing material. In another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, or a circular shape. However, embodiments of the present inventive concept are not limited thereto.

The photoresist patterns may be used as an etching mask to pattern one or more mask layers that are stacked thereunder, and thus the mask patterns MA may be formed as discussed above. The mask patterns MA may be used as an etching mask to pattern a target layer or the first sacrificial layer to form desired patterns or the sacrificial patterns PP on a wafer.

In a comparative embodiment, a multi-patterning technique (MPT) conventionally used includes the use of two or more photomasks to form fine-pitched patterns on a wafer. In contrast, when an EUV lithography process is performed according to some embodiments of the present inventive concept, only a single photomask may be used to form the fine-pitched sacrificial patterns PP.

For example, a value less than or equal to about 45 nm may be a minimum pitch between the sacrificial patterns PP formed by an EUV lithography process according to some embodiments of the present inventive concept. Hence, the EUV lithography process use to form the sacrificial patterns PP may be sufficient to form very fine patterns without implementing the multi-patterning technique.

According to some embodiments of the present inventive concept, the EUV lithography process may be used to perform not only the patterning process for forming the sacrificial patterns PP, but also the patterning process for forming the first and second active patterns AP1 and AP2 discussed above, and no limitation is imposed on the EUV lithography process.

A pair of gate spacers GS may be formed on opposite sidewalls of each of the sacrificial patterns PP. In an embodiment, the formation of the gate spacers GS may include conformally forming a gate spacer layer on the entire surface of the substrate 100 and anisotropically etching the gate spacer layer. In an embodiment, the gate spacer layer may include at least one compound selected from SiCN, SiCON, and SiN.

As discussed above with reference to FIG. 6A, in an embodiment, the gate spacer GS may have a multi-layered structure including a first gate spacer GS1 and a second gate spacer GS2. For example, in an embodiment, the first gate spacer GS1 may be formed of SiOCN or a low-k dielectric material. The second gate spacer GS2 may be formed of SiN having a relatively high etch resistance. The first gate spacer GS1 may be formed to be thicker than the second gate spacer GS2.

Referring to FIGS. 9 and 10A to 10D, first source/drain patterns SD1 may be formed on an upper portion of each of the first active patterns AP1. A pair of first source/drain patterns SD1 may be formed on opposite sides of each of the sacrificial patterns PP (e.g., in the second direction D2).

For example, in an embodiment, the mask patterns MA and the gate spacers GS may be used as an etching mask to etch the upper portion of the first active pattern AP1 to form first recesses. While the upper portion of the first active pattern AP1 is etched, the device isolation layer ST may be recessed between the first active patterns AP1 (see FIG. 10C).

In an embodiment, the first source/drain pattern SD1 may be formed by performing a selective epitaxial growth process in which an inner wall of the first recess of the first active pattern AP1 is used as a seed layer. The formation of the first source/drain patterns SD1 may define a first channel pattern CI between a pair of first source/drain patterns SD1. For example, the selective epitaxial growth process may include chemical vapor deposition (CVD) or molecular beam epitaxy (MBE). The first source/drain patterns SD1 may include a semiconductor element (e.g., SiGe) having a lattice constant that is greater than the lattice constant of a semiconductor element of the substrate 100. Each of the first source/drain patterns SD1 may be formed of a plurality of semiconductor layers.

For example, impurities may be in-situ implanted during the selective epitaxial growth process for forming the first source/drain patterns SD1. In another example, after the first source/drain patterns SD1 are formed, impurities may be implanted into the first source/drain patterns SD1. The first source/drain patterns SD1 may be doped to have a first conductivity type (e.g., a p-type).

The second source/drain patterns SD2 may be formed on an upper portion of the second active pattern AP2. A pair of second source/drain patterns SD2 may be formed on opposite sides of each of the sacrificial patterns PP (e.g., in the second direction D2).

For example, the mask patterns MA and the gate spacers GS may be used as an etching mask to etch the upper portion of the second active pattern AP2 to form second recesses. In an embodiment, the second source/drain pattern SD2 may be formed by performing a selective epitaxial growth process in which an inner wall of the second recess of the second active pattern AP2 is used as a seed layer. The formation of the second source/drain patterns SD2 may define a second channel pattern CH2 between a pair of the second source/ drain patterns SD2. For example, in an embodiment, the second source/drain patterns SD2 may include the same semiconductor element (e.g., Si) as that of the substrate 100. The second source/drain patterns SD2 may be doped to have a second conductivity type (e.g., an n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 11 and 12A to 12E, a first interlayer dielectric layer 110 may be formed to cover the first and second source/drain patterns SD1 and SD2, the mask patterns MA, and the gate spacers GS. For example, in an embodiment, the first interlayer dielectric layer 110 may include a silicon oxide layer.

The first interlayer dielectric layer 110 may be planarized until top surfaces of the sacrificial patterns PP are exposed. For example, an etch-back or chemical mechanical polishing (CMP) process may be used to planarize the first interlayer dielectric layer 110. The mask patterns MA may all be removed during the planarization process. As a result, the first interlayer dielectric layer 110 may have a top surface coplanar with the top surfaces of the sacrificial patterns PP and the gate spacers GS.

Referring to FIGS. 13 and 14A to 14E, upper portions of the gate spacers GS may be selectively etched to recess the gate spacers GS. Thus, the top surface of the gate spacer GS may become lower than the top surface of the first interlayer dielectric layer 110.

Referring back to FIG. 6A, the gate spacer GS may be recessed such that the first gate spacer GS1 may have a first top surface TOP1, and that the second gate spacer GS2 may have a second top surface TOP2. The second top surface TOP2 may be higher than the first top surface TOP1. In an embodiment, the second gate spacer GS2 may exhibit a higher etch resistance than the etch resistance of the first gate spacer GS1, and thus while the gate spacer GS is recessed, the second gate spacer GS2 may have an etch rate less than the etch rate of the first gate spacer GS1. Therefore, the second top surface TOP2 of the second gate spacer GS2 may be maintained higher than the first top surface TOP1 of the first gate spacer GS1.

Upper portions of the sacrificial patterns PP may be selectively etched such that the sacrificial patterns PP may be recessed. Thus, the top surface of the sacrificial pattern PP may become lower than the top surface of the gate spacer GS.

Subsequently, an upper sacrificial pattern UPP may be formed on the recessed gate spacer GS and the recessed sacrificial pattern PP. For example, in an embodiment, the formation of the upper sacrificial pattern UPP may include forming a second sacrificial layer on the entire surface of the substrate 100 and planarizing the second sacrificial layer until the top surface of the first interlayer dielectric layer 110 is exposed. In an embodiment, the second sacrificial layer may include polysilicon, or the same material as that of the sacrificial pattern PP. The upper sacrificial pattern UPP may cover the top surface of the gate spacer GS and the top surface of the sacrificial pattern PP.

Referring to FIGS. 15 and 16A to 16E, gate cutting patterns CT may be formed on a boundary, which is parallel to a second direction D2, of each of the first and second single height cells SHC and SHC2. For example, in an embodiment, a photolithography process may be used to form a mask layer including openings that defined locations where the gate cutting patterns CT are formed. An etching process may be used to selectively remove the upper sacrificial patterns UPP exposed to the openings and also to selectively remove the sacrificial patterns PP below the exposed upper sacrificial patterns UPP. A dielectric material may fill a region where the upper sacrificial pattern UPP and its underlying sacrificial pattern PP are removed, thereby forming the gate cutting pattern CT. The upper sacrificial patterns UPP covered with the mask layer may remain, and the sacrificial patterns PP below the remaining sacrificial patterns PP may also remain. Subsequently, the mask layer may be selectively removed.

In some embodiments of the present inventive concept, during the etching of the upper sacrificial pattern UPP and its underlying sacrificial pattern PP, a portion of the first interlayer dielectric layer 110 exposed to the opening may be removed. Therefore, an upper portion (e.g., the third part PA3 of FIG. 6B) of the gate cutting pattern CT may have a shape having a width in the second direction D2 that increases along a third direction D3.

Referring to FIGS. 17 and 18A to 18E, the remaining upper sacrificial patterns UPP and its underlying sacrificial patterns PP may be replaced with gate electrodes GE. For example, the exposed upper sacrificial pattern UPP and its underlying sacrificial pattern PP may be selectively removed. An empty space may be formed due to the removal of the exposed upper sacrificial pattern UPP and its underlying sacrificial pattern PP. A gate dielectric layer GI and a gate electrode GE may be formed in the empty space. In an embodiment, the gate electrode GE may include a first metal pattern and a second metal pattern on the first metal pattern. The first metal pattern may be formed of a work-function metal capable of controlling a threshold voltage of a transistor, and the second metal pattern may be formed of metal having a relatively low resistance.

A recessing may be performed on the gate dielectric layer G and the gate electrode GE that are formed in the empty space. The gate electrode GE may be recessed until its top surface becomes lower than the top surface of the gate spacer GS. A gate capping pattern GP may be formed on the recessed gate electrode GE. The gate capping pattern GP may be formed to cover the top surface of the gate electrode GE and the top surface of the gate spacer GS.

Referring to FIGS. 19 and 20A to 20C, a second interlayer dielectric layer 120 may be formed on the first interlayer dielectric layer 110. In an embodiment, the second interlayer dielectric layer 120 may include a silicon oxide layer. A pair of separation structures DB may be formed on opposite sides of the first single height cell SHC1 (e.g., in the second direction D2). The separation structures DB may be formed to overlap the gate electrodes GE formed on the opposite sides of the first single height cell SHC11. For example, in an embodiment, the formation of the separation structures DB may include forming a hole that penetrates the first and second interlayer dielectric layers 110 and 120 and extends into the first and second active patterns AP1 and AP2, and then filling the hole with a dielectric layer.

Active contacts AC may be formed to penetrate the second and first interlayer dielectric layers 120 and 110 and to have electrical connection with the first and second source/drain patterns SD1 and SD2. An upper portion of each active contact AC may be partially replaced with a dielectric material to form an upper dielectric pattern UIP. A gate contact GC may be formed to penetrate the second interlayer dielectric layer 120 and the gate capping pattern GP and to have electrical connection with the gate electrode GE.

A third interlayer dielectric layer 130 may be formed on the second interlayer dielectric layer 120. A first metal layer M1 may be formed in the third interlayer dielectric layer 130. In an embodiment, the formation of the first metal layer M1 may include forming a first power line M1_R1, a second power line M1_R2, a third power line M1_R3, and first wiring lines M1_I.

A fourth interlayer dielectric layer 140 may be formed on the first metal layer M1. A second metal layer M2 may be formed in the fourth interlayer dielectric layer 140. The formation of the second metal layer M2 may include forming second wiring lines M2_I. For example, the second wiring lines M2_I may be formed by a dual damascene process.

According to some embodiments of the present inventive concept, an EUV lithography process may be used to form the lines in the first metal layer M1 and/or the second metal layer M2. A detailed description of the EUV lithography process used in wiring processes, or back-end-of-line (BEOL) processes, may be substantially the same as that for forming the sacrificial patterns PP. For example, a distance less than or equal to about 45 nm may be a minimum pitch between the first wiring lines M1_I formed by the EUV lithography process.

Figure 21:
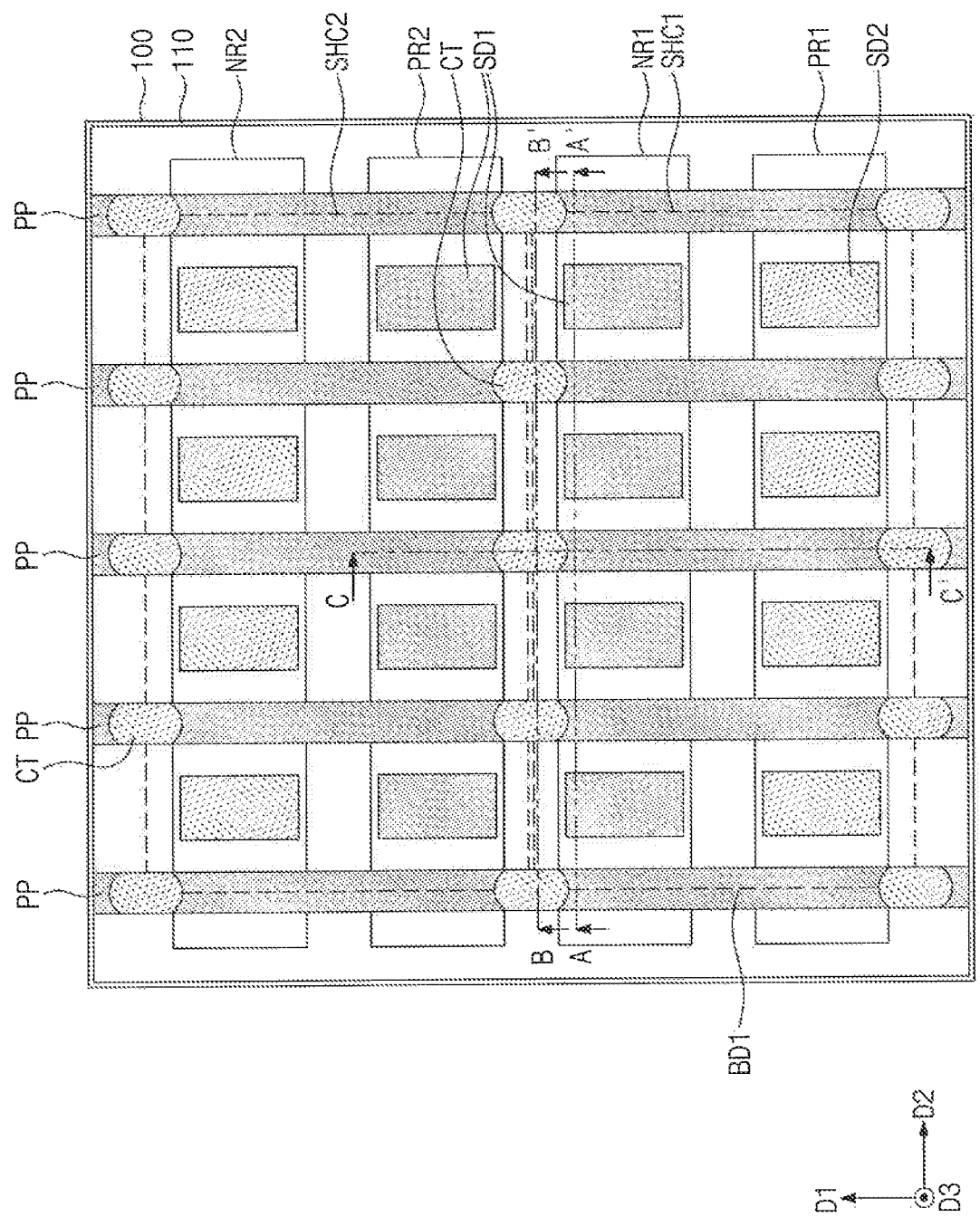
FIGS. 21, 23, and 25 illustrate plan views showing a method of fabricating a semiconductor device according to a comparative example.
Figure 22A:
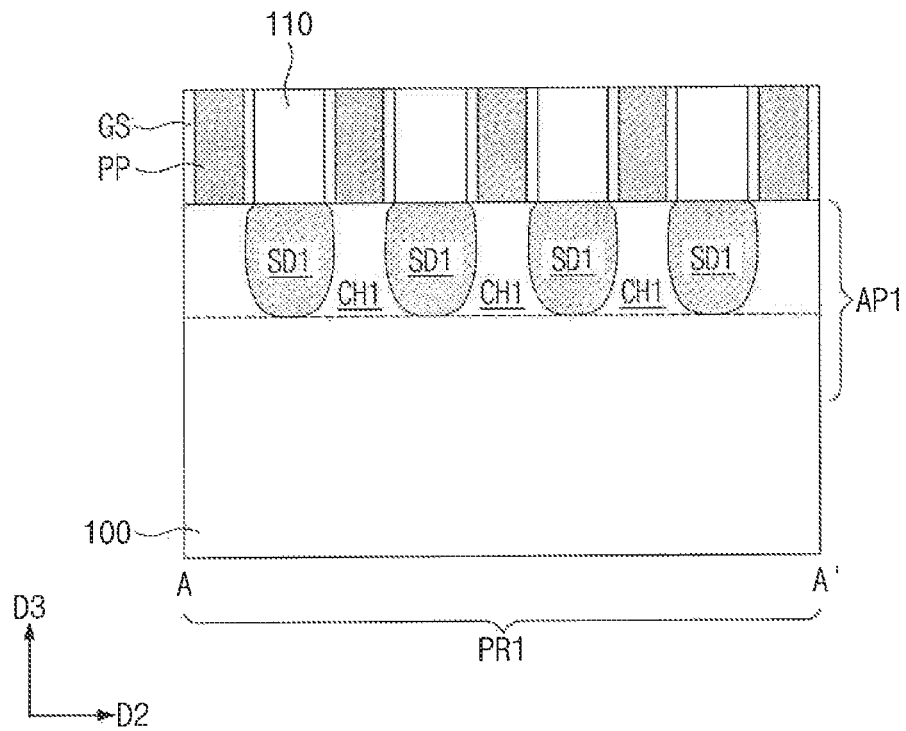
FIGS. 22A, 24A, and 26 illustrate cross-sectional views of a method of fabricating a semiconductor device taken along line A-A' of FIGS. 21, 23 and 25, respectively, according to a comparative example.
Figure 22B:
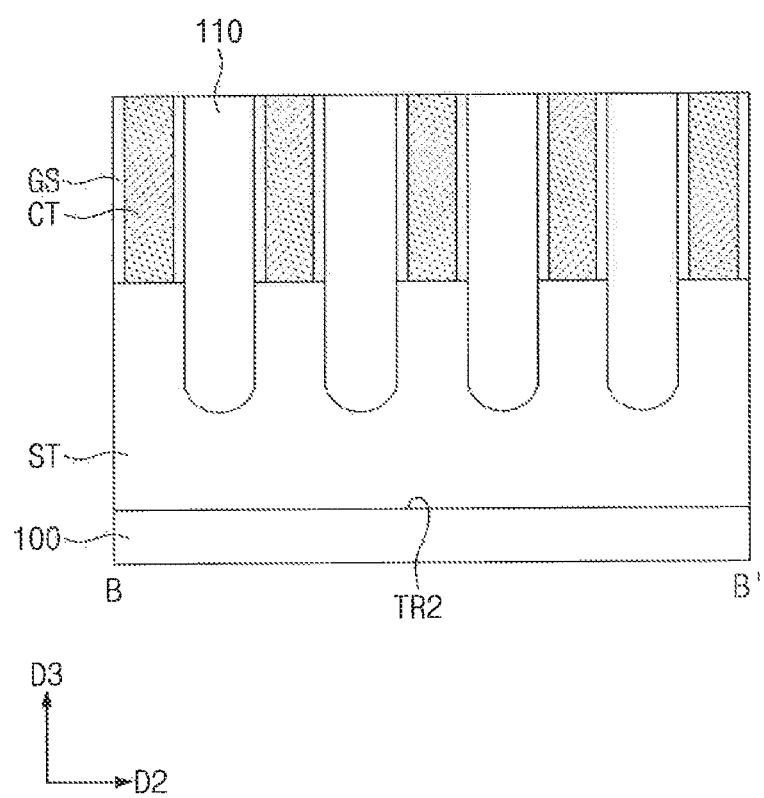
FIGS. 22B and 24B illustrate cross-sectional views of a method of fabricating a semiconductor device taken along line B-B' of FIGS. 21 and 23, respectively, according to a comparative example.
Figure 22C:
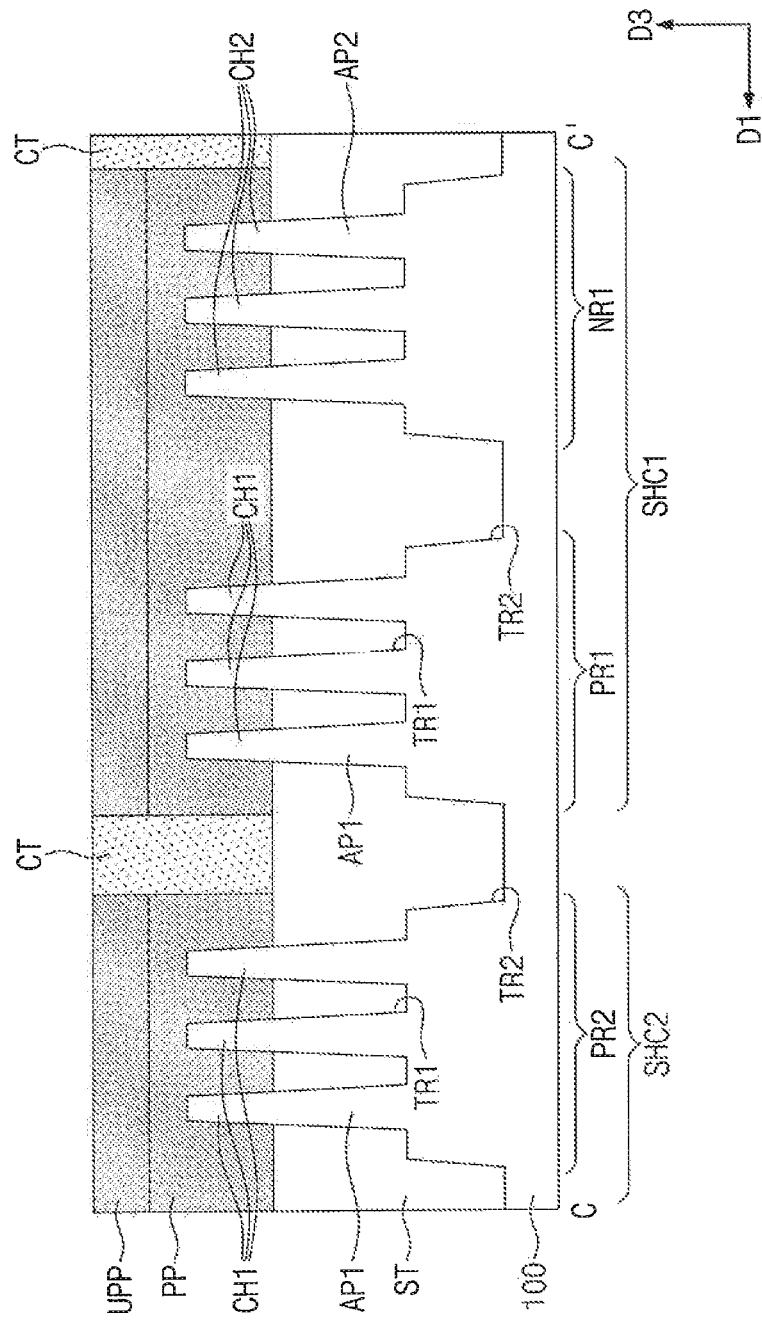
FIG. 22C illustrates a cross-sectional view of a method of fabricating a semiconductor device taken along line C-C' of FIG. 21 according to a comparative example.
Figure 23:
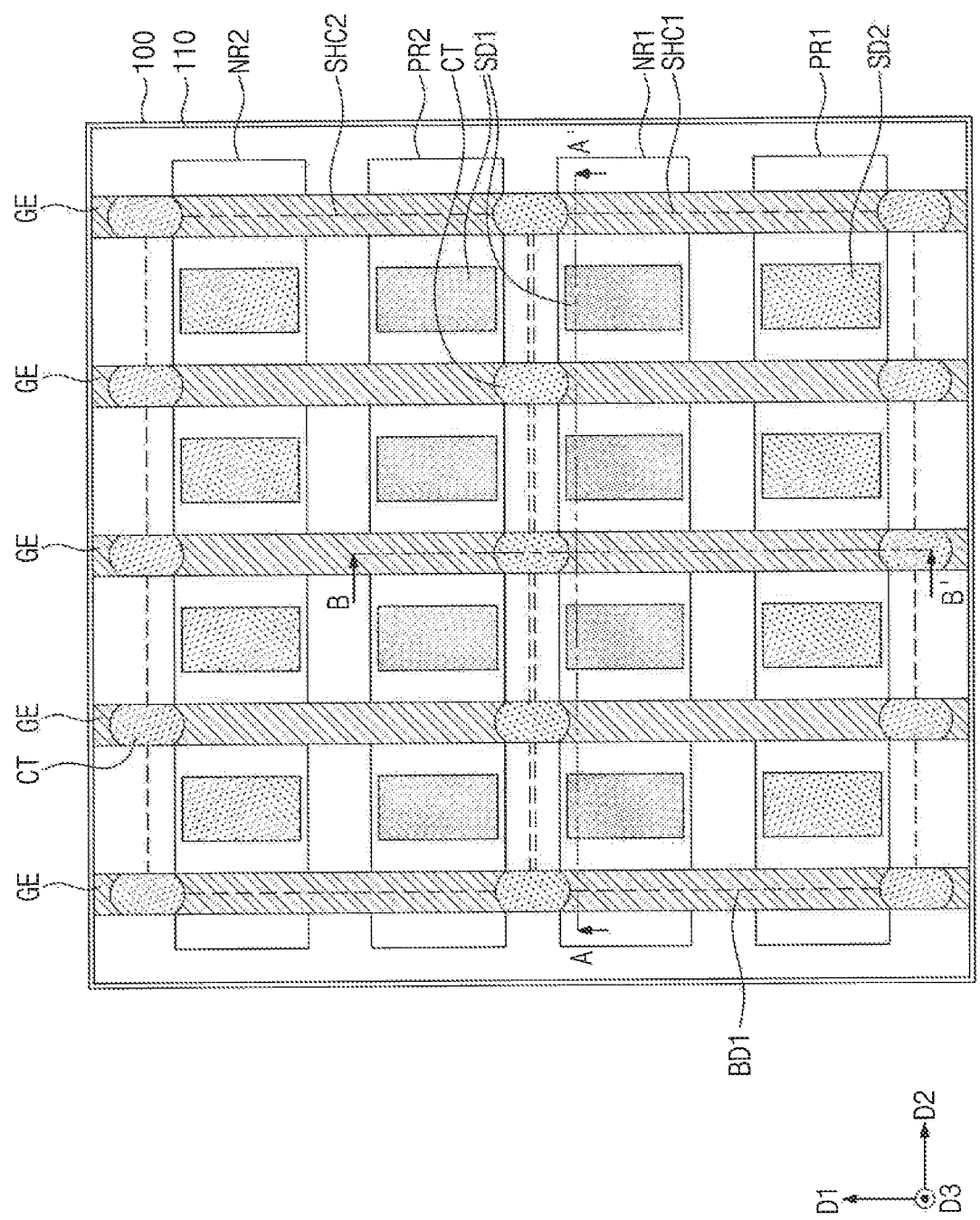
Figure 24A:
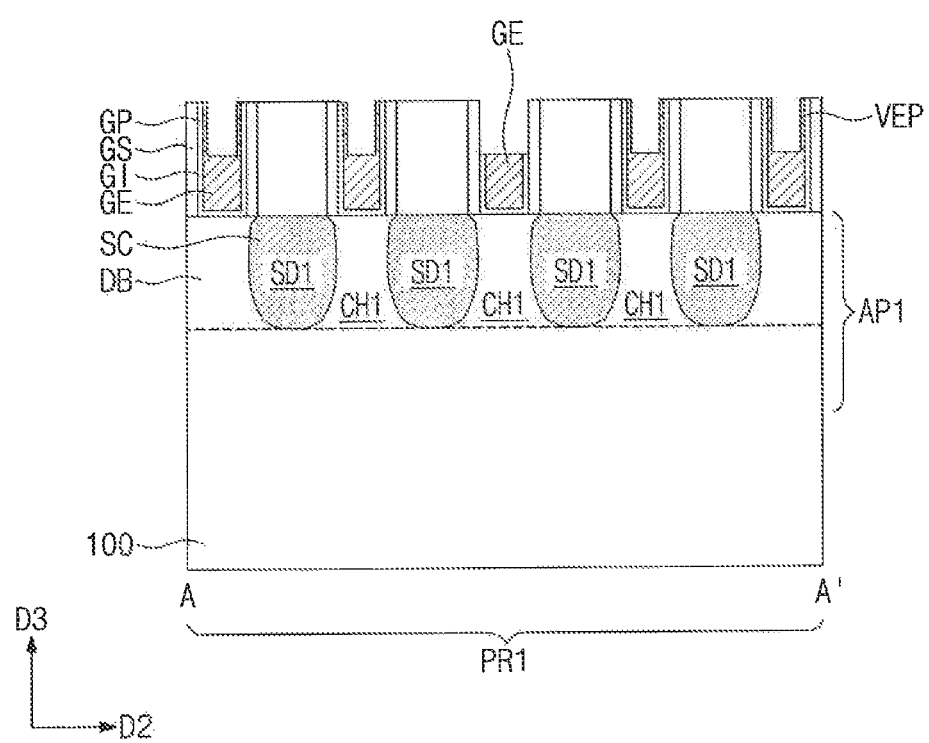
Figure 24B:
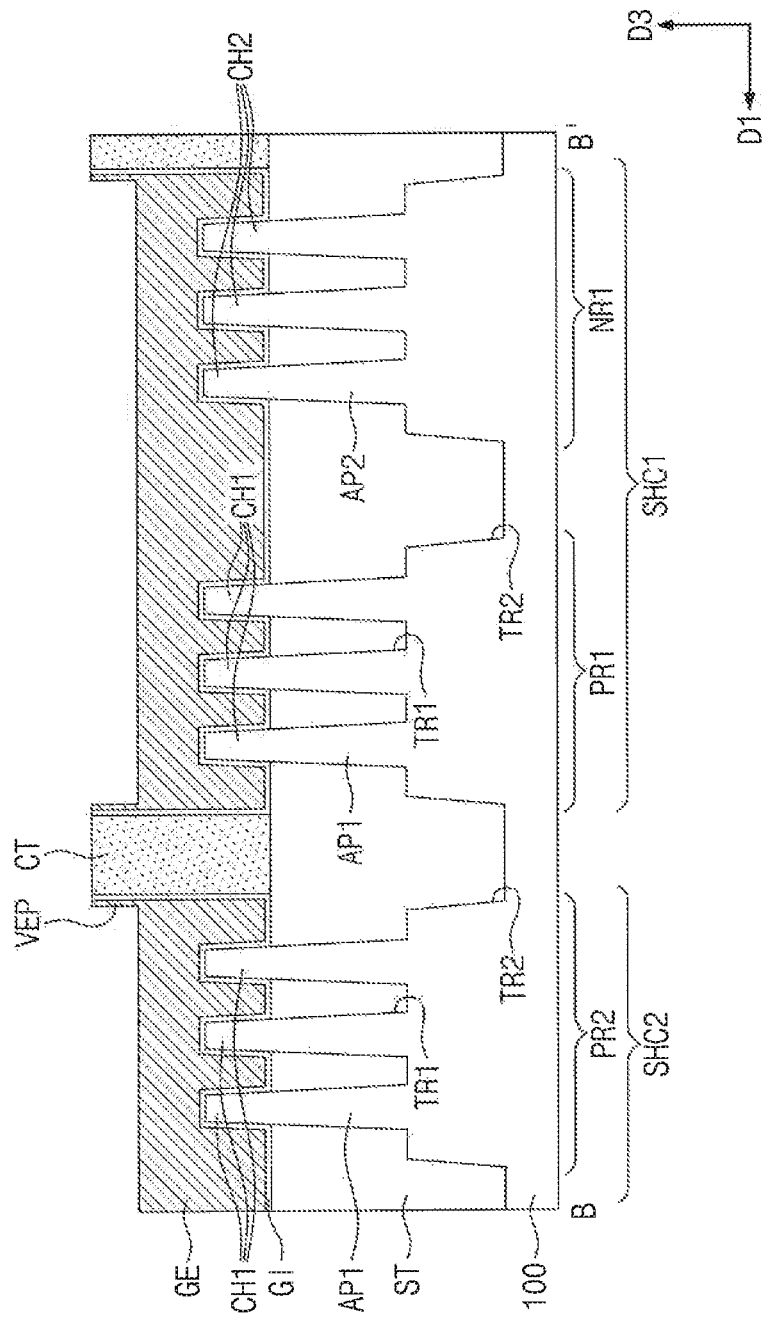
Figure 25:
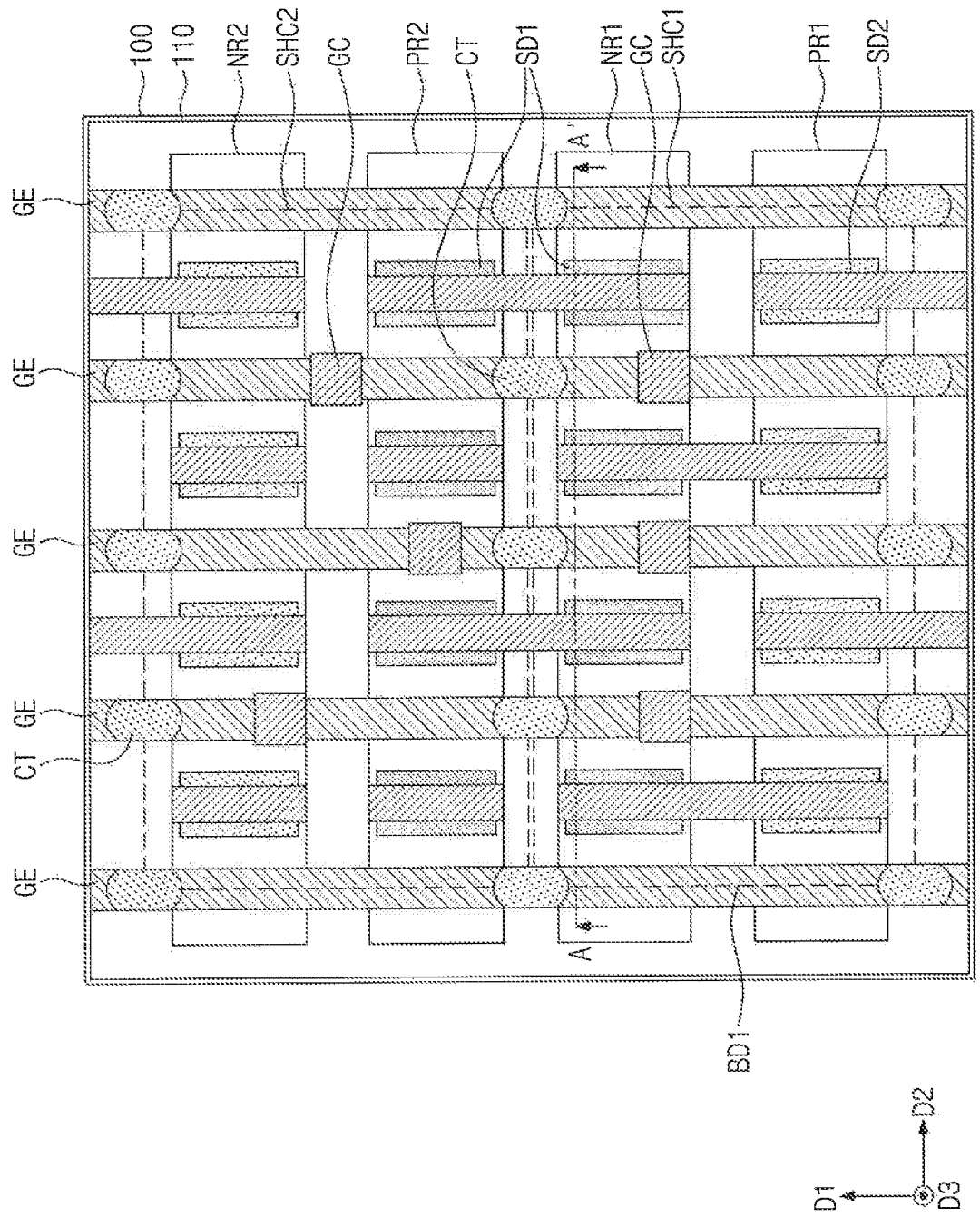
Figure 26:
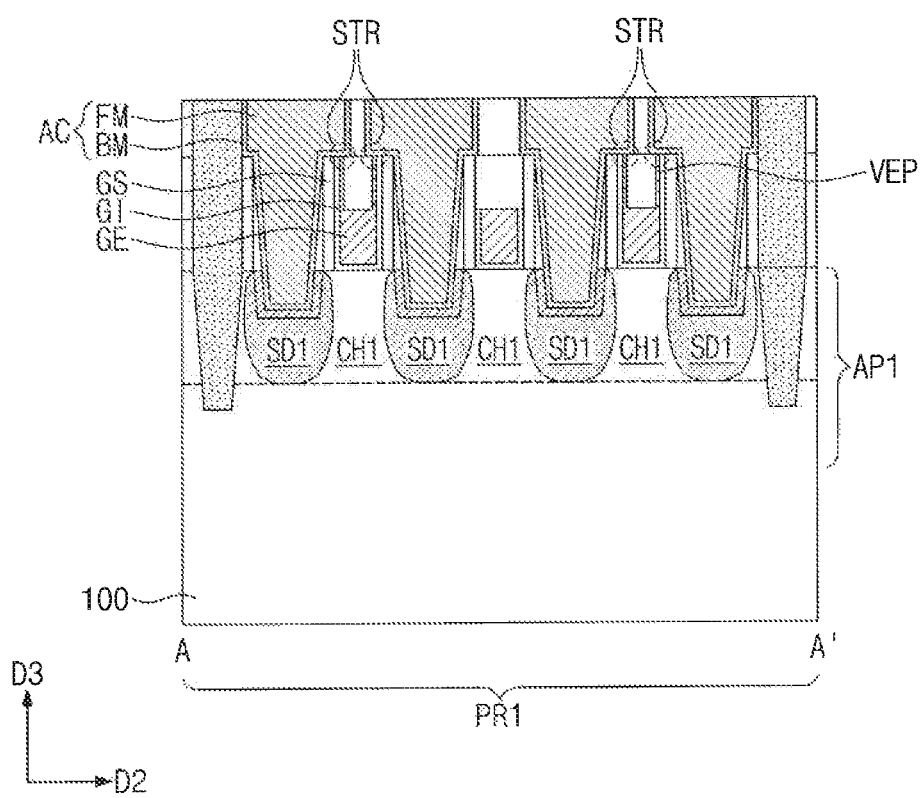
Figure 27A:
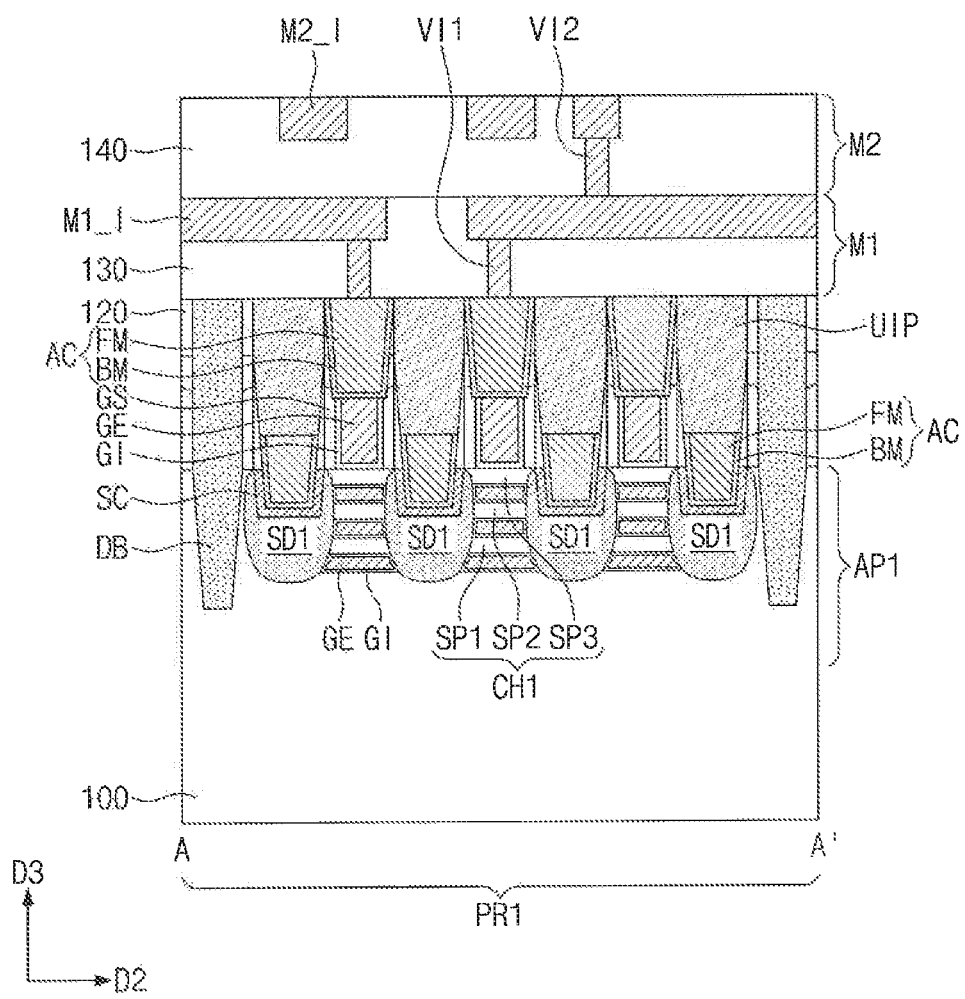
FIGS. 27A, 27B. 27C, 27D, and 27E illustrate cross-sectional views respectively taken along lines A-A', B-B', C-C', D-D', and E-E' of FIG. 4, showing a semiconductor device according to some embodiments of the present inventive concept.
Figure 27B:
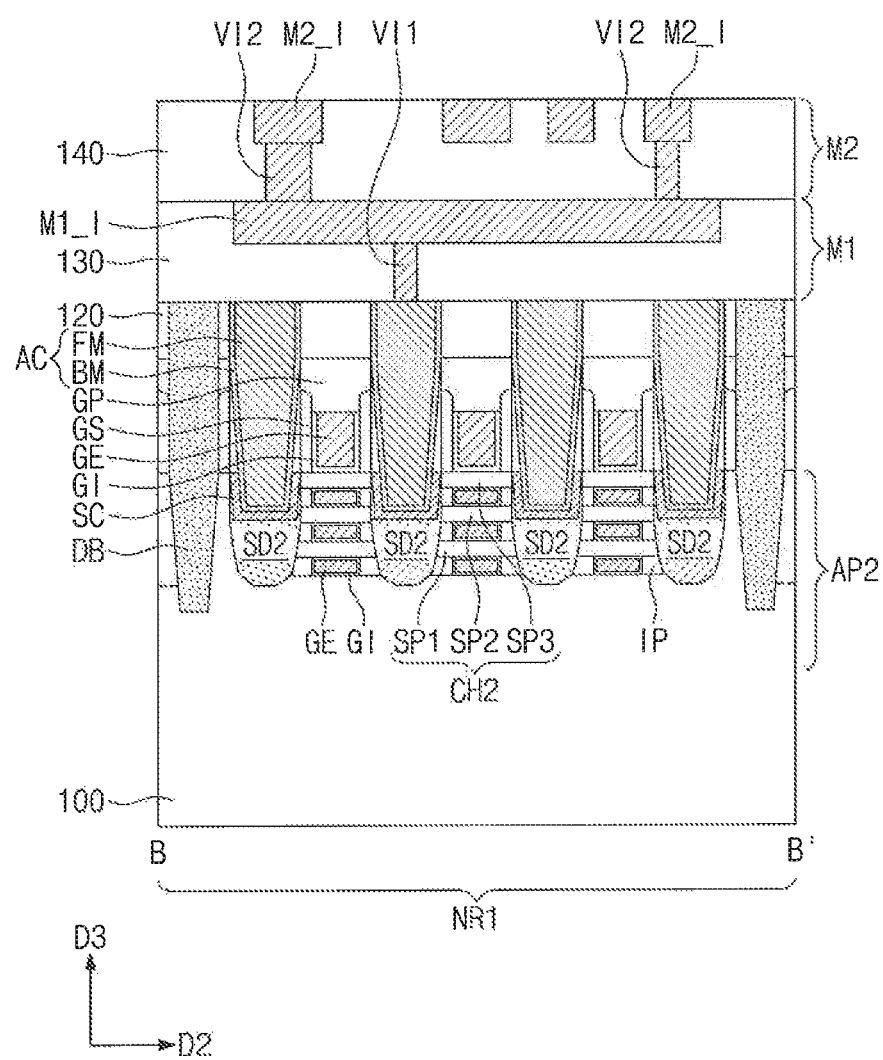
Figure 27C:
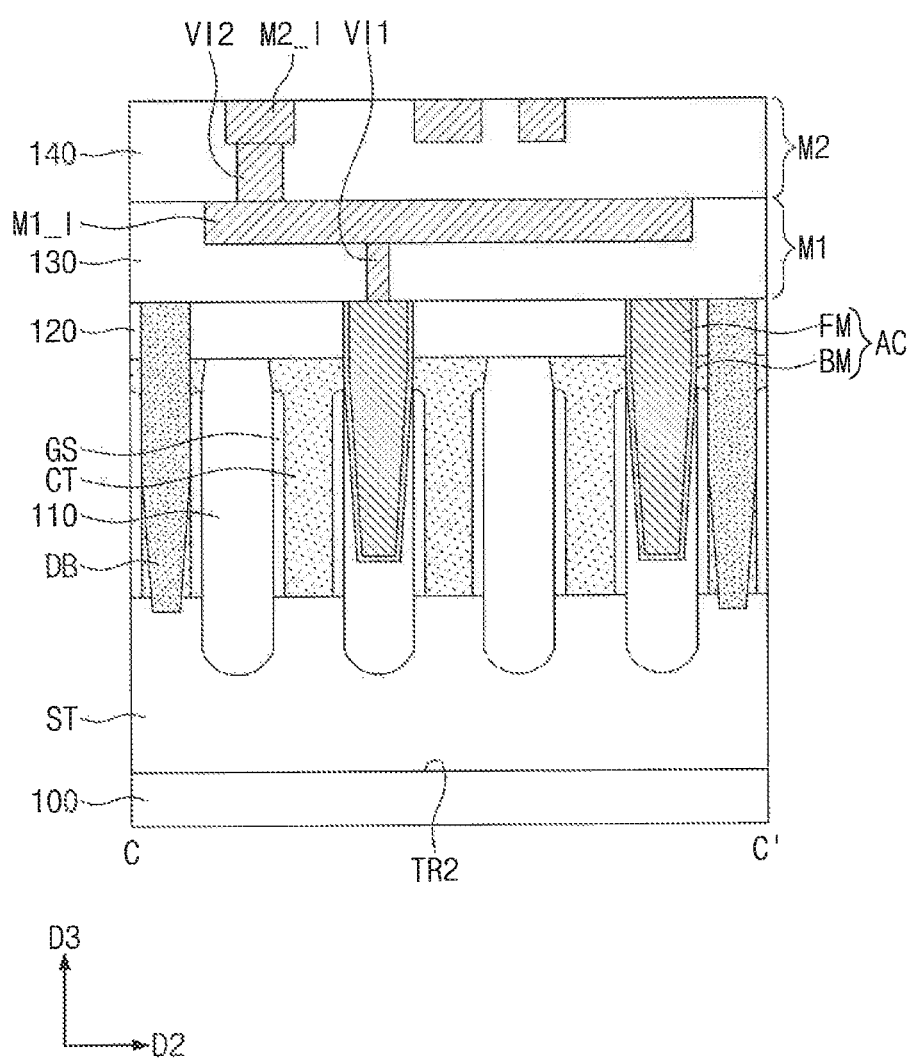
Figure 27D:
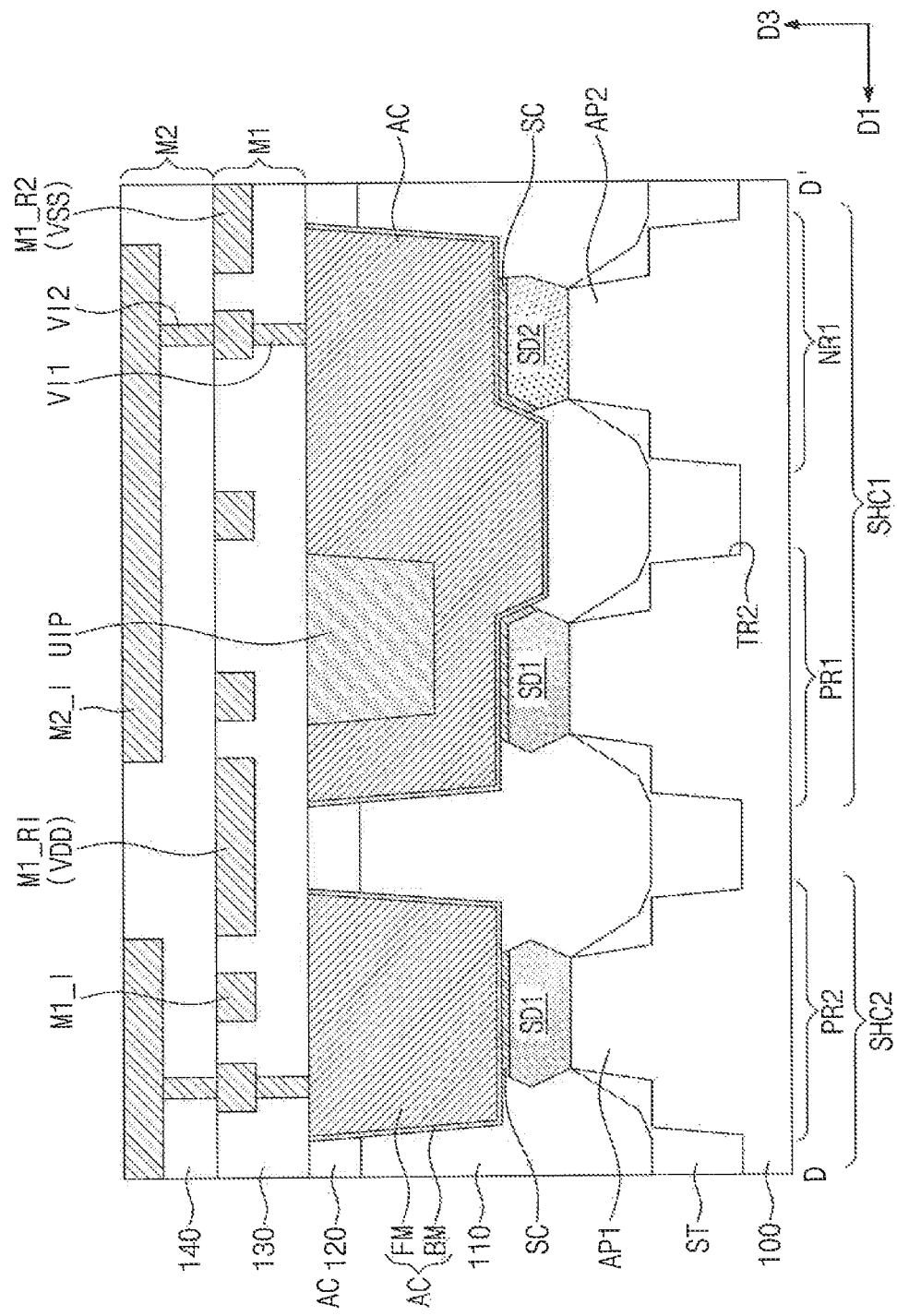
Figure 27E:
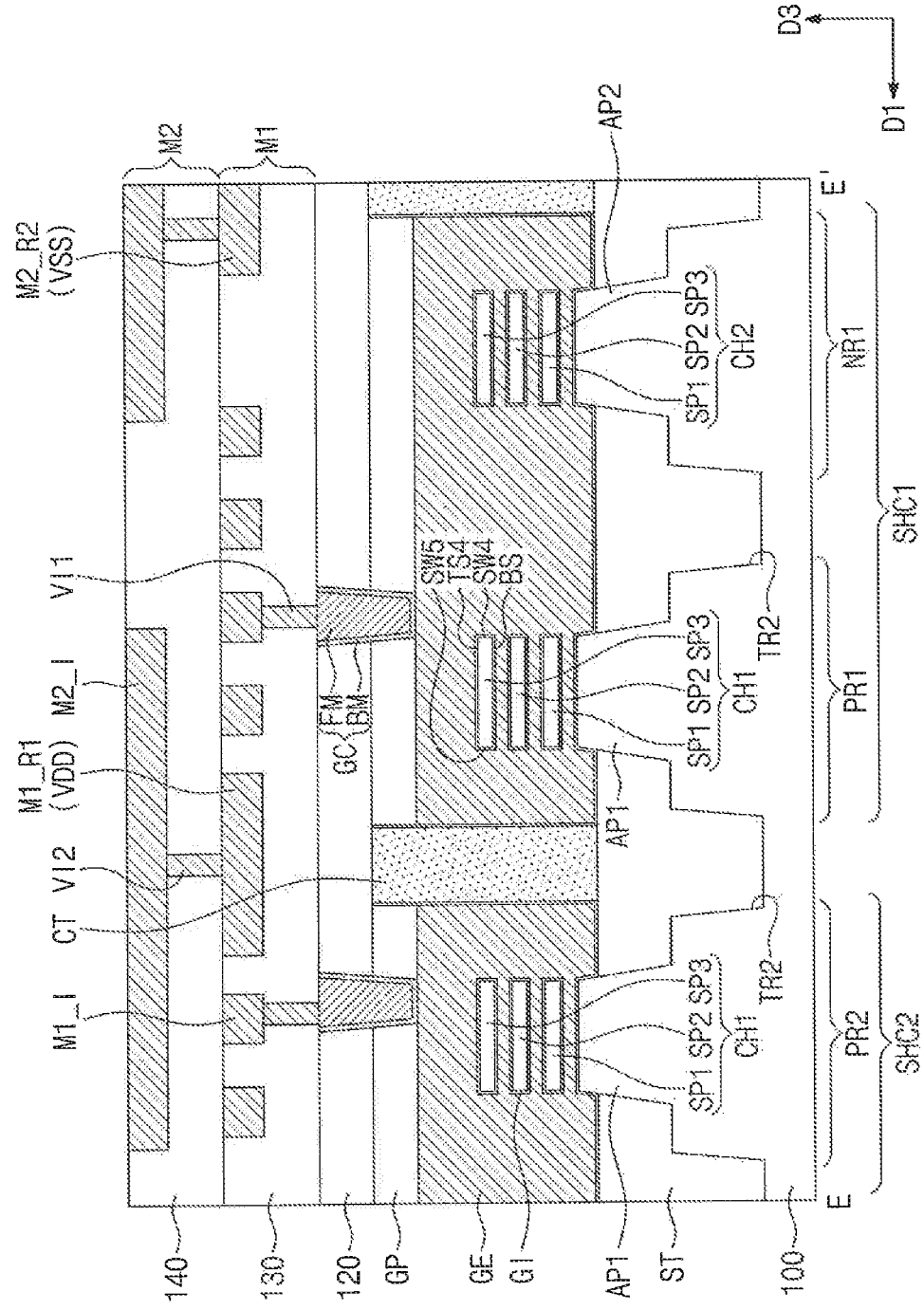

FIGS. 21, 23, and 25 illustrate plan views showing a method of fabricating a semiconductor device according to a comparative example. FIGS. 22A, 24A, and 26 illustrate cross-sectional views taken along line A-A' of FIGS. 21, 23 and 25, respectively. FIGS. 22B and 24B illustrate cross-sectional views taken along line B-B' of FIGS. 21 and 23, respectively. FIG. 22C illustrates a cross-sectional view taken along line C-C' of FIG. 21.

Referring to FIGS. 21 and 22A to 22C, gate cutting patterns CT may be formed on a resultant structure of FIGS. 11 and 12A to 12E. Differently from the aforementioned fabricating method according to some embodiments of the present inventive concept, the recess process of the gate spacers GS may be omitted in the comparative example. Therefore, the upper sacrificial pattern UPP may not be additionally formed, and only the sacrificial pattern PP may remain. The gate cutting pattern CT may have a top surface coplanar with the top surface of the gate spacer GS and that of the first interlayer dielectric layer 110.

Referring to FIGS. 23, 24A, and 24B, the sacrificial patterns PP may be replaced with gate electrodes GE. Afterwards, each of the gate electrodes GE may be recessed. The gate electrode GE formed in a space between the gate cutting pattern CT and the gate spacer GS may remain without being removed during the recess process. The remaining portion of the gate electrode GE may constitute a vertical extension VEP. For example, the gate electrode GE adjacent to the gate cutting pattern CT may include the vertical extension VEP that extends in the third direction D3 along the gate spacer GS.

Referring to FIGS. 25 and 26, the vertical extension VEP of the gate electrode GE may remain even after the formation of the gate capping pattern GP. The vertical extension VEP may be exposed between the gate capping pattern GP and the first interlayer dielectric layer 110.

Subsequently, active contacts AC may be formed. The active contact AC may be formed in a self-alignment manner, and thus an upper portion of the active contact AC may have a structure that extends to the vertical extension VEP. Accordingly, a short-circuit region STR may be formed where the active contact AC is in direct contact with the exposed vertical extension VEP of the gate electrode GE. The short-circuit region STR may be a short-circuit defect where the gate electrode GE is connected to the active contact AC, thereby decreasing the reliability of semiconductor device.

In contrast, according to the fabricating method discussed above, the gate spacer GS may be recessed in advance before the formation of the gate electrode GE. Therefore, the gate electrode GE may be prevented from having the vertical extension (see VEP of FIGS. 24A and 24B) that is formed to extend in the third direction D3 along the gate spacer GS. Therefore, according to an embodiment of the present inventive concept, it may be possible to prevent short-circuit defects between the gate electrode GE and the active contact AC and to provide a semiconductor device having increased reliability.

FIGS. 27A, 27B, 27C, 27D, and 27E illustrate cross-sectional views respectively taken along lines A-A', B-B', C-C', D-D', and E-E' of FIG. 4, showing a semiconductor device according to some embodiments of the present inventive concept. In the embodiment that follows, a detailed description of technical features repetitive to those discussed above with reference to FIGS. 4 and 5A to 5E will be omitted for convenience of explanation, and a difference from those discussed above with reference to FIGS. 4 and 5A to 5E will be discussed in detail.

Referring to FIGS. 4 and 27A to 27E, a substrate 100 may be provided which includes a first PMOSFET region PR1, a second PMOSFET region PR2, a first NMOSFET region NR1, and a second NMOSFET region NR2. A device isolation layer ST may be provided on the substrate 100. The device isolation layer ST may define a first active pattern AP1 and a second active pattern AP2 on an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The first active pattern AP1 may include a first channel pattern CH1 on the upper portion thereof. The second active pattern AP2 may include a second channel pattern CH2 on the upper portion thereof. Each of the first and second channel patterns CH1 and CH2 may include a plurality of semiconductor patterns, such as a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

In an embodiment, each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

The first active pattern AP1 may further include first source/drain patterns SD1. A pair of adjacent first source/drain patterns SD1 may have the stacked first, second, and third semiconductor patterns SP1, SP2, and SP3 of the first channel pattern CH1 disposed therebetween. The stacked first, second, and third semiconductor patterns SP1, SP2, and SP3 may connect the pair of adjacent first source/drain patterns SD1 to each other.

The second active pattern AP2 may further include second source/drain patterns SD2. A pair of adjacent second source/drain patterns SD2 may have the stacked first, second, and third semiconductor patterns SP1, SP2, and SP3 of the second channel pattern CH2 disposed therebetween. The stacked first, second, and third semiconductor patterns SP1, SP2, and SP3 may connect the pair of adjacent second source/drain patterns SD2 to each other.

Gate electrodes GE may be arranged to extend in a first direction D1, while extending across the first and second channel patterns CH1 and CH2. The gate electrode GE may vertically overlap the first and second channel patterns CH1 and CH2. A pair of gate spacers GS may be disposed on opposite sidewalls of the gate electrode GE (e.g., in the second direction D2). A gate capping pattern GP may be disposed on the gate electrode GE.

Referring back to FIG. 27E, the gate electrode GE may surround the first, second, and third semiconductor patterns SP1, SP2, and SP3 of each of the first and second channel patterns CH1 and CH2. A transistor according to some embodiments may be a three-dimensional field effect transistor (e.g., MBCFET or GAAFET) in which the gate electrode GE three-dimensionally surrounds the first and second channel patterns CH1 and CH2. For example, each of the first, second, and third semiconductor patterns SP1, SP2, and SP3 may have a fourth top surface TS4, a fourth sidewall SW4, a fifth sidewall SW5 opposite to the fourth sidewall SW4 (e.g., in the first direction D1), and a bottom surface BS. The fifth sidewall SW5 may be an outermost sidewall of a semiconductor pattern. The gate electrode GE may cover the fourth top surface TS4, the fourth sidewall SW4, the fifth sidewall SW5 and the bottom surface BS.

A gate dielectric layer GI may be disposed between the gate electrode GE and each of the first, second, and third semiconductor patterns SP1, SP2, and SP3. The gate dielectric layer GI may surround each of the first and second channel patterns CH1 and CH2.

On the first and second NMOSFET regions NR1 and NR2, an inner spacer IP may be interposed between the gate dielectric layer GI and the second source/drain pattern SD2 (e.g., in the second direction D2). The gate dielectric layer GI and the inner spacer IP may separate the gate electrode GE from the second source/drain pattern SD2. In contrast, the inner spacer IP may be omitted from the first and second PMOSFET regions PR1 and PR2.

A first interlayer dielectric layer 110 and a second interlayer dielectric layer 120 may be disposed on an entire surface of the substrate 100. Active contacts AC may be provided to penetrate the first and second interlayer dielectric layers 110 and 120 and to correspondingly have connection with the first and second source/drain patterns SD1 and SD2. Gate contacts GC may be provided to penetrate the second interlayer dielectric layer 120 and the gate capping pattern GP and to have connection with corresponding gate electrodes GE. A detailed description of the active contacts AC and the gate contacts GC may be substantially the same as that discussed above with reference to FIGS. 4 and 5A to 5E.

A third interlayer dielectric layer 130 may be disposed on the second interlayer dielectric layer 120. A fourth interlayer dielectric layer 140 may be disposed on the third interlayer dielectric layer 130. A first metal layer M1 may be disposed in the third interlayer dielectric layer 130. A second metal layer M2 may be disposed in the fourth interlayer dielectric layer 140. A detailed description of the first metal layer M1 and the second metal layer M2 may be substantially the same as that discussed above with reference to FIGS. 4 and 5A to 5E.

A semiconductor device according to an embodiment of the present inventive concept may have a structure in which a gate spacer is completely covered with an upper portion of a gate capping pattern and an upper portion of a gate cutting pattern. When an active contact is formed, the gate capping pattern and the gate cutting pattern may prevent an etching material from entering a gate electrode adjacent to the gate capping pattern and the gate cutting pattern. Therefore, the active contact may be formed as a self-aligned contact without process defects.

In a method of fabricating a semiconductor device according to an embodiment of the present inventive concept, a gate spacer may be recessed in advance before forming a gate cutting pattern and a gate electrode. Therefore, the gate electrode may be prevented from having a vertical extension that remains along the gate spacer. A short-circuit defect may be prevented between the gate electrode and the active contact, and thus the semiconductor device may have increased reliability.

Although some embodiments of the present inventive concept have been discussed with reference to accompanying figures, it will be understood that various changes in form and details may be made therein without departing from the spirit and scope of the present inventive concept. It therefore will be understood that the embodiments described above are just illustrative but not limitative in all aspects.

What is claimed is:

1. A semiconductor device, comprising:
   a substrate that includes a first active region and a second active region;
   a first active pattern on the first active region, the first active pattern including a pair of first source/drain patterns and a first channel pattern between the pair of first source/drain patterns;
   a second active pattern on the second active region, the second active pattern including a pair of second source/drain patterns and a second channel pattern between the pair of second source/drain patterns;
   a gate electrode including a first gate electrode on the first channel pattern and a second gate electrode on the second channel pattern;
   a gate cutting pattern between the first gate electrode and the second gate electrode, the gate cutting pattern separating the first and second gate electrodes from each other; and
   a pair of gate spacers on opposite sidewalls of the gate electrode,
   wherein the pair of gate spacers extends from opposite sidewalls of the first gate electrode along opposite sidewalls of the gate cutting pattern towards opposite sidewalls of the second gate electrode,
   wherein the gate cutting pattern includes:
      a first part between the pair of gate spacers;
      a second part on the first part; and
      a third part on the pair of gate spacers,
   wherein the second part lies between and connects the first part and the third part,
   wherein a maximum width of the second part is greater than a maximum width of the first part, and
   wherein a maximum width of the third part is greater than the maximum width of the second part.

2. The semiconductor device of claim 1, wherein each of the pair of gate spacers includes:
   a first gate spacer directly contacting the first part of the gate cutting pattern; and
   a second gate spacer spaced apart from the first part of the gate cutting pattern with the first gate spacer therebetween,
   wherein a top surface of the second gate spacer is higher than a top surface of the first gate spacer.

3. The semiconductor device of claim 2, wherein:
the second part of the gate cutting pattern covers the top surface of the first gate spacer; and
the third part of the gate cutting pattern covers the top surface of the second gate spacer.

4. The semiconductor device of claim 2, wherein:
the second gate spacer of one gate spacer of the pair of gate spacers includes a first outer sidewall;
the second gate spacer of the other gate spacer of the pair of gate spacers includes a second outer sidewall; and
the maximum width of the third part is greater than a distance between the first outer sidewall and the second outer sidewall.

5. The semiconductor device of claim 2, wherein the second part is between the second gate spacers of the pair of gate spacers.

6. The semiconductor device of claim 2, wherein a dielectric constant of the first gate spacer is less than a dielectric constant of the second gate spacer.

7. The semiconductor device of claim 2, wherein a thickness of the first gate spacer is greater than a thickness of the second gate spacer.

8. The semiconductor device of claim 1, further comprising:
an active contact electrically connected to at least one of the pairs of the first and second source/drain patterns;
a gate contact electrically connected to at least one of the first and second gate electrodes; and
a first metal layer on the active contact and the gate contact,
wherein the first metal layer includes a power line, and
wherein the gate cutting pattern vertically overlaps the power line.

9. The semiconductor device of claim 1, wherein a width of the third part of the gate cutting pattern gradually increases in a vertical direction away from the substrate.

10. The semiconductor device of claim 1, wherein:
the first active region is an active region of a first logic cell; and
the second active region is an active region of a second logic cell adjacent to the first logic cell.

11. A semiconductor device, comprising:
a substrate that includes a first logic cell and a second logic cell that is adjacent to the first logic cell in a first direction;
a first active pattern on the first logic cell, the first active pattern including a pair of first source/drain patterns and a first channel pattern between the pair of first source/drain patterns;
a second active pattern on the second logic cell, the second active pattern including a pair of second source/drain patterns and a second channel pattern between the pair of second source/drain patterns;
a first gate electrode on the first channel pattern;
a second gate electrode on the second channel pattern, the second gate electrode is aligned in the first direction with the first gate electrode;
a gate cutting pattern on a boundary between the first logic cell and the second logic cell, the gate cutting pattern is disposed between the first gate electrode and the second gate electrode; and
a pair of gate spacers that extends in the first direction, wherein the pair of gate spacers extends from opposite sidewalls of the first gate electrode along opposite sidewalls of the gate cutting pattern towards opposite sidewalls of the second gate electrode,
wherein each of the pair of gate spacers includes:
a first gate spacer adjacent to the first and second gate electrodes; and
a second gate spacer spaced apart from the first and second gate electrodes with the first gate spacer therebetween,
wherein a top surface of the second gate spacer is higher than a top surface of the first gate spacer, and
wherein the gate cutting pattern covers the top surface of the first gate spacer and the top surface of the second gate spacer.

12. The semiconductor device of claim 11, wherein the gate cutting pattern includes:
a first part between the first gate spacers of the pair of gate spacers;
a second part between the second gate spacers of the pair of gate spacers; and
a third part on the pair of gate spacers,
wherein the second part lies between and connects the first part and the third part,
wherein a maximum width of the second part is greater than a maximum width of the first part, and
wherein a maximum width of the third part is greater than the maximum width of the second part.

13. The semiconductor device of claim 12, wherein:
the second gate spacer of one gate spacer of the pair of gate spacers includes a first outer sidewall;
the second gate spacer of the other gate spacer of the pair of gate spacers includes a second outer sidewall; and
the maximum width of the third part is greater than a distance between the first outer sidewall and the second outer sidewall.

14. The semiconductor device of claim 11, wherein:
a dielectric constant of the first gate spacer is less than a dielectric constant of the second gate spacer; and
a thickness of the first gate spacer is greater than a thickness of the second gate spacer.

15. The semiconductor device of claim 11, wherein:
each of the first and second channel patterns includes a plurality of stacked semiconductor patterns, the stacked semiconductor patterns are vertically spaced apart from each other; and
the gate electrode is on a top surface, a bottom surface, and opposite sidewalls of each of the stacked semiconductor patterns.

16. A semiconductor device, comprising:
a substrate that includes a logic cell, the logic cell including a PMOSFET region and an NMOSFET region that are spaced apart from each other in a first direction, the logic cell having first, second, third, and fourth boundaries, wherein the first boundary and the second boundary are opposite to each other in a second direction that intersects the first direction, and wherein the third boundary and the fourth boundary are opposite to each other in the first direction;
a device isolation layer on the substrate, the device isolation layer defining a first active pattern on the PMOSFET region and a second active pattern on the NMOSFET region, wherein the first and second active patterns extend in the second direction, and wherein an upper portion of each of the first and second active patterns protrudes upwardly from the device isolation layer;
a gate electrode that extends in the first direction and extends across the first and second active patterns;
a first source/drain pattern and a second source/drain pattern on the upper portions of the first active pattern and the second active pattern, respectively, wherein each of the first and second source/drain patterns is adjacent to one side of the gate electrode;

a pair of gate spacers on opposite sidewalls of the gate electrode, wherein the pair of gate spacers extends in the first direction;

a gate capping pattern on a top surface of the gate electrode;

a separation structure on at least one of the first and second boundaries;

a gate cutting pattern on at least one of the third and fourth boundaries, wherein a lower portion of the gate cutting pattern is between the pair of gate spacers and is aligned in the first direction with the gate electrode;

an interlayer dielectric layer on the gate capping pattern and the gate cutting pattern;

an active contact that penetrates the interlayer dielectric layer and is electrically connected with at least one of the first and second source/drain patterns;

a gate contact that penetrates the interlayer dielectric layer and the gate capping pattern and is electrically connected with the gate electrode;

a first metal layer on the interlayer dielectric layer, wherein the first metal layer includes a power line that vertically overlaps the gate cutting pattern and a plurality of first wiring lines that correspondingly are electrically connected with the active contact and the gate contact; and a second metal layer on the first metal layer, wherein the second metal layer includes a plurality of second wiring lines electrically connected to the first metal layer, wherein the gate cutting pattern includes:
  a first part between the pair of gate spacers;
  a second part on the first part; and
  a third part on the pair of gate spacers, wherein the second part lies between and connects the first part and the third part, wherein a maximum width of the second part is greater than a maximum width of the first part, and wherein a maximum width of the third part is greater than the maximum width of the second part.

17. The semiconductor device of claim 16, wherein the gate capping pattern includes:

a fourth part between the pair of gate spacers;

a fifth part on the fourth part; and a sixth part on the pair of gate spacers, wherein the fifth part lies between and connects the fourth part and the sixth part, wherein a maximum width of the fifth part is greater than a maximum width of the fourth part, and wherein a maximum width of the sixth part is greater than the maximum width of the fifth part.

18. The semiconductor device of claim 16, wherein each of the pair of gate spacers includes:

a first gate spacer directly contacting the first part of the gate cutting pattern; and a second gate spacer spaced apart from the first part of the gate cutting pattern with the first gate spacer therebetween, wherein a top surface of the second gate spacer is higher than a top surface of the first gate spacer.

19. The semiconductor device of claim 18, wherein:

the second part of the gate cutting pattern covers the top surface of the first gate spacer; and the third part of the gate cutting pattern covers the top surface of the second gate spacer.

20. The semiconductor device of claim 16, wherein a width of the third part of the gate cutting pattern gradually increases in a vertical direction away from the substrate.

* * * * *